(12) United States Patent
Lee et al.

(10) Patent No.: US 10,396,098 B2
(45) Date of Patent: Aug. 27, 2019

(54) THIN FILM TRANSISTOR SUBSTRATE, AND DISPLAY PANEL AND DISPLAY DEVICE INCLUDING SAME

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); June O Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/069,130

(22) PCT Filed: Nov. 9, 2016

(86) PCT No.: PCT/KR2016/012879
§ 371 (c)(1),
(2) Date: Jul. 10, 2018

(87) PCT Pub. No.: WO2017/122918
PCT Pub. Date: Jul. 20, 2017

(65) Prior Publication Data
US 2019/0051672 A1    Feb. 14, 2019

(30) Foreign Application Priority Data

Jan. 11, 2016 (KR) .................. 10-2016-0003024

(51) Int. Cl.
*H01L 27/12* (2006.01)
*G02F 1/1335* (2006.01)
(Continued)

(52) U.S. Cl.
CPC ........ *H01L 27/1225* (2013.01); *G02F 1/1335* (2013.01); *G02F 1/1343* (2013.01);
(Continued)

(58) Field of Classification Search
CPC .......... H01L 27/1225; H01L 29/66462; H01L 29/205; H01L 27/1218; H01L 27/1266;
(Continued)

(56) References Cited

U.S. PATENT DOCUMENTS 6,429,467 B1 *  8/2002  Ando .................. H01L 29/7787
                                                        257/194
7,687,828 B2 *  3/2010  Matsuo ................ H01L 29/155
                                                        257/194
(Continued)

FOREIGN PATENT DOCUMENTS

KR   10-2014-0011791 A   1/2014
KR   10-2014-0021895 A   2/2014
(Continued)

OTHER PUBLICATIONS

International Search Report issued in PCT/KR2016/012879 (PCT/ISA/210), dated Feb. 28, 2017.

*Primary Examiner* — William Coleman
(74) *Attorney, Agent, or Firm* — Birch, Stewart, Kolasch & Birch, LLP

(57) ABSTRACT

A thin film transistor substrate according to an embodiment includes: a substrate; and a thin film transistor disposed on the substrate, wherein the thin film transistor includes a channel layer including a nitride-based semiconductor layer, a source electrode electrically connected to a first region of the channel layer, a drain electrode electrically connected to a second region of the channel layer, a gate electrode disposed on the channel layer, and a depletion forming layer disposed between the channel layer and the gate electrode.

20 Claims, 53 Drawing Sheets

(51) Int. Cl.
    *G02F 1/1343* (2006.01)
    *G02F 1/1368* (2006.01)
    *H01L 29/786* (2006.01)
    *G02F 1/1333* (2006.01)
    *G02F 1/1362* (2006.01)
    *H01L 29/20* (2006.01)
    *H01L 29/205* (2006.01)
    *H01L 29/66* (2006.01)
    *H01L 29/778* (2006.01)
    *H01L 27/32* (2006.01)

(52) U.S. Cl.
    CPC ........ *G02F 1/1368* (2013.01); *G02F 1/13338* (2013.01); *G02F 1/134363* (2013.01); *G02F 1/136209* (2013.01); *G02F 1/136227* (2013.01); *H01L 27/1218* (2013.01); *H01L 27/1266* (2013.01); *H01L 29/2003* (2013.01); *H01L 29/205* (2013.01); *H01L 29/66462* (2013.01); *H01L 29/7787* (2013.01); *H01L 29/786* (2013.01); *G02F 2001/13685* (2013.01); *G02F 2202/101* (2013.01); *G02F 2202/102* (2013.01); *H01L 27/3244* (2013.01)

(58) Field of Classification Search
    CPC ............... H01L 29/786; H01L 27/3244; G02F 1/13338; G02F 1/136227
    See application file for complete search history.

(56)     References Cited

U.S. PATENT DOCUMENTS

| | | | |
|---|---|---|---|
| 9,117,890 B2 * | 8/2015 | Kim | H01L 29/66462 |
| 9,130,028 B2 * | 9/2015 | Bunin | H01L 29/42316 |
| 9,917,156 B1 * | 3/2018 | Laboutin | H01L 21/02381 |
| 2011/0278634 A1 * | 11/2011 | Na | H01L 33/38 |
| | | | 257/99 |
| 2013/0168734 A1 * | 7/2013 | Miyoshi | H01L 29/7787 |
| | | | 257/190 |
| 2014/0021480 A1 | 1/2014 | Jeon | |
| 2014/0097470 A1 | 4/2014 | Kim et al. | |
| 2018/0090603 A1 * | 3/2018 | Yamada | H01L 29/7787 |
| 2018/0374876 A1 * | 12/2018 | Lee | G02F 1/1333 |

FOREIGN PATENT DOCUMENTS

| | | |
|---|---|---|
| KR | 10-2015-0065005 A | 6/2015 |
| KR | 10-2015-0101414 A | 9/2015 |

* cited by examiner (a)

(b)

(a)

(b)

(a)

(b)

(a)

(b)

(a)

(b)

(a)

(b)

(a)

(b)

(a)

(b)

(a)

(b)

(a)

(b)

THIN FILM TRANSISTOR SUBSTRATE, AND DISPLAY PANEL AND DISPLAY DEVICE INCLUDING SAME

CROSS REFERENCE TO RELATED APPLICATIONS

This application is the National Phase of PCT International Application No. PCT/KR2016/012879, filed on Nov. 9, 2016, which claims priority under 35 U.S.C. 119(a) to Patent Application No. 10-2016-0003024, filed in the Republic of Korea on Jan. 11, 2016, all of which are hereby expressly incorporated by reference into the present application.

TECHNICAL FIELD

The present invention relates to a thin film transistor substrate, and a display panel and a display device comprising the same.

BACKGROUND ART

According to development of the information society, demands for display devices for displaying images are increasing in various forms, and demand for high-resolution display devices is also increasing. As a way for realizing a high-resolution display device, the number of pixels per unit area is increased, but the numbers of gate wirings and data wirings are increased in order to supply a gate signal and a data signal in accordance with increased pixels. However, as the number of gate wirings increases, a time (Gate on Time) for which a gate signal may be provided to one pixel is shortened, so that development of a thin film transistor with a high carrier mobility is required.

In addition, as a way for smooth moving picture playback, a way for increasing a driving frequency has been studied, and even when the driving frequency is increased, a time (Gate on Time) for which a gate signal may be provided to one pixel is shortened, so that development of a thin film transistor with a high carrier mobility is required.

DISCLOSURE

Technical Problem

An embodiment provides a thin film transistor substrate capable of increasing mobility of a carrier and ensuring product reliability, and a display panel and a display device comprising the same.

Technical Solution

A thin film transistor substrate according to an embodiment comprises: a substrate; and a thin film transistor disposed on the substrate, the thin film transistor comprising a channel layer including a nitride-based semiconductor layer, a source electrode electrically connected to a first region of the channel layer, a drain electrode electrically connected to a second region of the channel layer, a gate electrode disposed on the channel layer, and a depletion forming layer disposed between the channel layer and the gate electrode.

A display panel according to an embodiment comprises: a thin film transistor substrate comprising a substrate; a thin film transistor disposed on the substrate, the thin film transistor comprising a channel layer including a nitride-based semiconductor layer, a source electrode electrically connected to a first region of the channel layer, a drain electrode electrically connected to a second region of the channel layer, a gate electrode disposed on the channel layer, and a depletion forming layer disposed between the channel layer and the gate electrode: a color filter substrate disposed on the thin film transistor substrate: and a liquid crystal layer provided between the thin film transistor substrate and the color filter substrate.

A display device according to an embodiment comprises: a display panel comprising a thin film transistor substrate and a color filter substrate disposed on the thin film transistor substrate, the thin film transistor substrate comprising a substrate; a thin film transistor disposed on the substrate, the thin film transistor comprising a channel layer including a nitride-based semiconductor layer, a source electrode electrically connected to a first region of the channel layer, a drain electrode electrically connected to a second region of the channel layer, a gate electrode disposed on the channel layer, and a depletion forming layer disposed between the channel layer and the gate electrode: and a light unit disposed under the display panel to supply light to the display panel.

A thin film transistor substrate according to an embodiment comprises: a substrate; and a thin film transistor disposed on the substrate, the thin film transistor comprising a channel layer including a nitride-based semiconductor layer, a source electrode electrically connected to a first region of the channel layer, a drain electrode electrically connected to a second region of the channel layer, a first gate electrode disposed on the channel layer, a depletion forming layer disposed between the channel layer and the first gate electrode, and a second gate electrode disposed under the channel layer.

A thin film transistor substrate according to an embodiment comprises: a substrate; and a thin film transistor disposed on the substrate, the thin film transistor comprising a channel layer including a nitride-based semiconductor layer and having a recessed region recessed in a downward direction on an upper surface thereof, a source electrode electrically connected to a first region of the upper surface of the channel layer, a drain electrode electrically connected to a second region of the upper surface of the channel layer, and a gate electrode disposed in the recessed region of the channel layer.

A thin film transistor substrate according to an embodiment comprises: a substrate; a switching thin film transistor disposed on the substrate, the switching thin film transistor comprising a first channel layer including a nitride-based semiconductor layer, a first source electrode electrically connected to a first region of the first channel layer, a first drain electrode electrically connected to a second region of the first channel layer, a first gate electrode disposed on the first channel layer, and a first depletion forming layer disposed between the first channel layer and the first gate electrode; and a driving thin film transistor disposed on the substrate, the driving thin film transistor comprising a second channel layer including a nitride-based semiconductor layer, a second source electrode electrically connected to a first region of the second channel layer, a second drain electrode electrically connected to a second region of the second channel layer, a second gate electrode disposed on the second channel layer, and a second depletion forming layer disposed between the second channel layer and the second gate electrode.

A thin film transistor substrate according to an embodiment comprises: a substrate; a switching thin film transistor disposed on the substrate, the switching thin film transistor comprising a first channel layer including a nitride-based semiconductor layer, a first source electrode electrically connected to a first region of the first channel layer, a first drain electrode electrically connected to a second region of the first channel layer, a first gate electrode disposed on the first channel layer, a first depletion forming layer disposed between the first channel layer and the first gate electrode, and a first double gate electrode disposed under the first channel layer; and a driving thin film transistor disposed on the substrate, the driving thin film transistor comprising a second channel layer including a nitride-based semiconductor layer, a second source electrode electrically connected to a first region of the second channel layer, a second drain electrode electrically connected to a second region of the second channel layer, a second gate electrode disposed on the second channel layer, a second depletion forming layer disposed between the second channel layer and the second gate electrode, and a second double gate electrode disposed under the second channel layer.

A thin film transistor substrate according to an embodiment comprises: a substrate; a switching thin film transistor disposed on the substrate, the switching thin film transistor comprising a first channel layer including a nitride-based semiconductor layer and having a first recessed region recessed in a downward direction on an upper surface thereof, a first source electrode electrically connected to a first region of the upper surface of the first channel layer, a first drain electrode electrically connected to a second region of the upper surface of the first channel layer, and a first gate electrode disposed in the first recessed region of the first channel layer; and a driving thin film transistor disposed on the substrate, the driving thin film transistor comprising a second channel layer including a nitride-based semiconductor layer and having a second recessed region recessed in a downward direction on an upper surface thereof, a second source electrode electrically connected to a first region of the upper surface of the second channel layer, a second drain electrode electrically connected to a second region of the upper surface of the second channel layer, and a second gate electrode disposed in the second recessed region of the second channel layer.

Advantageous Effects

A thin film transistor substrate according to an embodiment, and a display panel and a display device comprising the same, have an advantage of realizing a high resolution and reproducing a smooth moving picture by providing a high carrier mobility.

MODES OF THE INVENTION

In the description of an embodiment, when it is described that each layer (film), region, pattern, or structure is formed "above/on" or "below/under" a substrate, each layer (film), region, pad or pattern, the description comprises being formed both "directly" and "indirectly (by interposing another layer)" "above/on" or "below/under". Also, a standard of above/on or below/under of each layer will be described based on the drawings.

Hereinafter, a thin film transistor substrate, a display panel, a display device, and a method of manufacturing a thin film transistor substrate according to embodiments of the present invention will be described in detail with reference to the accompanying drawings.

Figure 1:
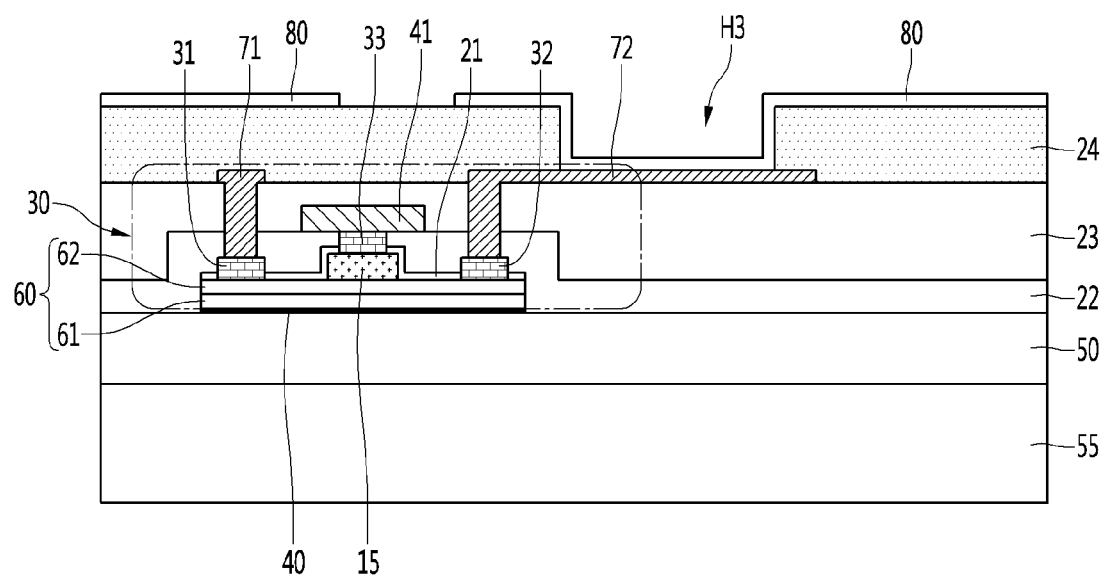
FIG. 1 is a view illustrating a thin film transistor substrate according to an embodiment of the present invention.

FIG. 1 is a view illustrating a thin film transistor substrate according to an embodiment of the present invention.

As shown in FIG. 1, the thin film transistor substrate according to an embodiment of the present invention may comprise a substrate 55, a thin film transistor 30 disposed on the substrate 55, and a pixel electrode 80 electrically connected to the thin film transistor 30.

The thin film transistor 30 according to an embodiment may comprise a depletion forming layer 15, a gate electrode 33, a channel layer 60, a source electrode 71, and a drain electrode 72. The source electrode 71 may be electrically connected to a first region of the channel layer 60. The source electrode 71 may be electrically connected to an upper surface of the channel layer 60. The drain electrode 72 may be electrically connected to a second region of the channel layer 60. The drain electrode 72 may be electrically connected to the upper surface of the channel layer 60. The gate electrode 33 may be disposed on the channel layer 60. The depletion forming layer 15 may be disposed on between the first region and the second region of the channel layer 60. The depletion forming layer 15 may be disposed between the channel layer 60 and the gate electrode 33.

The channel layer 60 may be provided with, for example, a Group III-V compound semiconductor. For example, the channel layer 60 may be provided with a semiconductor material having an empirical formula of $In_xAl_yGa_{1-x-y}N$ ($0 \geq x \geq 1$, $0 \geq y \geq 1$, $0 \geq x+y \geq 1$). The channel layer 60 may comprise a single layer or multiple layers selected from, for example, GaN, AlN, AlGaN, InGaN, InN, InAlGaN, AlInN, AlGaAs, GaP, GaAs, GaAsP, AlGaInP and so on.

The channel layer 60 may comprise a first nitride semiconductor layer 61 and a second nitride semiconductor layer 62. The first nitride semiconductor layer 61 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layer 62 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the channel layer 60 according to an embodiment, the first nitride semiconductor layer 61 may comprise a GaN semiconductor layer, and the second nitride semiconductor layer 62 may comprise an AlGaN semiconductor layer. The second nitride semiconductor layer 62 may be disposed between the first nitride semiconductor layer 61 and the depletion forming layer 15.

The depletion forming layer 15 may be provided with, for example, a Group III-V compound semiconductor. For example, the depletion forming layer 15 may be provided with a semiconductor material having an empirical formula of $In_xAl_yGa_{1-x-y}N$ ($0 \geq x \geq 1$, $0 \geq y \geq 1$, $0 \geq x+y \geq 1$). The depletion forming layer 15 may comprise a single layer or multiple layers selected from, for example, GaN, AlN, AlGaN, InGaN, InN, InAlGaN, AlInN, AlGaAs, GaP, GaAs, GaAsP, AlGaInP and so on. The depletion forming layer 15 may comprise a nitride semiconductor layer doped with a p-type dopant. For example, the depletion forming layer 15 may comprise a GaN semiconductor layer doped with a p-type dopant or an AlGaN semiconductor layer doped with a p-type dopant. The depletion forming layer 15 may comprise a single layer or multiple layers provided with, for example, a semiconductor material having an empirical formula of $p-Al_xGa_{1-x}N$ ($0 \geq x \geq 0.3$).

The depletion forming layer 15 may be provided in a thickness of 2 to 300 nm as an example. The depletion forming layer 15 may be provided in a thickness of at least 2 nm in order to provide a depletion region at two-dimensional electron gas (2 DEG) provided at the channel layer 60. In addition, the depletion forming layer 15 may be provided in a thickness of 30 nm or more in consideration of a thickness deviation according to a manufacturing process. In addition, the depletion forming layer 15 may be provided in a thickness of 200 nm or less in consideration of a thickness deviation according to a manufacturing process. The depletion forming layer 15 may be provided in a thickness of 50 to 100 nm as an example.

The depletion forming layer 15 may serve to form a depletion region at two-dimensional electron gas (2 DEG) provided at the channel layer 60. The energy bandgap of a portion of the second nitride semiconductor layer 62 positioned thereunder may be increased by the depletion forming layer 15. As a result, the depletion region of the 2 DEG may be provided at a portion of the channel layer 60 corresponding to the depletion forming layer 15. Therefore, a region corresponding to the position in which the depletion forming layer 15 is disposed in the 2 DEG provided at the channel layer 60 may be cut off. The region in which the 2 DEG is cut off at the channel layer 60 may be referred to as a cut-off region. For example, a cut-off region may be formed at the second nitride semiconductor layer 62. The thin film transistor 30 may have a normally-off characteristic due to such a cut-off region. When a voltage equal to or higher than a threshold voltage is applied to the gate electrode 33, the 2 DEG is generated at the cut-off region and the thin film transistor 30 is turned on. When a channel formed at a lower portion of the gate electrode 33 is turned on, a current may flow via the 2 DEG formed at the channel layer 60. Accordingly, the current flow from the first region to the second region of the channel layer 60 may be controlled according to a voltage applied to the gate electrode 33.

The substrate 55 may comprise a transparent substrate. The substrate 55 may be provided with a transparent substrate having a thickness of 0.1 mm to 3 mm as an example. In addition, the thickness of the substrate 55 may be changed according to application and size of an applied display device and may be selected within a thickness range of 0.4 to 1.1 mm. For example, the substrate 55 may be provided in a thickness of 0.6 to 0.8 mm. The substrate 55 may comprise at least one material selected from materials including silicon, glass, polyimide, and plastic. The substrate 55 may comprise a flexible substrate.

The substrate 55 is a substrate to be used in a transfer process which will be described later, and serves to support the thin film transistor 30. In addition, the thin film transistor substrate according to an embodiment may comprise a bonding layer 50 provided between the substrate 55 and the thin film transistor 30.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 μm as an example. A thickness of the bonding layer 50 may be different according to a type of a selected material and may be provided in a thickness of 1 to 3 μm. In addition, the bonding layer 50 may be provided in a thickness of 1.8 to 2.2 μm as an example.

The thin film transistor 30 according to an embodiment may comprise a source contact portion 31 disposed on the first region of the channel layer 60 and a drain contact portion 32 disposed on the second region of the channel layer 60. The source contact portion 31 may be disposed in contact with the first region of the channel layer 60. The drain contact portion 32 may be disposed in contact with the second region of the channel layer 60.

A thin film transistor 30 according to an embodiment may comprise a gate wiring 41 disposed on the gate electrode 33. The gate wiring 41 may be electrically connected to the gate electrode 33. A lower surface of the gate wiring 41 may be disposed in contact with an upper surface of the gate electrode 33.

The source electrode 71 may be electrically connected to the source contact portion 31. The source electrode 71 may be disposed in contact with an upper surface of the source contact portion 31. For example, the source electrode 71 may be electrically connected to a first region of the channel layer 60 via the source contact portion 31. The drain electrode 72 may be electrically connected to the drain contact portion 32. The drain electrode 72 may be disposed in contact with an upper surface of the drain contact portion 32. For example, the drain electrode 72 may be electrically connected to a second region of the channel layer 60 via the drain contact portion 32.

The source contact portion 31 and the drain contact portion 32 may be provided with a material in ohmic contact with the channel layer 60. The source contact portion 31 and the drain contact portion 32 may comprise a material in ohmic contact with the second nitride semiconductor layer 62. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be provided in a thickness of 0.1 to 1 μm as an example. The source contact portion 31 and the drain contact portion 32 do not need to serve to spread a current as a layer for contacting with the channel layer 60. Accordingly, the source contact portion 31 and the drain contact portion 32 may be provided in a thickness of 1 μm or less.

The gate electrode 33 may be provided with a material in ohmic contact with the depletion forming layer 15. For example, the gate electrode 33 may be provided with a metallic material in ohmic contact with a p-type nitride layer. The gate electrode 33 may comprise a single layer or multiple layers comprising at least one material selected from the group consisting of tungsten (W), tungsten silicon (WSi$_2$), titanium nitride (TiN), tantalum (Ta), tantalum nitride (TaN), palladium (Pd), nickel (Ni), and platinum (Pt). The gate electrode 33 may be provided in a thickness of 0.1 to 1 μm as an example. The gate electrode 33 does not need to serve to spread a current as a layer for contacting with the depletion forming layer 15. Accordingly, the gate electrode 33 may be provided in a thickness of 1 μm or less.

The gate wiring 41 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41 may be provided in a thickness of 0.1 to 3 μm as an example. The gate wiring 41 serves to sequentially apply a voltage to a plurality of transistors. Accordingly, the gate wiring 41 may be provided to be thicker than a thickness of the gate electrode 33.

The source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 μm as an example. The source electrode 71 serves to sequentially apply a voltage to the plurality of transistors. Accordingly, the source electrode 71 may be provided to be thicker than a thickness of the source contact portion 31. Also, the drain electrode 72 may be provided to be thicker than a thickness of the drain contact portion 32.

The thin film transistor substrate according to an embodiment may comprise a first passivation film 21 disposed on the channel layer 60. The first passivation film 21 may be disposed on the second nitride semiconductor layer 62. A lower surface of the first passivation film 21 may be disposed in contact with an upper surface of the second nitride semiconductor layer 62. The first passivation film 21 may be disposed on the depletion forming layer 15. The first passivation film 21 may be disposed at a side surface of the depletion forming layer 15. The first passivation film 21 may be disposed so as to surround the side surface of the depletion forming layer 15.

According to an embodiment, the source contact portion 31 may be disposed to pass through the first passivation film 21. The source contact portion 31 may be disposed to be surrounded by the first passivation film 21. The source contact portion 31 may be disposed to pass through the first passivation film 21 and provided in contact with the first region of the channel layer 60. The drain contact portion 32 may be disposed to pass through the first passivation film 21. The drain contact portion 32 may be disposed to be surrounded by the first passivation film 21. The drain contact portion 32 may be disposed to pass through the first passivation film 21 and provided in contact with the second region of the channel layer 60.

The first passivation film 21 may be provided with an insulating material. The first passivation film 21 may comprise a single layer or multiple layers comprising at least one of a silicon-based oxide, a silicon-based nitride, a metal oxide comprising $Al_2O_3$, and an organic insulating material as an example.

According to an embodiment, a second passivation film 22 may be disposed on the substrate 55 and the first passivation film 21. The gate electrode 33 may be disposed to pass through at least one of the first passivation film 21 and the second passivation film 22. For example, the gate electrode 33 may be disposed to pass through the first passivation film 21 and the second passivation film 22. The gate electrode 33 may pass through at least one of the first passivation film 21 and the second passivation film 22 and be disposed in contact with the depletion forming layer 15. For example, the gate electrode 33 may pass through the first passivation film 21 and the second passivation film 22 and be disposed in contact with the depletion forming layer 15. The gate wiring 41 may be disposed on the second passivation film 22 and be electrically connected to the gate electrode 33. The second passivation film 22 may be provided with an insulating material. The second passivation film 22 may comprise a single layer or multiple layers including at least one material of a silicon-based oxide, a silicon-based nitride, a metal oxide including $Al_2O_3$, and an organic insulating material as an example.

According to an embodiment, a third passivation film 23 may be disposed on the second passivation film 22. The third passivation film 23 may be disposed on the second passivation film 22 and the gate wiring 41. The gate wiring 41 may be disposed in contact with the gate electrode 33 thereon and provided to be surrounded by the third passivation film 23.

The source electrode 71 may pass through the second passivation film 22 and the third passivation film 23 and be electrically connected to the source contact portion 31. The source electrode 71 may comprise a first region disposed on the third passivation film 23. The source electrode 71 may comprise a second region passing through the third passivation film 23 and the second passivation film 22. The drain electrode 72 may pass through the second passivation film 22 and the third passivation film 23 and be electrically connected to the drain contact portion 32. The drain electrode 72 may comprise a first region disposed on the third passivation film 23. The drain electrode 72 may comprise a second region passing through the third passivation film 23 and the second passivation film 22.

The third passivation film 23 may comprise an insulating material. The third passivation film 23 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a fourth passivation film 24 disposed on the third passivation film 23. The fourth passivation film 24 may be disposed on the source electrode 71 and the drain electrode 72. The fourth passivation film 24 may comprise a contact hole H3 provided on the drain electrode 72.

The fourth passivation film 24 may comprise a single layer or multiple layers comprising at least one material of a silicon-based oxide, a silicon-based nitride, a metal oxide comprising $Al_2O_3$, and an organic insulating material as an example.

According to an embodiment, the pixel electrode 80 may be disposed on the fourth passivation film 24. The pixel electrode 80 may be electrically connected to the drain electrode 72 via the contact hole H3 provided in the fourth passivation film 24. A lower surface of the pixel electrode 80 may be disposed in contact with an upper surface of the drain electrode 72.

The pixel electrode 80 may be provided with a transparent conductive material. The pixel electrode 80 may be provided with, for example, a transparent conductive oxide film. The pixel electrode 80 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The thin film transistor substrate according to an embodiment may comprise a black matrix 40 between the substrate 55 and the channel layer 60. A width of the channel layer 60 may be provided to be equal to a width of the black matrix 40. The black matrix 40 may be provided in a single layer or multiple layers including at least one material selected from among a Si-based material, a Ga-based material, an Al-based material, and an organic material. The black matrix 40 may block light incident on the thin film transistor 30. Accordingly, it is possible to prevent the thin film transistor 30 from deteriorating due to a photo current or the like.

According to an embodiment, the bonding layer 50 may be disposed between the substrate 55 and the channel layer 60. The bonding layer 50 may be disposed between the substrate 55 and the black matrix 40. For example, the bonding layer 50 may be disposed on an entire region of the substrate 55. The bonding layer 50 may be disposed in contact with the second passivation film 22. An upper surface of the bonding layer 50 and a lower surface of the second passivation film 22 may be disposed in contact with each other. For example, in a region where the black matrix 40 is not provided, the upper surface of the bonding layer 50 and the lower surface of the second passivation film 22 may be disposed in direct contact with each other.

Hereinafter, an example of a manufacturing process of a thin film transistor substrate according to an embodiment of the present invention will be described with reference to FIGS. 2 to 14. In FIGS. 2 to 13, (a) of each drawing is a plan view and (b) of that is a cross-sectional view taken along line A-A of a plan view.

Figure 2:
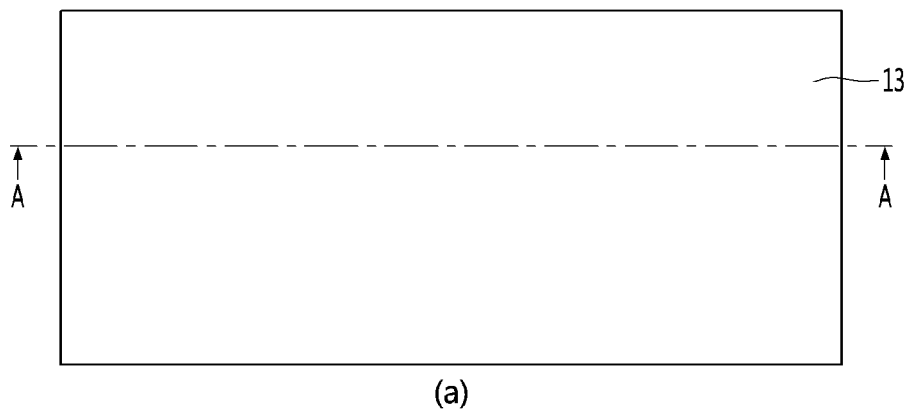
FIGS. 2 to 14 are views illustrating an example of a manufacturing process of the thin film transistor substrate shown in FIG. 1 according to an embodiment of the present invention.
Figure 2:
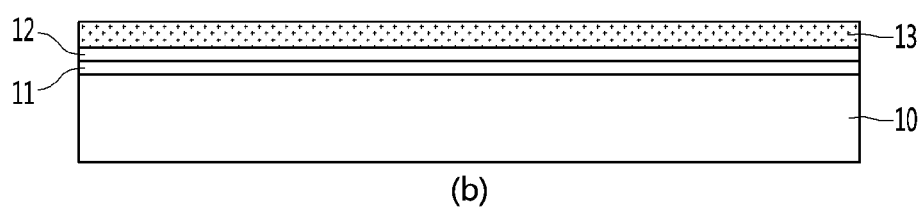

First, as shown in FIG. 2, a first layer 11, a second layer 12, and a third layer 13 may be sequentially grown on a growth substrate 10.

The growth substrate 10 may be a substrate on which the first layer 11, the second layer 12, and the third layer 13 may be grown. The growth substrate 10 may comprise at least one of sapphire, SiC, GaAs, GaN, ZnO, Si, GaP, InP and Ge as an example. A buffer layer may be further formed between the growth substrate 10 and the first layer 11.

The first layer 11, the second layer 12, and the third layer 13 may be provided with, for example, a Group III-V compound semiconductor. For example, the first layer 11, the second layer 12, and the third layer 13 may be provided with a semiconductor material having an empirical formula of $In_xAl_yGa_{1-x-y}N$ ($0 \geq x \geq 1$, $0 \geq y \geq 1$, $0 \geq x+y \geq 1$). The first layer 11, the second layer 12, and the third layer 13 may comprise a single layer or multiple layers selected from, for example, GaN, AlN, AlGaN, InGaN, InN, InAlGaN, AlInN, AlGaAs, GaP, GaAs, GaAsP, AlGaInP and so on.

According to an embodiment, for example, the first layer 11 may be formed of a GaN semiconductor layer, and the second layer 12 may be formed of an AlGaN semiconductor layer. The third layer 13 may comprise a nitride semiconductor layer doped with a p-type dopant. For example, the third layer 13 may comprise a GaN semiconductor layer doped with a p-type dopant or an AlGaN semiconductor layer doped with a p-type dopant. The third layer 13 may comprise a single layer or multiple layers provided with, for example, a semiconductor material having an empirical formula of $p-Al_xGa_{1-x}N$ ($0 \geq x \geq 0.3$).

Figure 3:
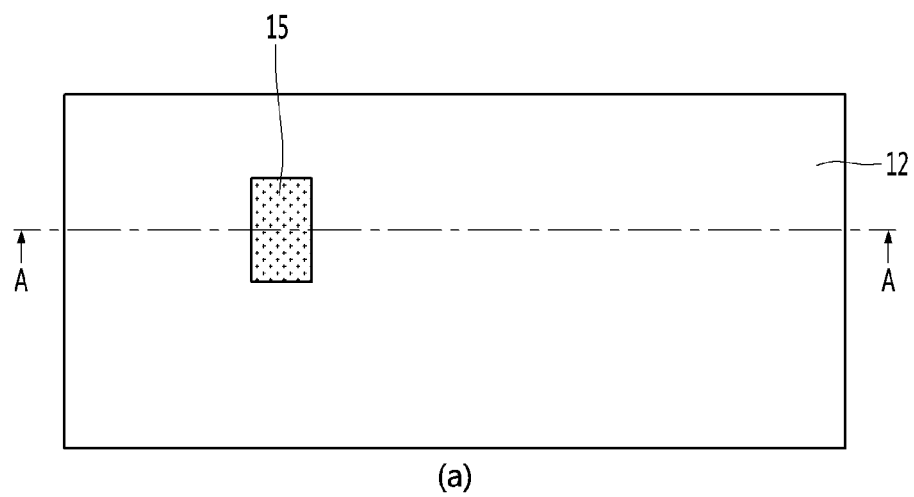
Figure 3:
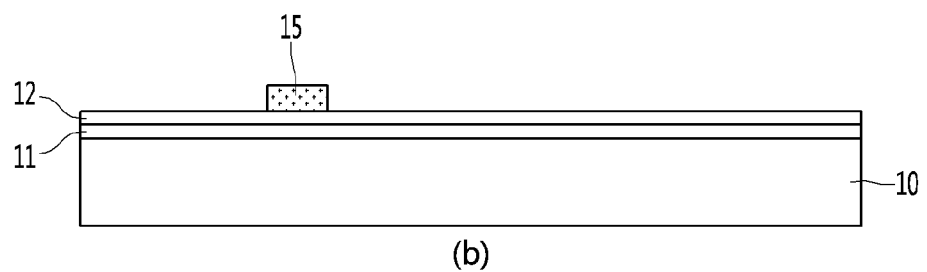

Next, as shown in FIG. 3, a depletion forming layer 15 may be formed on the second layer 12 by etching the third layer 13. The depletion forming layer 15 may be formed, for example, by a photolithography process and an etching process.

Figure 4:
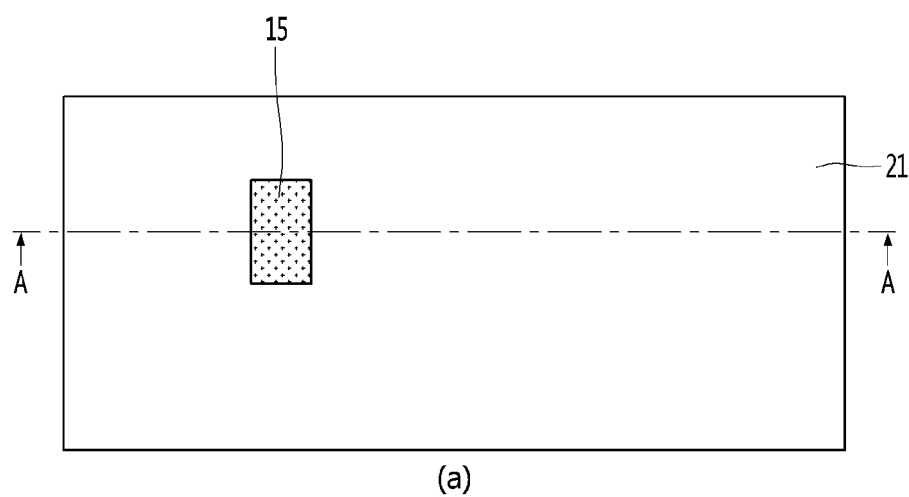
Figure 4:
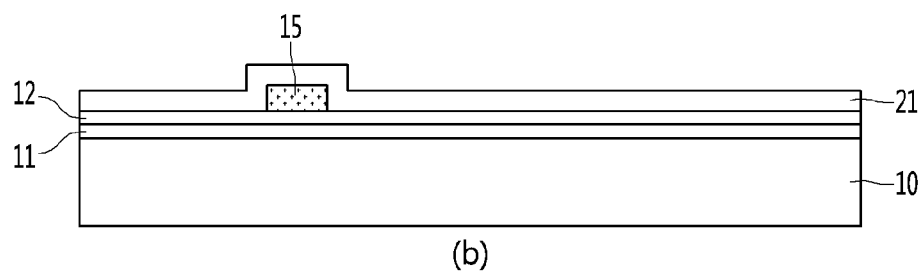

Next, as shown in FIG. 4, a first passivation film 21 may be formed on the second layer 12 and the depletion forming layer 15. The first passivation film 21 may be formed of an insulating material. The first passivation film 21 may comprise a single layer or multiple layers comprising at least one material of, for example, a silicon-based oxide, a silicon-based nitride, a metal oxide comprising $Al_2O_3$, and an organic insulating material.

Figure 5:
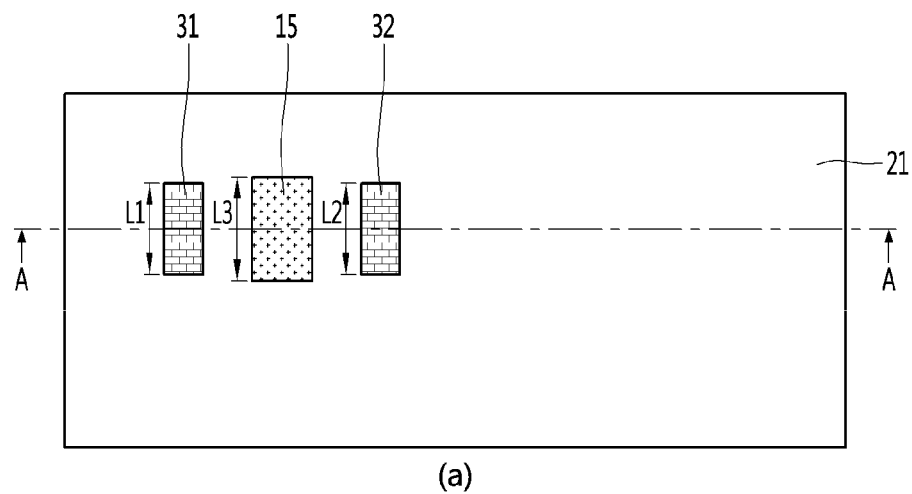
Figure 5:
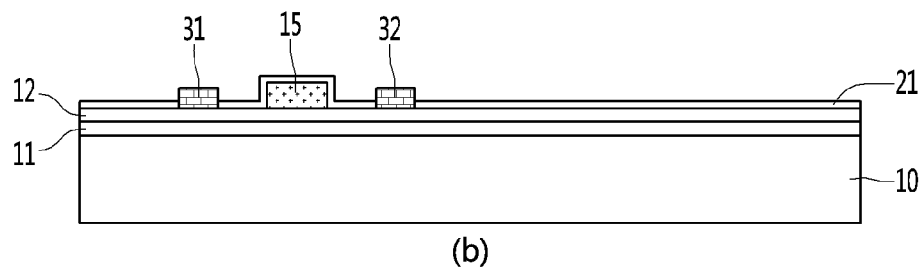

As shown in FIG. 5, a source contact portion 31 and a drain contact portion 32 may be formed on the second layer 12. The source contact portion 31 and the drain contact portion 32 may be formed on the second layer 12 by passing through the first passivation film 21. For example, the source contact portion 31 and the drain contact portion 32 may be formed by a self-align process. The source contact portion 31 and the drain contact portion 32 may be in ohmic contact with the second layer 12. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be formed in a thickness of 0.1 to 1 μm as an example. Since the source contact portion 31 and the drain contact portion 32 do not need to serve to spread a current as a layer for contacting with the channel layer 60, the source contact portion 31 and the drain contact portion 32 may be provided in a thickness of 1 μm or less.

As shown in (a) of FIG. 5, the source contact portion 31 may have a length of L1 in a first direction and the drain contact portion 32 may have a length of L2 in the first direction. The depletion forming layer 15 may be formed to have a length L3 in the first direction. For example, a side surface of the source contact portion 31 and a side surface of the drain contact portion 32 may be disposed to face each other, and the depletion forming layer 15 may be disposed to extend in one direction between the side surface of the source contact portion 31 and the side surface of the drain contact portion 32. The length L3 of the depletion forming layer 15 disposed to extend in the one direction may be formed longer than the side length L1 of the source contact portion 31. The length L3 of the depletion forming layer 15 may be formed longer than the side length L2 of the drain contact portion 32. Since the length of the depletion forming layer 15 disposed between the source contact portion 31 and the drain contact portion 32 is formed longer, when the depletion forming layer 15 is operated as a transistor, a sufficient depletion region may be formed at the channel layer by the depletion forming layer 15. Accordingly, according to an embodiment, when a gate voltage is not applied, it is possible to prevent a current from flowing from the source contact portion 31 to the drain contact portion 32. As described above, according to an embodiment, it is possible to provide a transistor of a normally off driving.

Figure 6:
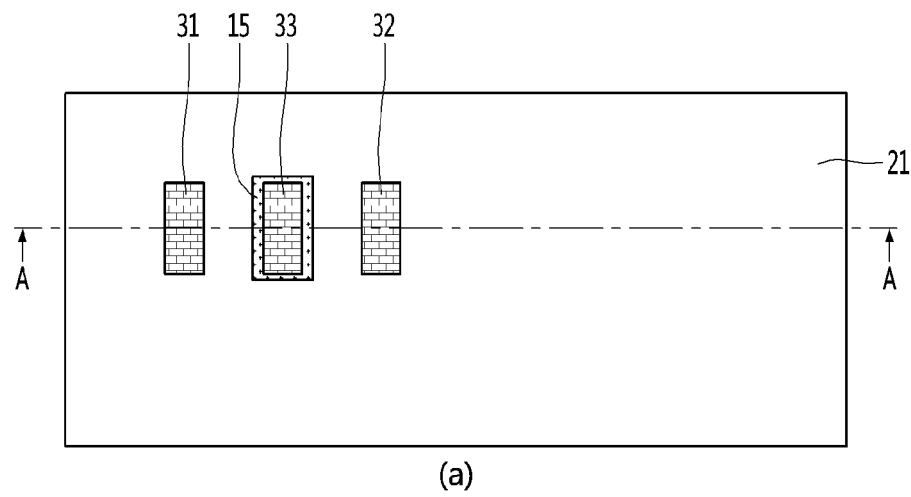
Figure 6:
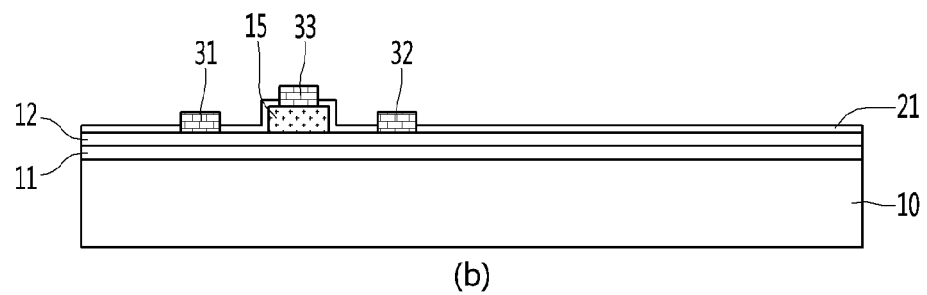

In addition, as shown in FIG. 6, a gate electrode 33 may be formed on the depletion forming layer 15. The gate electrode 33 may be formed to pass through the first passivation film 21.

The gate electrode 33 may be provided with a material in ohmic contact with the depletion forming layer 15. For example, the gate electrode 33 may be provided with a metallic material in ohmic contact with a p-type nitride layer. The gate electrode 33 may comprise a single layer or multiple layers comprising at least one material selected from the group consisting of tungsten (W), tungsten silicon ($WSi_2$), titanium nitride (TiN), tantalum (Ta), tantalum nitride (TaN), palladium (Pd), nickel (Ni), and platinum (Pt). The gate electrode 33 may be provided in a thickness of 0.1 to 1 μm as an example. Since the gate electrode 33 does not need to serve to spread a current as a layer for contacting with the depletion forming layer 15, the gate electrode 33 may be provided in a thickness of 1 μm or less.

Figure 7:
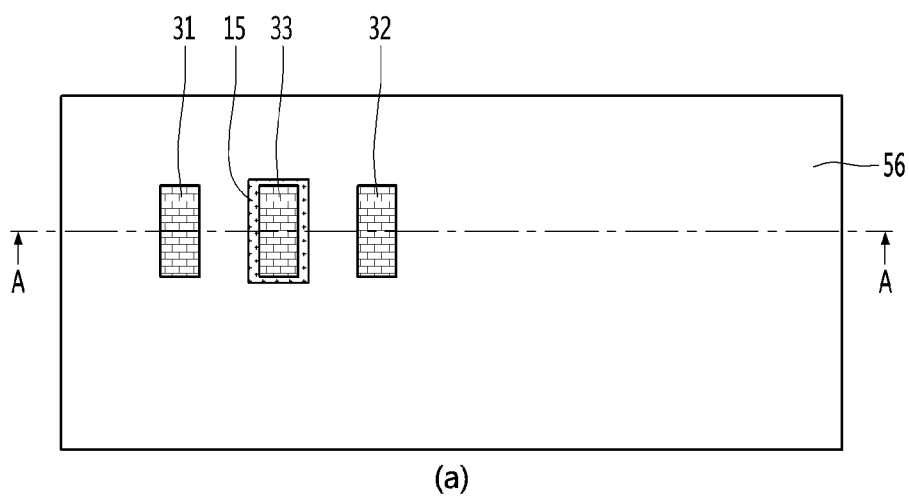
Figure 7:
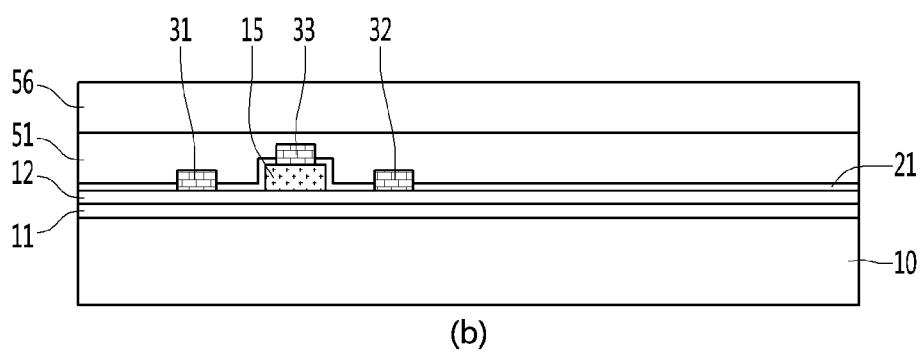

Next, as shown in FIG. 7, a bonding layer 51 and a temporary substrate 56 may be provided on the source contact portion 31, the drain contact portion 32, and the gate electrode 33. The bonding layer 51 and the temporary substrate 56 are provided for applying a transfer process and removing the growth substrate 10. And then, after the growth substrate 10 is removed, a black matrix layer may be formed on the first layer 11.

Figure 8:
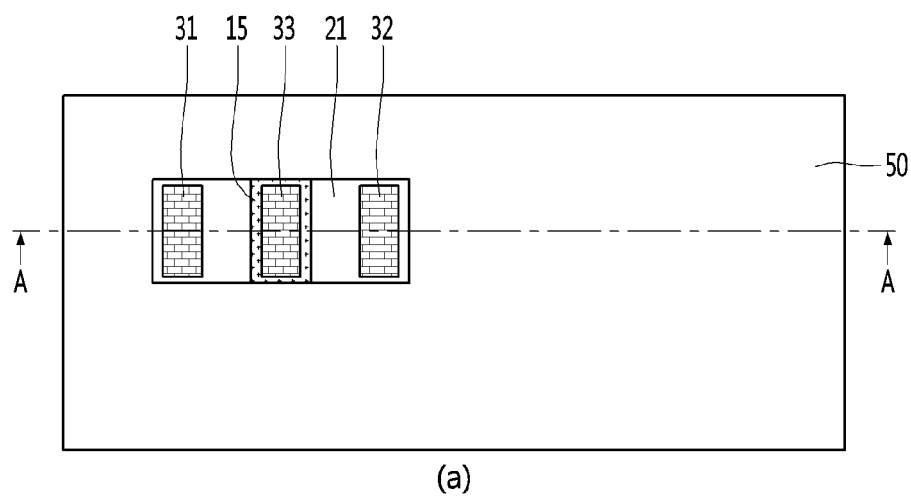
Figure 8:
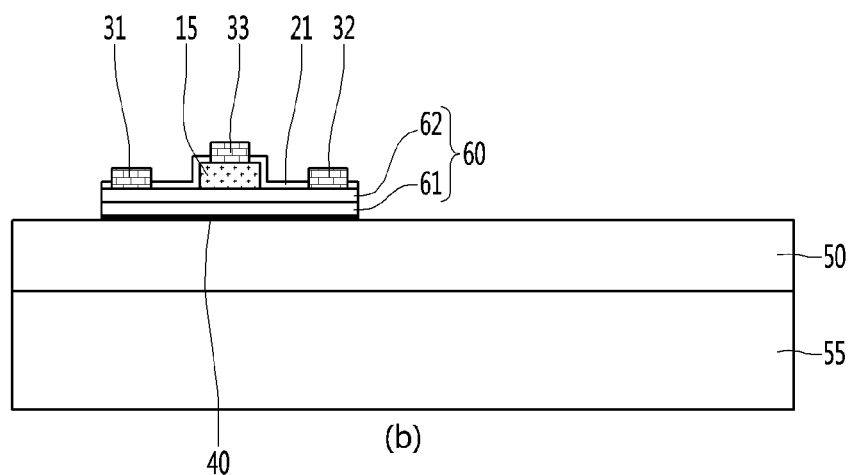

In addition, as shown in FIG. 8, a bonding layer 50 and a substrate 55 may be provided on the black matrix layer for applying a transfer process, and the temporary substrate 56 is removed, and a channel layer 60 and a black matrix 40 may be patterned.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 μm as an example. A thickness of the bonding layer 50 may be different according to a type of a selected material and may be provided in a thickness of 1 to 3 μm. In addition, the bonding layer 50 may be provided in a thickness of 1.8 to 2.2 μm as an example.

The substrate 55 may comprise a transparent substrate. The substrate 55 may be provided with a transparent substrate having a thickness of 0.1 mm to 3 mm as an example. In addition, the thickness of the substrate 55 may be changed according to application and size of an applied display device and may be selected within a thickness range of 0.4 to 1.1 mm. For example, the substrate 55 may be provided in a thickness of 0.6 to 0.8 mm. The substrate 55 may comprise at least one material selected from materials including silicon, glass, polyimide, and plastic. The substrate 55 may comprise a flexible substrate.

According to an embodiment, a high quality semiconductor layer may be formed by using the growth substrate 10 and a thin film transistor substrate having an excellent electron mobility may be provided by applying a transfer process by using the substrate 55.

As shown in FIG. 8, a patterning of the first passivation film 21 may be performed, and the channel layer 60 and the black matrix 40 may be formed.

At this time, the first layer 11 and the second layer 12 may be etched to form the channel layer 60. The channel layer 60 may comprise a first nitride semiconductor layer 61 and a second nitride semiconductor layer 62 as an example. For example, the channel layer 60 and the depletion forming layer 15 may be formed in the same length L3. When the length of the depletion forming layer 15 is smaller than that of the channel layer 60, a leakage current may be generated. A width of the channel layer 60 may be provided to be equal to a width of the black matrix 40. A width of the first passivation film 21 may be provided to be equal to the width of the channel layer 60.

Figure 9:
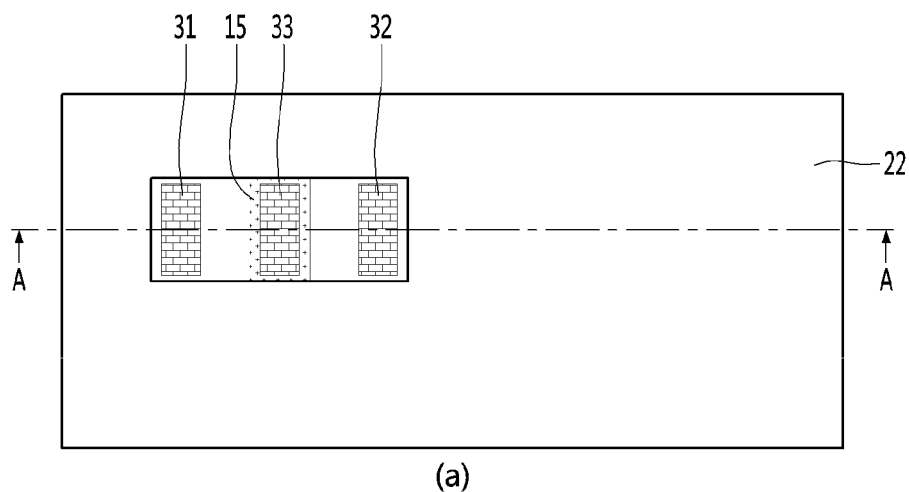
Figure 9:
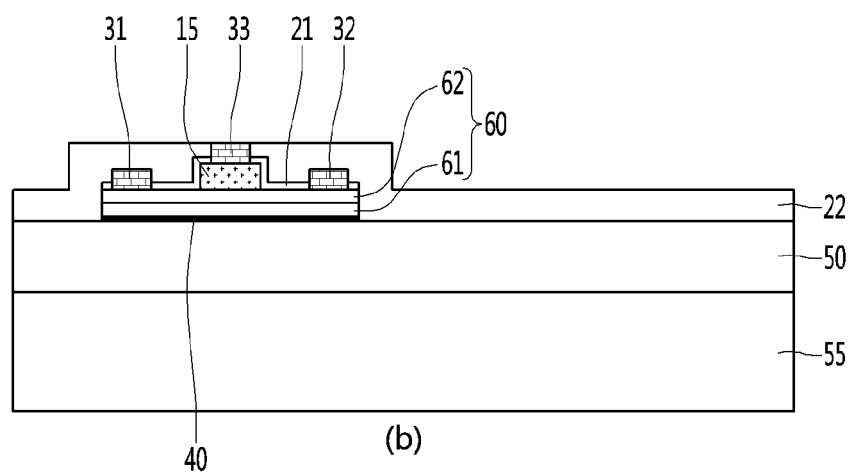

Next, as shown in FIG. 9, a second passivation film 22 may be formed on the bonding layer 50 and the first passivation film 21. The second passivation film 22 may comprise an insulating material. The second passivation film 22 may comprise a single layer or multiple layers including at least one material of a silicon-based oxide, a silicon-based nitride, a metal oxide including $Al_2O_3$, and an organic insulating material as an example.

Figure 10:
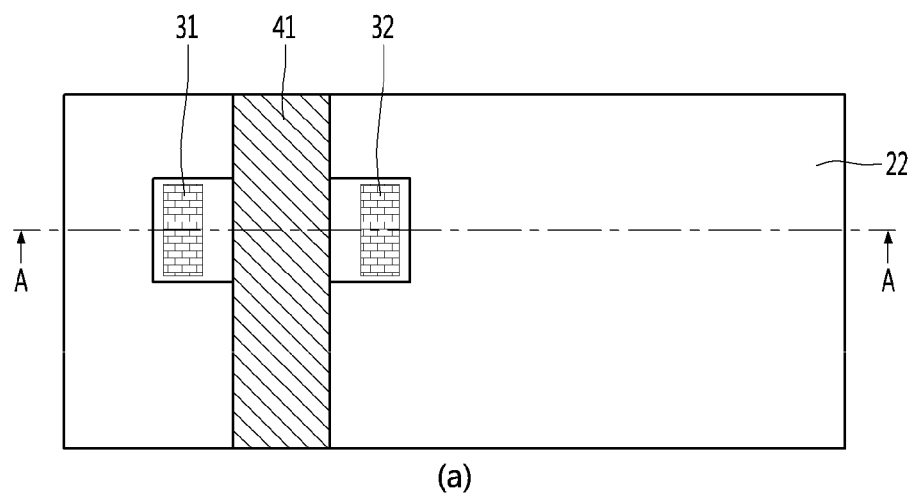
Figure 10:
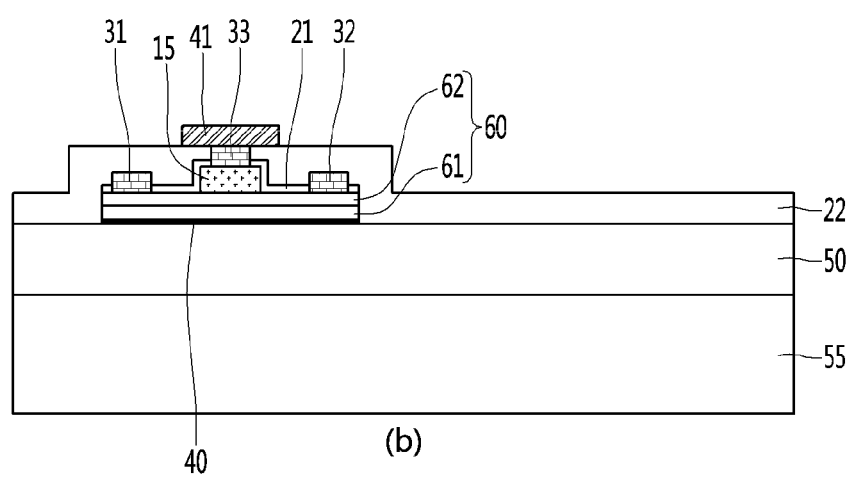

Then, as shown in FIG. 10, a gate wiring 41 may be formed on the second passivation film 22. The gate wiring 41 may be electrically connected to the gate electrode 33.

Figure 11:
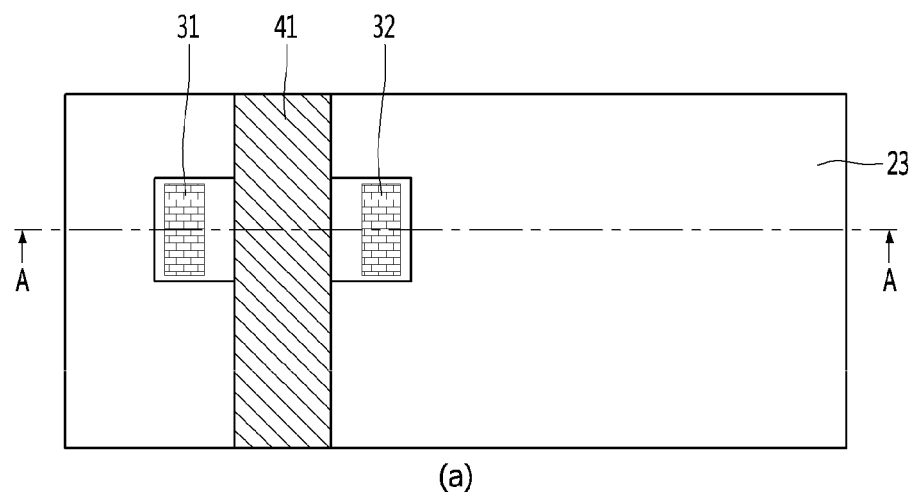
Figure 11:
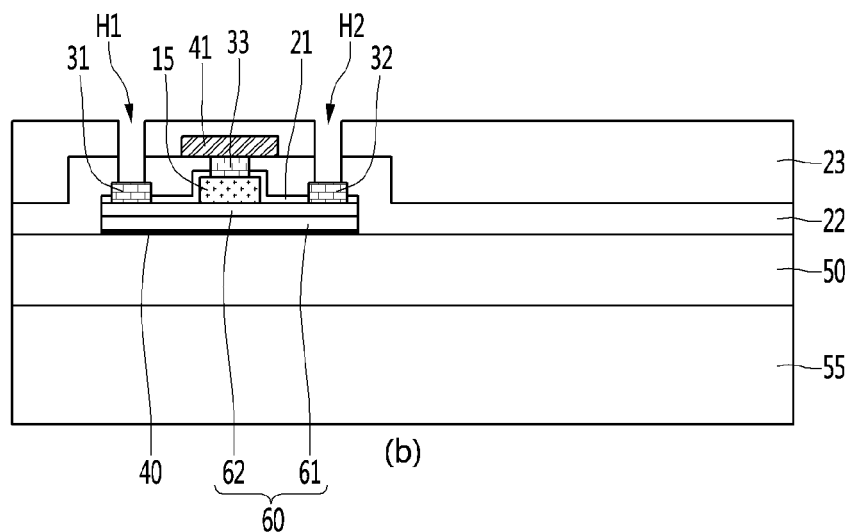

In addition, as shown in FIG. 11, a third passivation film 23 may be formed on the second passivation film 22. The third passivation film 23 may be referred to as a planarization layer or an overcoat layer. A first contact hole H1 may be formed to pass through the third passivation film 23 and the second passivation film 22 to expose the source contact portion 31. In addition, a second contact hole H2 may be formed to pass through the third passivation film 23 and the second passivation film 22 to expose the drain contact portion 32.

The third passivation film 23 may comprise an insulating material. The third passivation film 23 may comprise a single layer or multiple layers comprising at least one material of a silicon-based oxide, a silicon-based nitride, a metal oxide comprising $Al_2O_3$, and an organic insulating material as an example.

Figure 12:
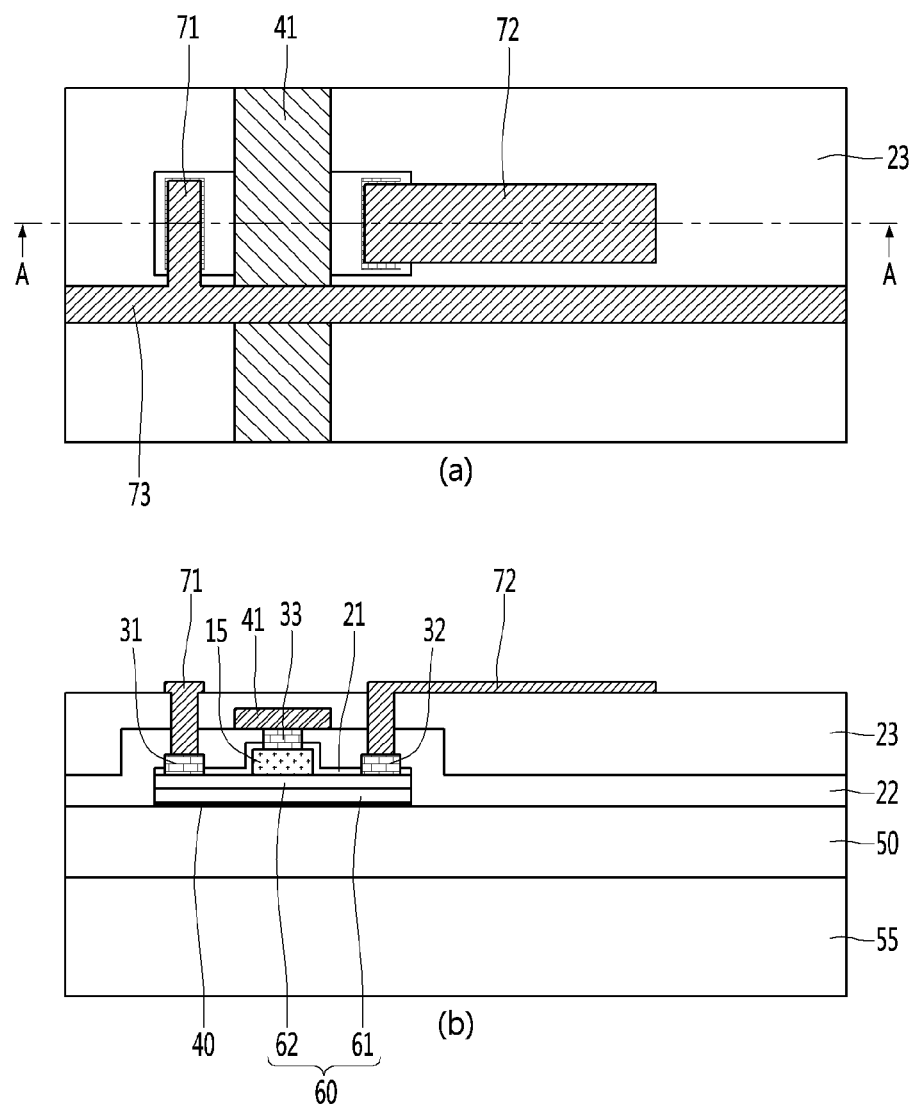

In addition, as shown in FIG. 12, a source electrode 71 and a drain electrode 72 may be formed on the third passivation film 23. A first region of the source electrode 71 may be formed on the third passivation film 23 and a second region of the source electrode 71 may be formed at the first contact hole H1, so as to electrically be connected to the source contact portion 31. A first region of the drain electrode 72 may be formed on the third passivation film 23 and a second region of the drain electrode 72 may be formed at the second contact hole H2, so as to electrically be connected to the drain contact portion 32. In addition, a data wiring 73 connected to the source electrode 71 may be formed. The data wiring 73 may be disposed to be extending in one direction and intersecting with the gate wiring 41.

For example, the source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 μm as an example. Since the source electrode 71 serves to sequentially apply a voltage to the plurality of transistors, the source electrode 71 may be provided to be thicker than a thickness of the source contact portion 31. Also, the drain electrode 72 may be provided to be thicker than a thickness of the drain contact portion 32.

Figure 13:
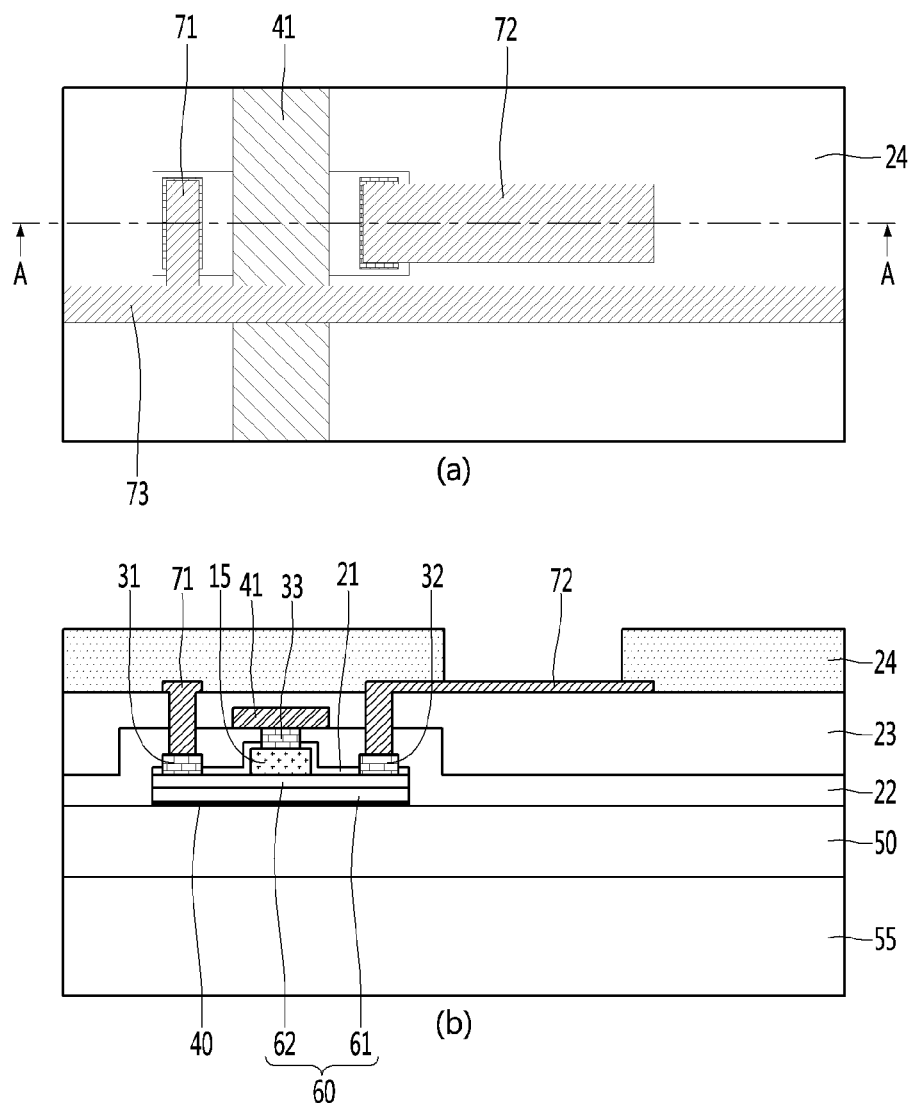
Figure 14:
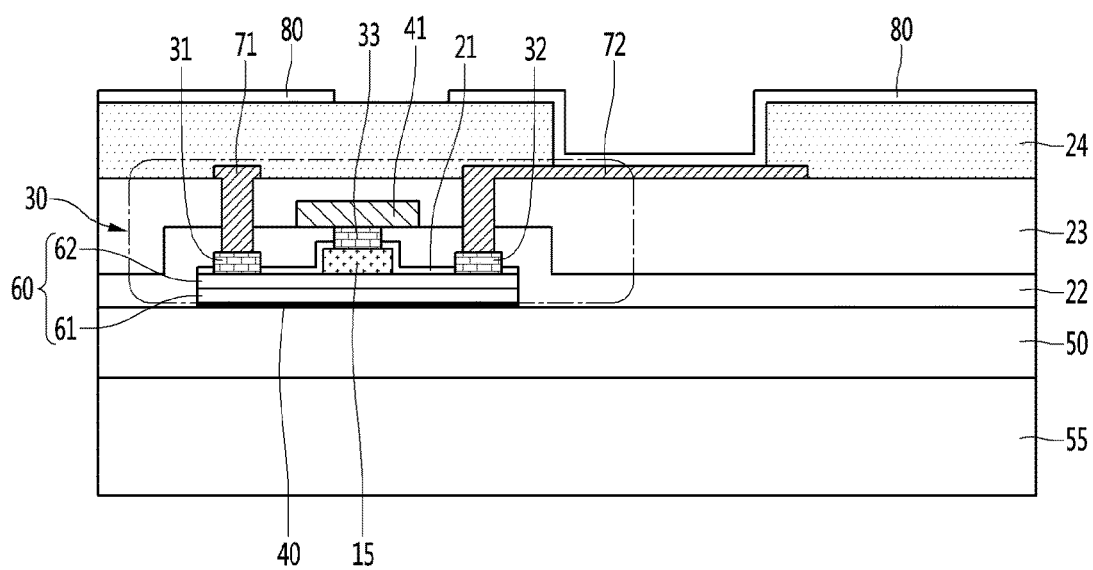

As shown in FIGS. 13 and 14, a fourth passivation layer 24 may be formed on the source electrode 71 and the drain electrode 72. In addition, a third contact hole H3 may be formed at the fourth passivation film 24 to expose the drain electrode 72.

A pixel electrode 80 may be formed on the fourth passivation film 24. The pixel electrode 80 may be electrically connected to the drain electrode 72 through the third contact hole H3 provided in the fourth passivation film 24.

The pixel electrode 80 may be provided with a transparent conductive material. The pixel electrode 80 may be provided with, for example, a transparent conductive oxide film. The pixel electrode 80 may comprise at least one material selected among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The basic thin film transistor substrate according to an embodiment may be formed by such a process. The manufacturing process described with reference to FIGS. 2 to 14 is only one example, and the process method or the process order in each step may be modified.

Figure 15:
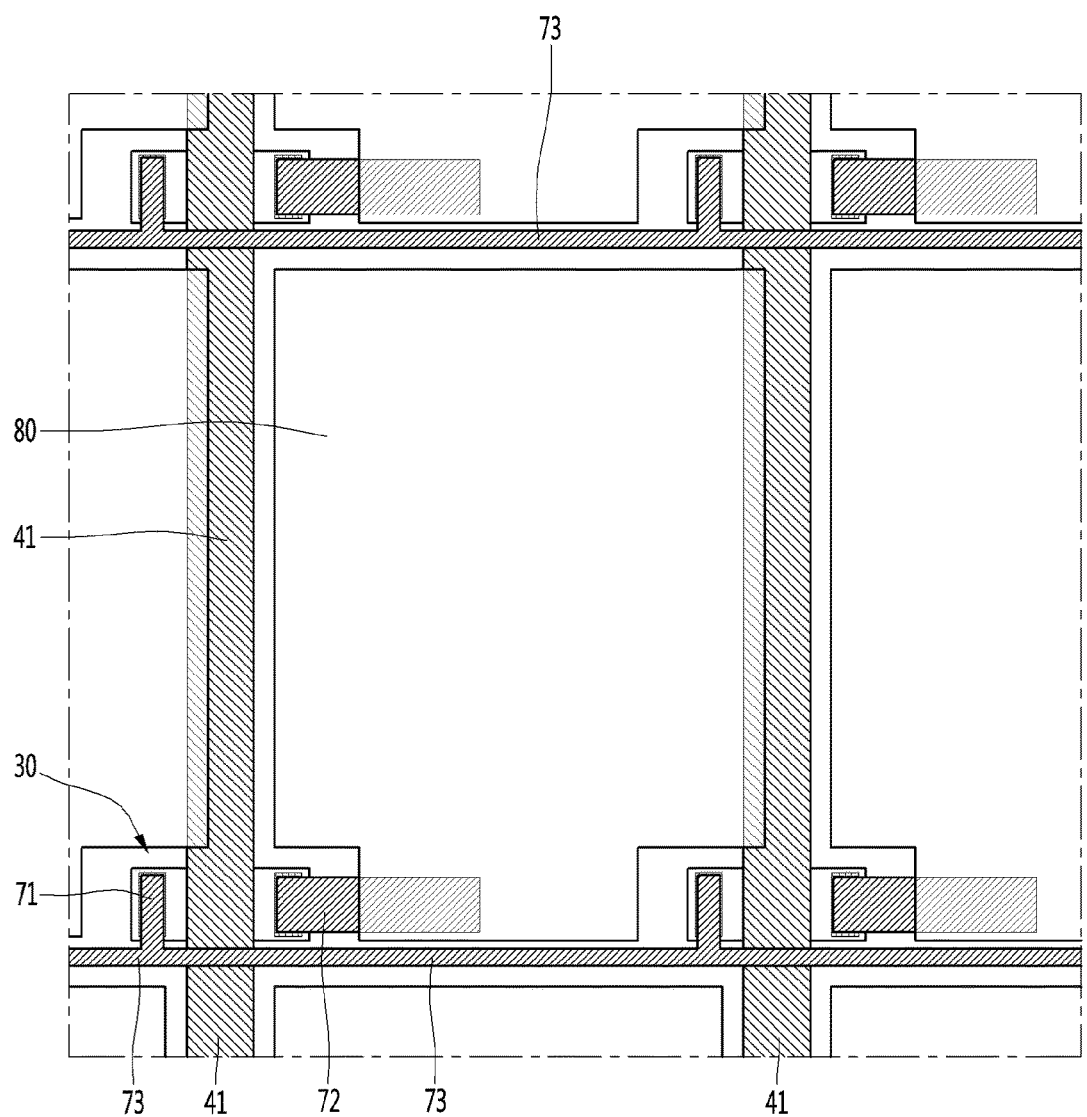
FIG. 15 is a view illustrating an example in which a plurality of pixels are disposed on a thin film transistor substrate according to an embodiment of the present invention.

FIG. 15 is a view illustrating an example in which a plurality of pixels are disposed on a thin film transistor substrate according to an embodiment of the present invention.

As shown in FIG. 15, the thin film transistor substrate according to an embodiment may comprise a plurality of thin film transistors 30 disposed in a region in which the gate wiring 41 and the data wiring 73 intersect with each other. The pixel electrode 80 may be disposed in a region that is defined by the gate wiring 41 and the data wiring 73. A partial region of the pixel electrode 80 may be disposed to be overlapped with the gate wiring 41.

The thin film transistor substrate according to an embodiment may be bonded to a color filter substrate to provide a liquid crystal display panel. A liquid crystal layer may be provided between the thin film transistor substrate and the color filter substrate. A common electrode may be provided at the color filter substrate, and an arrangement of the liquid crystal layer disposed between the common electrode and the pixel electrode provided on the thin film transistor substrate may be controlled by a difference in voltage applied therebetween, and a light transmission amount of a corresponding pixel may be controlled. The liquid crystal display panel having such a structure may be referred to as a vertical electric field type liquid crystal display panel.

According to the thin film transistor substrate according to an embodiment, a high carrier mobility may be implemented by providing the thin film transistor comprising the nitride-based semiconductor layer. An electron mobility ($cm^2/Vs$) of the thin film transistor varies depending on a material used as a channel layer. For example, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 16:
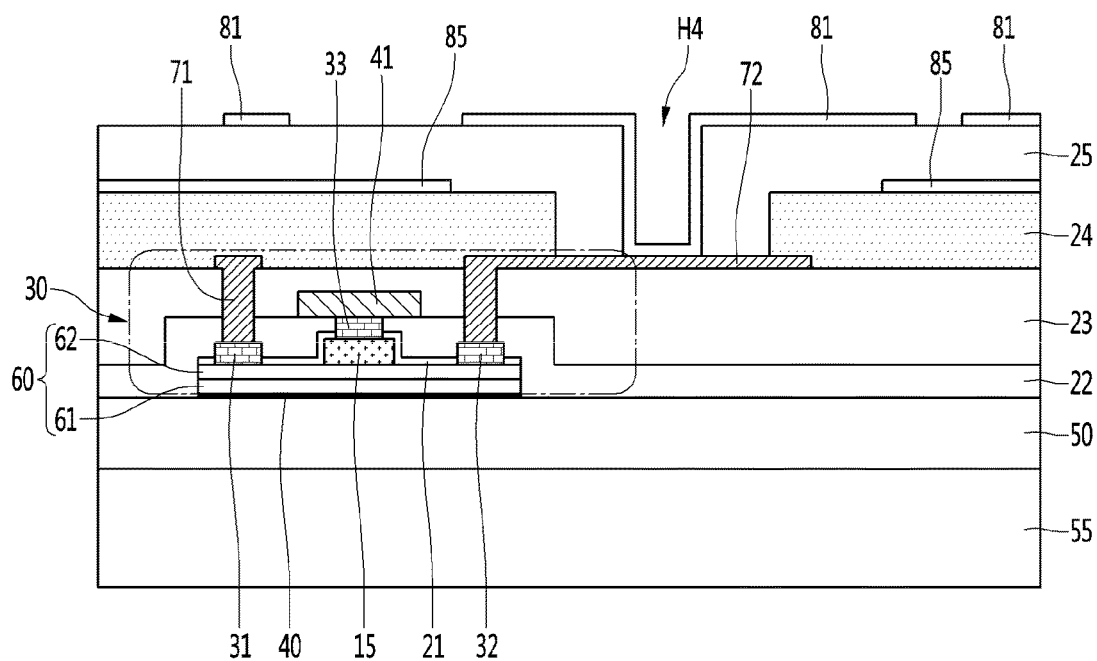
FIGS. 16 and 17 are views illustrating another example of a thin film transistor substrate according to an embodiment of the present invention.
Figure 17:
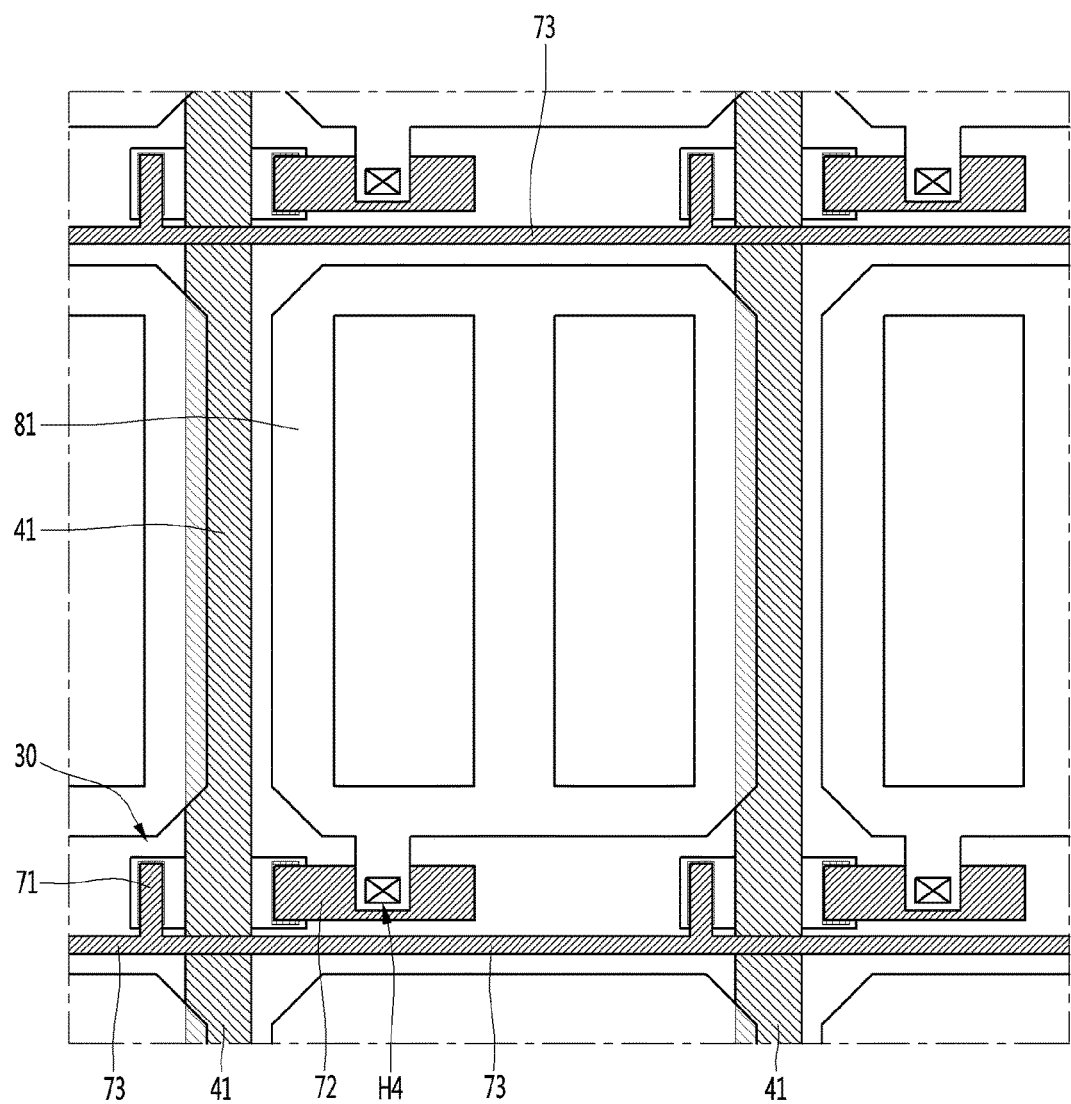

FIGS. 16 and 17 are views illustrating another example of a thin film transistor substrate according to an embodiment of the present invention. Referring to FIGS. 16 and 17, in the description of the thin film transistor substrate according to an embodiment, description of contents overlapping with those described with reference to FIGS. 1 to 15 may be omitted.

The thin film transistor substrate described with reference to FIGS. 1 to 15 may be applied to a vertical electric field type liquid crystal display panel. A pixel electrode 80 may be disposed on the thin film transistor substrate and a common electrode configured to form an electric field in a pixel along with the pixel electrode 80 may be provided at a separate color filter substrate, and thus a vertical electric field type liquid crystal display panel can be realized. Meanwhile, the thin film transistor substrate described with reference to FIGS. 16 and 17 may be applied to a horizontal electric field type liquid crystal display panel.

As shown in FIGS. 16 and 17, the thin film transistor substrate according to an embodiment may comprise a pixel electrode 81, a common electrode 85, and a fifth passivation film 25.

The common electrode 85 may be disposed on a fourth passivation film 24. The fifth passivation film 25 may be disposed on the fourth passivation film 24. The fifth passivation film 25 may be disposed on the common electrode 85 and the fourth passivation film 24. The common electrode 85 may be disposed between the fourth passivation film 24 and the fifth passivation film 25. In addition, the fifth passivation film 25 may be provided on a drain electrode 72 exposed through the fourth passivation film 24. The pixel electrode 81 may be disposed on the fifth passivation film 25. A partial region of the pixel electrode 81 may be electrically connected to the drain electrode 72 through a fourth contact hole H4 provided in the fifth passivation film 25. A partial region of the pixel electrode 81 may be disposed in contact with the upper surface of the drain electrode 72 through the fourth contact hole H4. The pixel electrode 81 may be disposed in contact with the upper surface of the drain electrode 72 by passing through the fourth passivation film 24 and the fifth passivation film 25. A partial region of the pixel electrode 81 and a partial region of the common electrode 85 may be overlapped with each other in a vertical direction.

The thin film transistor substrate according to an embodiment may comprise a plurality of thin film transistors 30 disposed in a region in which a gate wiring 41 and a data wiring 73 intersect with each other. The pixel electrode 81 may be disposed at a region that is defined by the gate wiring 41 and the data wiring 73. The pixel electrode 81 may comprise a portion extending in a finger shape. A partial region of the pixel electrode 81 may be disposed and overlapped with the gate wiring 41.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 81 may be provided with a transparent conductive material. The pixel electrode 81 may be provided with, for example, a transparent conductive oxide film. The pixel electrode 81 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The fifth passivation film 25 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may be bonded to a color filter substrate to provide a liquid crystal display panel. A liquid crystal layer may be provided between the thin film transistor substrate and the color filter substrate. In the thin film transistor substrate according to an embodiment, an arrangement of the liquid crystal layer may be adjusted by a difference in voltage applied between the common electrode 85 and the pixel electrode 81, and a light transmission amount of a corresponding pixel may be controlled. The liquid crystal display panel having such a structure may be referred to as a horizontal electric field type liquid crystal display panel, a transverse electric field type liquid crystal display panel, or an In Plane Switching (IPS) liquid crystal display panel. Since the liquid crystal display panel itself has no light source, a display device may be implemented by providing a light unit that supplies light to the liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 18:
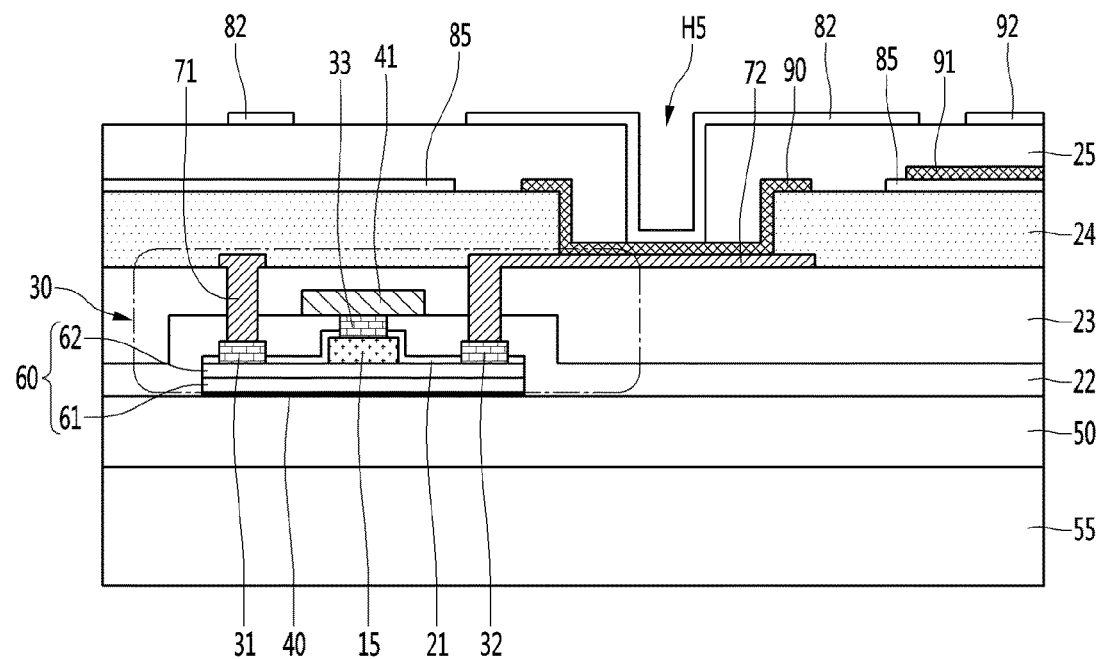
FIG. 18 is a view illustrating still another example of a thin film transistor substrate according to an embodiment of the present invention.

FIG. 18 is a view illustrating still another example of a thin film transistor substrate according to an embodiment of the present invention. Referring to FIG. 18, in the description of the thin film transistor substrate according to an embodiment, description of a part overlapping with those described with reference to FIGS. 1 to 17 may be omitted.

The thin film transistor substrate according to an embodiment may comprise a pixel electrode 82, a common electrode 85, a metal layer 90, a touch panel lower electrode 91, and a touch panel upper electrode 92.

The common electrode 85 may be disposed on a fourth passivation film 24. The pixel electrode 82 may be disposed on a fifth passivation film 25. The pixel electrode 82 may be electrically connected to a drain electrode 72. The metal layer 90 may be provided between the pixel electrode 82 and the drain electrode 72. The metal layer 90 may be disposed in contact with the drain electrode 72 exposed through the fourth passivation film 24. A partial region of the pixel electrode 82 may be electrically connected to the drain electrode 72 through the metal layer 90 through a fifth contact hole H5 provided in the fifth passivation film 25.

According to an embodiment, the touch panel upper electrode 92 may be provided on the fifth passivation film 25 and the touch panel lower electrode 91 may be disposed below the touch panel upper electrode 92. The touch panel lower electrode 91 may be disposed on the fourth passivation film 24 and may be electrically connected to the common electrode 85. The touch panel lower electrode 91 may be disposed between the common electrode 85 and the fifth passivation film 25. The touch panel upper electrode 92 may be disposed to be overlapped with the touch panel lower electrode 91 in a vertical direction.

The touch panel upper electrode 92 and the touch panel lower electrode 91 may form an in-cell touch panel provided in the display panel. Accordingly, the thin film transistor substrate according to an embodiment may detect a contact of the display panel from outside by using the in-cell touch panel.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 82 may be provided with a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The touch panel lower electrode 91 and the touch panel upper electrode 92 may be formed of a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The in-cell touch panel-integrated thin film transistor substrate according to an embodiment may be bonded to a color filter substrate to provide a liquid crystal display panel. A liquid crystal layer may be provided between the in-cell touch panel-integrated thin film transistor substrate and the color filter substrate. In the in-cell touch panel-integrated thin film transistor substrate according to an embodiment, an arrangement of the liquid crystal layer may be adjusted by a difference in voltage applied between the common electrode 85 and the pixel electrode 82, and a light transmission amount of a corresponding pixel may be controlled. The in-cell touch panel-integrated liquid crystal display panel having such a structure may be referred to as a horizontal electric field type liquid crystal display panel, a transverse electric field type liquid crystal display panel, or an In Plane Switching (IPS) liquid crystal display panel. Since the in-cell touch panel-integrated liquid crystal display panel itself has no light source, a display device may be implemented by providing a light unit that supplies light to the in-cell touch panel-integrated liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 19:
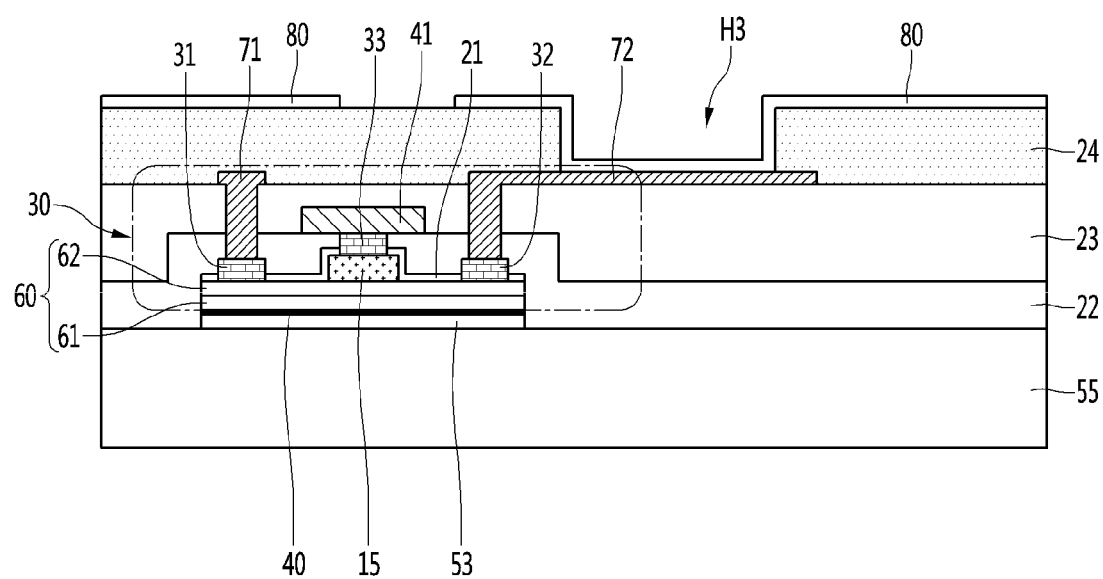
FIG. 19 is a view illustrating still another example of a thin film transistor substrate according to an embodiment of the present invention.
Figure 20:
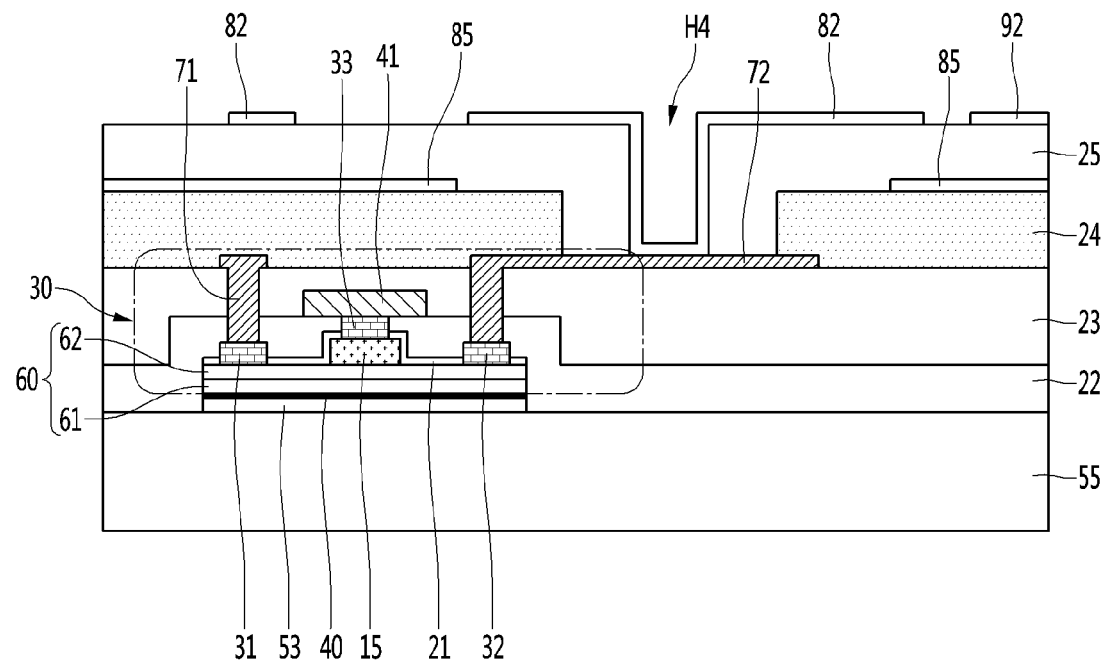
FIG. 20 is a view illustrating still another example of a thin film transistor substrate according to an embodiment of the present invention.
Figure 21:
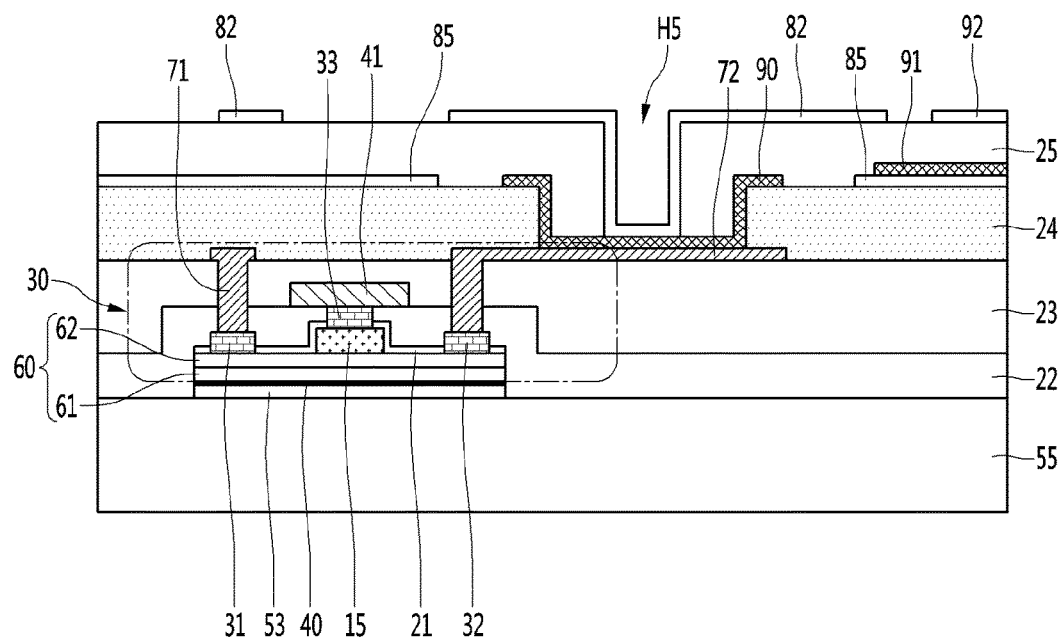
FIG. 21 is a view illustrating still another example of a thin film transistor substrate according to an embodiment of the present invention.

FIGS. 19 to 21 are views illustrating still another example of a thin film transistor substrate according to an embodiment of the present invention. Referring to FIGS. 19 to 21, in the description of the thin film transistor substrate according to an embodiment, description of contents overlapping with those described with reference to FIGS. 1 to 18 may be omitted. An embodiment shown in FIGS. 19 to 21 differs from that of each of FIGS. 1, 16, and 18 in the bonding layer structure.

As shown in FIGS. 19 to 21, a bonding layer 53 may be provided on the substrate 55. The bonding layer 53 may be disposed between the substrate 55 and the black matrix 40. For example, a width of the bonding layer 53 may be provided to be equal to a width of the black matrix 40. For example, the width of the bonding layer 53 may be provided to be equal to a width of the channel layer 60.

According to an embodiment, a second passivation film 22 may be disposed on the substrate 55. A lower surface of the second passivation film 22 may be disposed in contact with an upper surface of the substrate 55. In a region where the bonding layer 50 is not provided, the second passivation film 22 may be disposed in direct contact with the substrate 55.

As described above, according to the embodiment shown in FIGS. 19 to 21, as compared with the embodiment shown in FIGS. 1, 16, and 18, since the second passivation film 22 and the substrate 55 may be disposed in direct contact with each other, a layer provided between the second passivation film 22 and the substrate 55 (for example, an illustrated bonding layer in FIGS. 1, 16, and 18) may be eliminated. Accordingly, according to the embodiment, since an interface between different material layers is reduced on a light path where light travels, light loss due to reflection/refraction at the interface may be reduced.

The bonding layer 53 according to an embodiment may comprise at least one of a reflective layer, a metal bonding layer, an organic bonding layer, and an insulating layer as an example. The reflective layer may be disposed on the substrate 55, the metal bonding layer may be disposed on the reflective layer, and the insulating layer may be disposed on the metal bonding layer. For example, the bonding layer 53 may comprise at least one of the metal bonding layer and the organic bonding layer, and the reflective layer and the insulating layer may be comprised selectively.

The insulating layer may complement the leakage characteristics of the channel layer 60. For example, the insulating layer may comprise a single layer or multiple layers including at least one material of a silicon-based oxide, a silicon-based nitride, a metal oxide including $Al_2O_3$, and an organic insulating material as an example.

The metal bonding layer or the organic bonding layer may be provided for bonding with the substrate 55 disposed thereunder. For example, the metal bonding layer may comprise at least one material selected from the group consisting of gold (Au), tin (Sn), indium (In), nickel (Ni), silver (Ag), and copper (Cu), or an alloy thereof. For example, the organic bonding layer may comprise at least one material selected from the group consisting of acryl, benzocyclobutene (BCB), SU-8 polymer, and the like.

The reflective layer may reduce light absorption in the bonding layer. For example, the reflective layer may comprise at least one material selected from the group consisting of aluminum (Al), silver (Ag), and rhodium (Rh), or an alloy thereof. The reflective layer may be provided with a material having a reflection characteristic of more than 60% as an example.

Meanwhile, according to an embodiment, for example, when the bonding layer 53 comprises the metal bonding layer and the reflective layer, the black matrix 40 may be omitted.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 22:
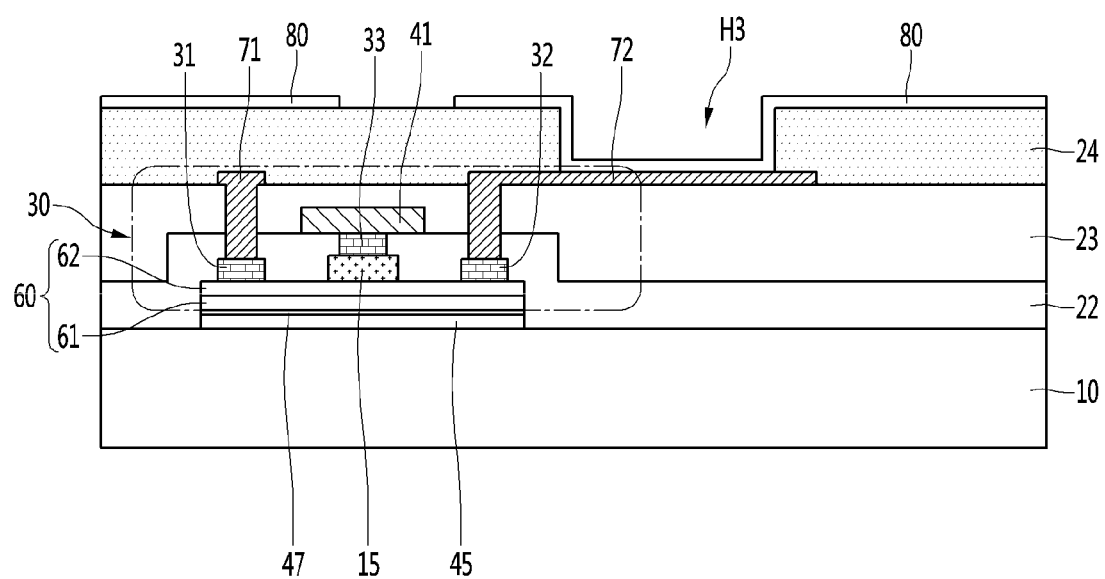
FIG. 22 is a view illustrating still another example of a thin film transistor substrate according to an embodiment of the present invention.
Figure 23:
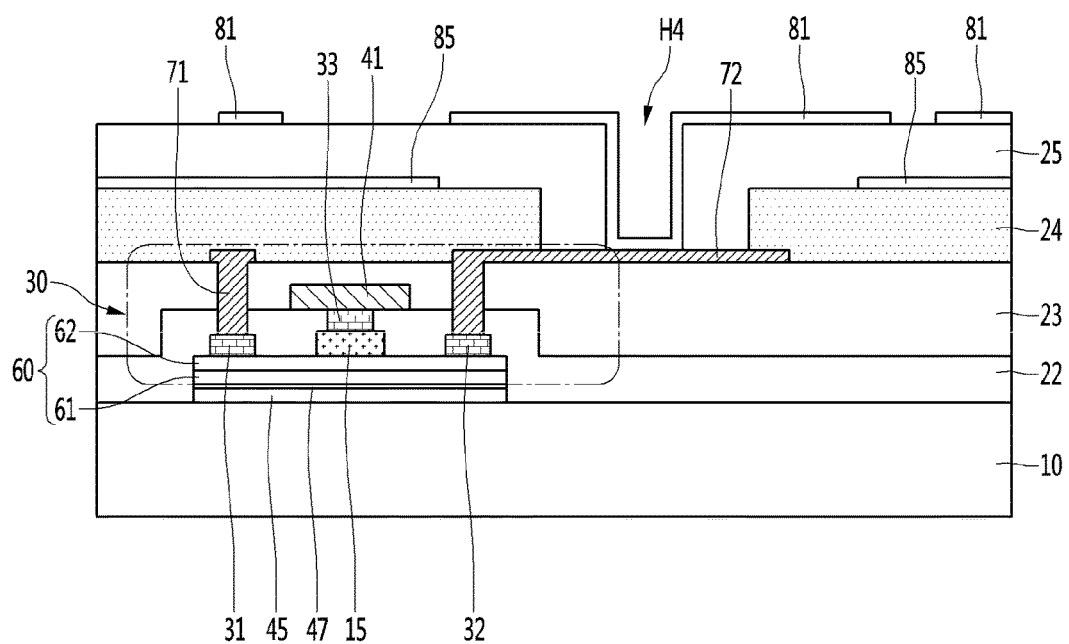
FIG. 23 is a view illustrating still another example of a thin film transistor substrate according to an embodiment of the present invention.
Figure 24:
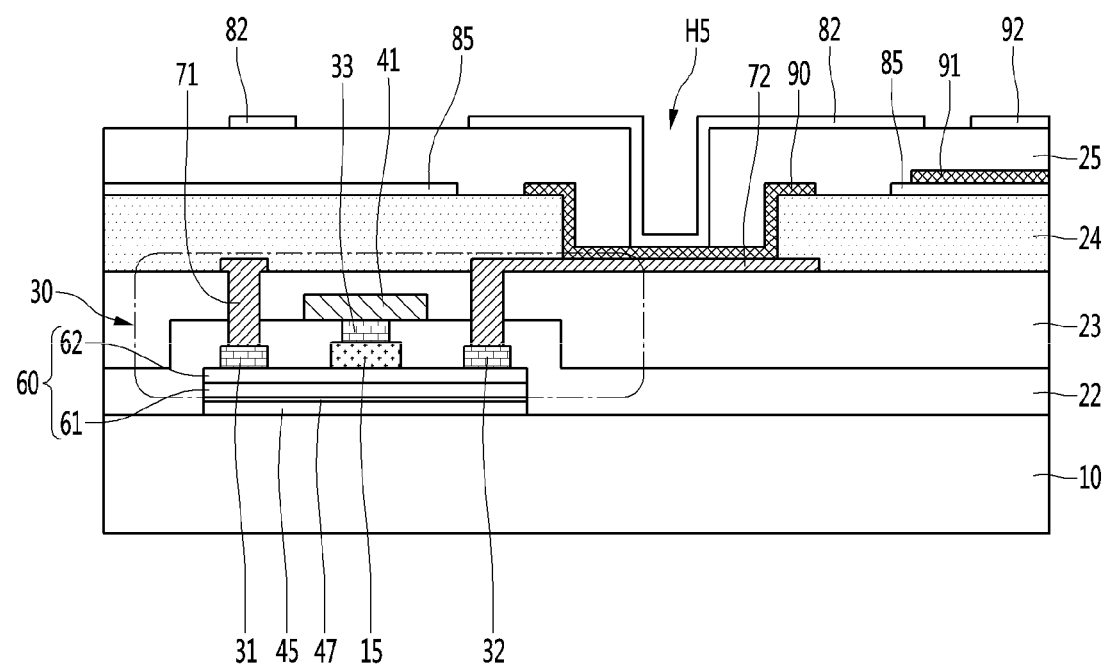
FIG. 24 is a view illustrating still another example of a thin film transistor substrate according to an embodiment of the present invention.

FIGS. 22 to 24 are views illustrating still another example of a thin film transistor substrate according to an embodiment of the present invention. Referring to FIGS. 22 to 24, in the description of the thin film transistor substrate according to the embodiment, description of contents overlapping with those described with reference to FIGS. 1 to 21 may be omitted. An embodiment shown in FIGS. 22 to 24 differs from that of each of FIGS. 1, 16, and 18 in that a transfer process is not applied and a thin film transistor is provided on a growth substrate.

As shown in FIGS. 22 to 24, the thin film transistor substrate according to the embodiment may comprise a growth substrate 10 as a substrate instead of a support substrate used in the transfer process. For example, the growth substrate 10 may comprise at least one of sapphire, SiC, GaAs, GaN, ZnO, Si, GaP, InP and Ge.

A black matrix 45 may be disposed on the growth substrate 10. The black matrix 45 is disposed on the growth substrate 10 and may prevent light from being incident on the channel layer 60. The black matrix 45 may be provided with a material that absorbs or reflects visible rays as an example. Thus, according to the embodiment, light is incident on the channel layer 60 and it is possible to prevent a thin film transistor 30 from being deteriorated due to a photo current or the like. For example, the black matrix 45 may be provided in a single layer or multiple layers including at least one material selected from among a Si-based material, a Ga-based material, an Al-based material, and an organic material. The black matrix 45 may selectively comprise a material such as Si, GaAs, or the like.

According to an embodiment, a buffer layer 47 may be provided on the black matrix 45. The buffer layer 47 may be provided between the black matrix 45 and the channel layer 60. The buffer layer 47 may help a growth of a nitride semiconductor layer constituting the channel layer 60. For example, the buffer layer 47 may comprise a single layer or multiple layers including at least one material selected from the group consisting of AlN, AlInN, and AlGaN.

For example, a width of the black matrix 45 may be provided to be equal to a width of the buffer layer 47. For example, the width of the black matrix 45 may be provided to be equal to a width of the channel layer 60. The width of the buffer layer 47 may be provided to be equal to the width of the channel layer 60.

According to an embodiment, the second passivation film 22 may be disposed on the growth substrate 10. A lower surface of the second passivation film 22 may be disposed in contact with an upper surface of the growth substrate 10. In a region where the black matrix 45 is not provided, the second passivation film 22 may be disposed in direct contact with the growth substrate 10.

According to the thin film transistor substrate according to an embodiment, a high carrier mobility may be implemented by providing the thin film transistor comprising the nitride-based semiconductor layer. For example, an electron mobility ($cm^2$/Vs) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

Therefore, according to the thin film transistor substrate, the display panel and the display device comprising the same, a high resolution can be realized and a smooth moving picture can be reproduced by providing a high carrier mobility.

Figure 25:
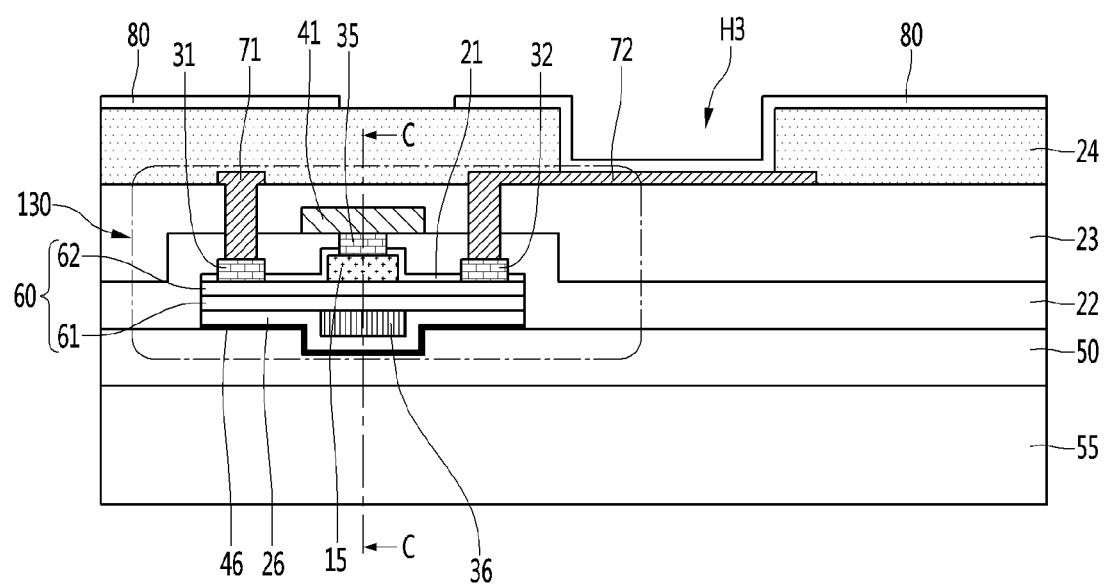
FIGS. 25 and 26 are views illustrating still another example of a thin film transistor substrate according to an embodiment of the present invention.
Figure 26:
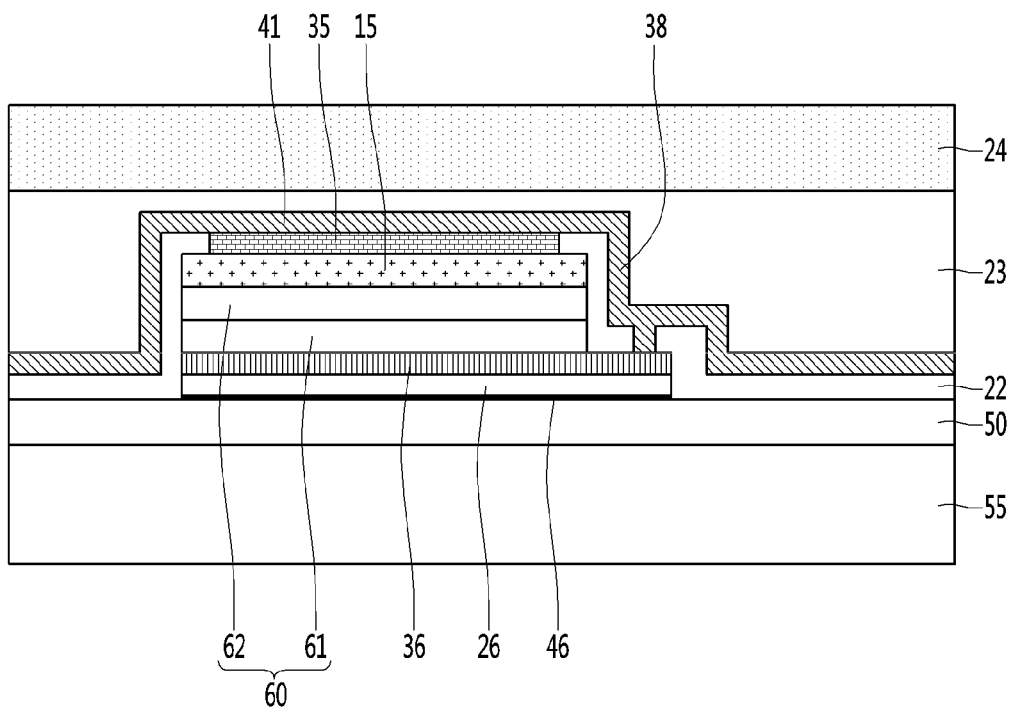

FIGS. 25 and 26 are views illustrating still another example of a thin film transistor substrate according to an embodiment of the present invention. The thin film transistor substrate shown in FIGS. 25 and 26 is an embodiment to which a thin film transistor having a double gate structure is applied, and description of contents overlapping with those described with reference to FIGS. 1 to 24 may be omitted.

As shown in FIGS. 25 and 26, the thin film transistor substrate according to an embodiment of the present invention may comprise a substrate 55, a thin film transistor 130 disposed on the substrate 55, and a pixel electrode 80 electrically connected to the thin film transistor 130.

The thin film transistor 130 according to an embodiment may comprise a depletion forming layer 15, a first gate electrode 35, a second gate electrode 36, a channel layer 60, a source electrode 71, and a drain electrode 72. The source electrode 71 may be electrically connected to a first region of the channel layer 60. The source electrode 71 may be electrically connected to an upper surface of the channel layer 60. The drain electrode 72 may be electrically connected to a second region of the channel layer 60. The drain electrode 72 may be electrically connected to the upper surface of the channel layer 60. The first gate electrode 35 may be disposed on the channel layer 60. The second gate electrode 36 may be disposed under the channel layer 60. The depletion forming layer 15 may be disposed on between the first region and the second region of the channel layer 60. The depletion forming layer 15 may be disposed between the channel layer 60 and the first gate electrode 35.

The channel layer 60 may be provided with, for example, a Group III-V compound semiconductor. For example, the channel layer 60 may be provided with a semiconductor material having an empirical formula of $In_xAl_yGa_{1-x-y}N$ ($0 \geq x \geq 1$, $0 \geq y \geq 1$, $0 \geq x+y \geq 1$). The channel layer 60 may comprise a single layer or multiple layers selected from, for example, GaN, AlN, AlGaN, InGaN, InN, InAlGaN, AlInN, AlGaAs, GaP, GaAs, GaAsP, AlGaInP and so on.

The channel layer 60 may comprise a first nitride semiconductor layer 61 and a second nitride semiconductor layer 62. The first nitride semiconductor layer 61 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layer 62 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the channel layer 60 according to an embodiment, the first nitride semiconductor layer 61 may comprise a GaN semiconductor layer, and the second nitride semiconductor layer 62 may comprise an AlGaN semiconductor layer. The second nitride semiconductor layer 62 may be disposed between the first nitride semiconductor layer 61 and the depletion forming layer 15.

The depletion forming layer 15 may be provided with, for example, a Group III-V compound semiconductor. For example, the depletion forming layer 15 may be provided with a semiconductor material having an empirical formula of $In_xAl_yGa_{1-x-y}N$ ($0 \geq x \geq 1$, $0 \geq y \geq 1$, $0 \geq x+y \geq 1$). The depletion forming layer 15 may comprise a single layer or multiple layers selected from, for example, GaN, AlN, AlGaN, InGaN, InN, InAlGaN, AlInN, AlGaAs, GaP, GaAs, GaAsP, AlGaInP and so on. The depletion forming layer 15 may comprise a nitride semiconductor layer doped with a p-type dopant. For example, the depletion forming layer 15 may comprise a GaN semiconductor layer doped with a p-type dopant or an AlGaN semiconductor layer doped with a p-type dopant. The depletion forming layer 15 may comprise a single layer or multiple layers provided with, for example, a semiconductor material having an empirical formula of p-$Al_xGa_{1-x}N$ (0≥x≥0.3).

The depletion forming layer 15 may be provided in a thickness of 2 to 300 nm as an example. The depletion forming layer 15 may be provided in a thickness of at least 2 nm in order to provide a depletion region at two-dimensional electron gas (2 DEG) provided at the channel layer 60. In addition, the depletion forming layer 15 may be provided in a thickness of 30 nm or more in consideration of a thickness deviation according to a manufacturing process. In addition, the depletion forming layer 15 may be provided in a thickness of 200 nm or less in consideration of a thickness deviation according to a manufacturing process. The depletion forming layer 15 may be provided in a thickness of 50 to 100 nm as an example.

The depletion forming layer 15 may serve to form a depletion region at two-dimensional electron gas (2 DEG) provided at the channel layer 60. The energy bandgap of a portion of the second nitride semiconductor layer 62 positioned thereon may be increased by the depletion forming layer 15. As a result, the depletion region of the 2 DEG may be provided at a portion of the channel layer 60 corresponding to the depletion forming layer 15. Therefore, a region corresponding to the position in which the depletion forming layer 15 is disposed in the 2 DEG provided at the channel layer 60 may be cut off. The region in which the 2 DEG is cut off at the channel layer 60 may be referred to as a cut-off region. For example, a cut-off region may be formed at the second nitride semiconductor layer 62. The thin film transistor 130 may have a normally-off characteristic due to such a cut-off region. When a voltage equal to or higher than a threshold voltage is applied to the first gate electrode 35, the 2 DEG is generated at the cut-off region and the thin film transistor 130 is turned on. When a channel formed at a lower portion of the first gate electrode 35 is turned on, a current may flow via the 2 DEG formed at the channel layer 60. Accordingly, the current flow from the first region to the second region of the channel layer 60 may be controlled according to a voltage applied to the first gate electrode 35 and the second gate electrode 36. Meanwhile, according to the present embodiment, the second gate electrode 36 may be disposed under the channel layer 60. The first gate electrode 35 and the second gate electrode 36 may be disposed to be overlapped with each other in a vertical direction. According to an embodiment, the first gate electrode 35 and the second gate electrode 36 are disposed above and below the channel layer 60 to efficiently and reliably control a current flow in the channel layer 60.

The substrate 55 may comprise a transparent substrate. The substrate 55 may be provided with a transparent substrate having a thickness of 0.1 mm to 3 mm as an example. In addition, the thickness of the substrate 55 may be changed according to application and size of an applied display device and may be selected within a thickness range of 0.4 to 1.1 mm. For example, the substrate 55 may be provided in a thickness of 0.6 to 0.8 mm. The substrate 55 may comprise at least one material selected from materials including silicon, glass, polyimide, and plastic. The substrate 55 may comprise a flexible substrate The substrate 55 is a substrate to be used in a transfer process, and serves to support the thin film transistor 130. In addition, the thin film transistor substrate according to an embodiment may comprise a bonding layer 50 provided between the substrate 55 and the thin film transistor 130.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 µm as an example. A thickness of the bonding layer 50 may be different according to a type of a selected material and may be provided in a thickness of 1 to 3 µm. In addition, the bonding layer 50 may be provided in a thickness of 1.8 to 2.2 µm as an example.

The thin film transistor 30 according to an embodiment may comprise a source contact portion 31 disposed on the first region of the channel layer 60 and a drain contact portion 32 disposed on the second region of the channel layer 60. The source contact portion 31 may be disposed in contact with the first region of the channel layer 60. The drain contact portion 32 may be disposed in contact with the second region of the channel layer 60.

A thin film transistor 130 according to an embodiment may comprise a gate wiring 41 disposed on the first gate electrode 35. The gate wiring 41 may be electrically connected to the first gate electrode 35. A lower surface of the gate wiring 41 may be disposed in contact with an upper surface of the first gate electrode 35.

The source electrode 71 may be electrically connected to the source contact portion 31. The source electrode 71 may be disposed in contact with an upper surface of the source contact portion 31. For example, the source electrode 71 may be electrically connected to a first region of the channel layer 60 via the source contact portion 31. The drain electrode 72 may be electrically connected to the drain contact portion 32. The drain electrode 72 may be disposed in contact with an upper surface of the drain contact portion 32. For example, the drain electrode 72 may be electrically connected to a second region of the channel layer 60 via the drain contact portion 32.

The source contact portion 31 and the drain contact portion 32 may be provided with a material in ohmic contact with the channel layer 60. The source contact portion 31 and the drain contact portion 32 may comprise a material in ohmic contact with the second nitride semiconductor layer 62. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be provided in a thickness of 0.1 to 1 µm as an example. Since the source contact portion 31 and the drain contact portion 32 do not need to serve to spread a current as a layer for contacting with the channel layer 60, the source contact portion 31 and the drain contact portion 32 may be provided in a thickness of 1 µm or less.

The first gate electrode 35 may be provided with a material in ohmic contact with the depletion forming layer 15. For example, the first gate electrode 35 may be provided with a metallic material in ohmic contact with a p-type nitride layer. The first gate electrode 35 may comprise a single layer or multiple layers comprising at least one material selected from the group consisting of tungsten (W), tungsten silicon ($WSi_2$), titanium nitride (TiN), tantalum (Ta), tantalum nitride (TaN), palladium (Pd), nickel (Ni), and platinum (Pt). The first gate electrode 35 may be provided in a thickness of 0.1 to 1 μm as an example. Since the first gate electrode 35 does not need to serve to spread a current as a layer for contacting with the depletion forming layer 15, the first gate electrode 35 may be provided in a thickness of 1 μm or less.

The gate wiring 41 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41 may be provided in a thickness of 0.1 to 3 μm as an example. Since the gate wiring 41 serves to sequentially apply a voltage to a plurality of transistors, the gate wiring 41 may be provided to be thicker than a thickness of the gate electrode 33.

The source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 μm as an example. Since the source electrode 71 serves to sequentially apply a voltage to the plurality of transistors, the source electrode 71 may be provided to be thicker than a thickness of the source contact portion 31. Also, the drain electrode 72 may be provided to be thicker than a thickness of the drain contact portion 32.

The thin film transistor substrate according to an embodiment may comprise a first passivation film 21 disposed on the channel layer 60. The first passivation film 21 may be disposed on the second nitride semiconductor layer 62. A lower surface of the first passivation film 21 may be disposed in contact with an upper surface of the second nitride semiconductor layer 62. The first passivation film 21 may be disposed on the depletion forming layer 15. The first passivation film 21 may be disposed at a side surface of the depletion forming layer 15. The first passivation film 21 may be disposed so as to surround the side surface of the depletion forming layer 15.

According to an embodiment, the source contact portion 31 may be disposed to pass through the first passivation film 21. The source contact portion 31 may be disposed to be surrounded by the first passivation film 21. The source contact portion 31 may be disposed to pass through the first passivation film 21 and provided in contact with the first region of the channel layer 60. The drain contact portion 32 may be disposed to pass through the first passivation film 21. The drain contact portion 32 may be disposed to be surrounded by the first passivation film 21. The drain contact portion 32 may be disposed to pass through the first passivation film 21 and provided in contact with the second region of the channel layer 60.

The first passivation film 21 may be provided with an insulating material. The first passivation film 21 may comprise a single layer or multiple layers comprising at least one of a silicon-based oxide, a silicon-based nitride, a metal oxide comprising $Al_2O_3$, and an organic insulating material as an example.

According to an embodiment, a second passivation film 22 may be disposed on the substrate 55 and the first passivation film 21. The first gate electrode 35 may be disposed to pass through at least one of the first passivation film 21 and the second passivation film 22. For example, the first gate electrode 35 may be disposed to pass through the first passivation film 21 and the second passivation film 22. The first gate electrode 35 may pass through at least one of the first passivation film 21 and the second passivation film 22 and be disposed in contact with the depletion forming layer 15. For example, the first gate electrode 35 may pass through the first passivation film 21 and the second passivation film 22 and be disposed in contact with the depletion forming layer 15. The gate wiring 41 may be disposed on the second passivation film 22 and be electrically connected to the first gate electrode 35. The second passivation film 22 may be provided with an insulating material. The second passivation film 22 may comprise a single layer or multiple layers including at least one material of a silicon-based oxide, a silicon-based nitride, a metal oxide including $Al_2O_3$, and an organic insulating material as an example.

According to an embodiment, a third passivation film 23 may be disposed on the second passivation film 22. The third passivation film 23 may be disposed on the second passivation film 22 and the gate wiring 41. The gate wiring 41 may be disposed in contact with the first gate electrode 35 thereon and provided to be surrounded by the third passivation film 23.

The source electrode 71 may pass through the second passivation film 22 and the third passivation film 23 and be electrically connected to the source contact portion 31. The source electrode 71 may comprise a first region disposed on the third passivation film 23. The source electrode 71 may comprise a second region passing through the third passivation film 23 and the second passivation film 22. The drain electrode 72 may pass through the second passivation film 22 and the third passivation film 23 and be electrically connected to the drain contact portion 32. The drain electrode 72 may comprise a first region disposed on the third passivation film 23. The drain electrode 72 may comprise a second region passing through the third passivation film 23 and the second passivation film 22.

The second gate electrode 36 may be disposed under the channel layer 60. The second gate electrode 36 may be disposed under the first nitride semiconductor layer 61. A sixth passivation film 26 may be disposed under the second gate electrode 36 and the channel layer 60. The second gate electrode 36 may be disposed in contact with a lower surface of the channel layer 60. The second gate electrode 36 may be in Schottky contact with the first nitride semiconductor layer 61. The second gate electrode 36 may comprise a single layer or multiple layers including at least one material selected from the group consisting of nickel (Ni), platinum (Pt), gold (Au), and palladium (Pd), or an alloy thereof. For example, the Schottky contact may be implemented by plasma treatment of the channel layer 60.

The first gate electrode 35 and the second gate electrode 36 may be electrically connected as shown in FIG. 26. The thin film transistor 130 according to an embodiment may be disposed on the second passivation film 22, and comprise a gate connecting wiring 38 electrically connected to the first gate electrode 35 and disposed to be extending from the gate wiring 41. The gate connecting wiring 38 may be electrically connected to the second gate electrode 36 by passing through the second passivation film 22. For example, the first gate electrode 35 and the gate wiring 41 may be integrally formed in the same process. Further, the first gate electrode 35 and the gate wiring 41 may be separately formed in different processes and electrically connected to each other.

As shown in FIG. 26, the channel layer 60 and the depletion forming layer 15 may be formed at the same width. When the width of the depletion forming layer 15 is smaller than that of the channel layer 60, a leakage current may be generated. In other words, the length of the channel layer 60 and the length of the depletion forming layer 15 provided along the extending direction of the gate electrode 35 may be provided as the same.

The third passivation film 23 may comprise an insulating material. The third passivation film 23 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a fourth passivation film 24 disposed on the third passivation film 23. The fourth passivation film 24 may be disposed on the source electrode 71 and the drain electrode 72. The fourth passivation film 24 may be disposed on the first gate electrode 35. The fourth passivation film 24 may comprise a contact hole H3 provided on the drain electrode 72.

The fourth passivation film 24 may comprise a single layer or multiple layers comprising at least one material of a silicon-based oxide, a silicon-based nitride, a metal oxide comprising $Al_2O_3$, and an organic insulating material as an example.

According to an embodiment, the pixel electrode 80 may be disposed on the fourth passivation film 24. The pixel electrode 80 may be electrically connected to the drain electrode 72 via the contact hole H3 provided in the fourth passivation film 24. A lower surface of the pixel electrode 80 may be disposed in contact with an upper surface of the drain electrode 72.

The pixel electrode 80 may be provided with a transparent conductive material. The pixel electrode 80 may be provided with, for example, a transparent conductive oxide film. The pixel electrode 80 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The thin film transistor substrate according to an embodiment may comprise a black matrix 46 between the substrate 55 and the channel layer 60. The black matrix 46 may be disposed between the substrate 55 and the sixth passivation film 26. The black matrix 46 may be disposed between the substrate 55 and the second gate electrode 36. The black matrix 46 may be disposed in a shape corresponding to a shape of a lower portion of the sixth passivation film 26. A width of the channel layer 60 may be provided to be equal to a width of the black matrix 46. The black matrix 46 may be provided in a single layer or multiple layers including at least one material selected from among an Si-based material, a Ga-based material, an Al-based material, and an organic material. The black matrix 46 may block light incident on the thin film transistor 130. Accordingly, it is possible to prevent the thin film transistor 130 from deteriorating due to a photo current or the like.

According to an embodiment, the bonding layer 50 may be disposed between the substrate 55 and the channel layer 60. The bonding layer 50 may be disposed between the substrate 55 and the black matrix 46. For example, the bonding layer 50 may be disposed on an entire region of the substrate 55. The bonding layer 50 may be disposed in contact with the second passivation film 22. An upper surface of the bonding layer 50 and a lower surface of the second passivation film 22 may be disposed in contact with each other. For example, in a region where the black matrix 46 is not provided, the upper surface of the bonding layer 50 and the lower surface of the second passivation film 22 may be disposed in direct contact with each other.

In addition, according to an embodiment, a recess corresponding to a height and a width of the second gate electrode 36 may be provided on the substrate 55 or the bonding layer 50. A part of the sixth passivation film 26 may be disposed in at least a part of an upper portion and a side surface so as to correspond to a cross sectional shape of the second gate electrode 36, and provided in the recessed region. The black matrix 46 may be disposed in a shape corresponding to a shape of a lower portion of the sixth passivation film 26, and at least a part of the black matrix 46 may be disposed in the recessed region. At least a part of the second gate electrode 36 may be disposed in the recessed region. It is possible to minimize an increase in a thickness of the thin film transistor substrate according to providing the second gate electrode 36 with such a structure.

The thin film transistor substrate according to an embodiment may be bonded to a color filter substrate to provide a liquid crystal display panel. A liquid crystal layer may be provided between the thin film transistor substrate and the color filter substrate. A common electrode may be provided at the color filter substrate. An arrangement of the liquid crystal layer disposed between the common electrode and the pixel electrode provided on the thin film transistor substrate may be adjusted by a difference in voltage applied therebetween, and a light transmission amount of a corresponding pixel may be controlled. The liquid crystal display panel having such a structure may be referred to as a vertical electric field type liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 27:
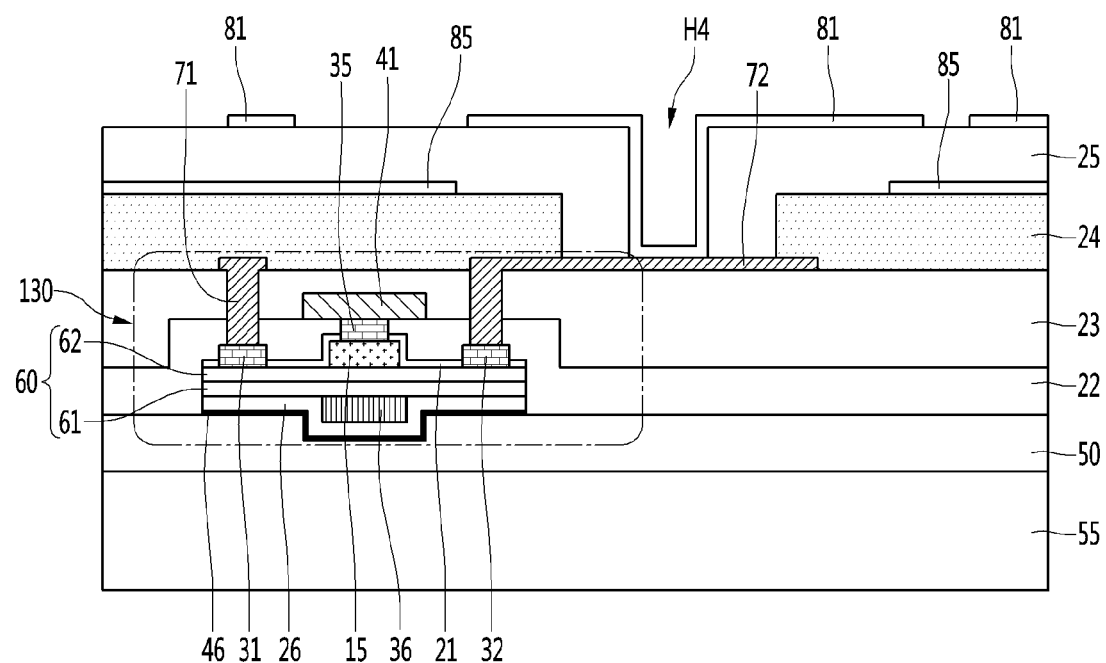
FIG. 27 is a view illustrating still another example of a thin film transistor substrate according to an embodiment of the present invention.

FIG. 27 is a view illustrating still another example of a thin film transistor substrate according to an embodiment of the present invention. The thin film transistor substrate shown in FIG. 27 is an embodiment in which a thin film transistor having a double gate structure is applied, and description of contents overlapping with those described with reference to FIGS. 1 to 26 may be omitted.

The thin film transistor substrate described with reference to FIGS. 25 and 26 may be applied to a vertical electric field type liquid crystal display panel. A pixel electrode 80 may be disposed on the thin film transistor substrate and a common electrode configured to form an electric field in a pixel along with the pixel electrode 80 may be provided at a separate color filter substrate, and thus a vertical electric field type liquid crystal display panel can be realized. Meanwhile, the thin film transistor substrate described with reference to FIG. 27 may be applied to a horizontal electric field type liquid crystal display panel.

As shown in FIG. 27, the thin film transistor substrate according to an embodiment may comprise a pixel electrode 81, a common electrode 85, and a fifth passivation film 25.

The common electrode 85 may be disposed on a fourth passivation film 24. The fifth passivation film 25 may be disposed on the fourth passivation film 24. The fifth passivation film 25 may be disposed on the common electrode 85 and the fourth passivation film 24. The common electrode 85 may be disposed between the fourth passivation film 24 and the fifth passivation film 25. In addition, the fifth passivation film 25 may be provided on a drain electrode 72 exposed through the fourth passivation film 24. The pixel electrode 81 may be disposed on the fifth passivation film 25. A partial region of the pixel electrode 81 may be electrically connected to the drain electrode 72 through a fourth contact hole H4 provided in the fifth passivation film 25. A partial region of the pixel electrode 81 may be disposed in contact with the upper surface of the drain electrode 72 through the fourth contact hole H4. The pixel electrode 81 may be disposed in contact with the upper surface of the drain electrode 72 by passing through the fourth passivation film 24 and the fifth passivation film 25. A partial region of the pixel electrode 81 and a partial region of the common electrode 85 may be overlapped with each other in a vertical direction.

The thin film transistor substrate according to an embodiment may comprise a plurality of thin film transistors 130 disposed in a region in which a gate wiring 41 and a data wiring 73 intersect with each other. The pixel electrode 81 may be disposed at a region that is defined by the gate wiring 41 and the data wiring 73. The pixel electrode 81 may comprise a portion extending in a finger shape. A partial region of the pixel electrode 81 may be disposed and overlapped with the gate wiring 41.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 81 may be provided with a transparent conductive material. The pixel electrode 81 may be provided with, for example, a transparent conductive oxide film. The pixel electrode 81 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The fifth passivation film 25 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may be bonded to a color filter substrate to provide a liquid crystal display panel. A liquid crystal layer may be provided between the thin film transistor substrate and the color filter substrate. In the thin film transistor substrate according to an embodiment, an arrangement of the liquid crystal layer may be adjusted by a difference in voltage applied between the common electrode 85 and the pixel electrode 81, and a light transmission amount of a corresponding pixel may be controlled. The liquid crystal display panel having such a structure may be referred to as a horizontal electric field type liquid crystal display panel, a transverse electric field type liquid crystal display panel, or an In Plane Switching (IPS) liquid crystal display panel. Since the liquid crystal display panel itself has no light source, a display device may be implemented by providing a light unit that supplies light to the liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 28:
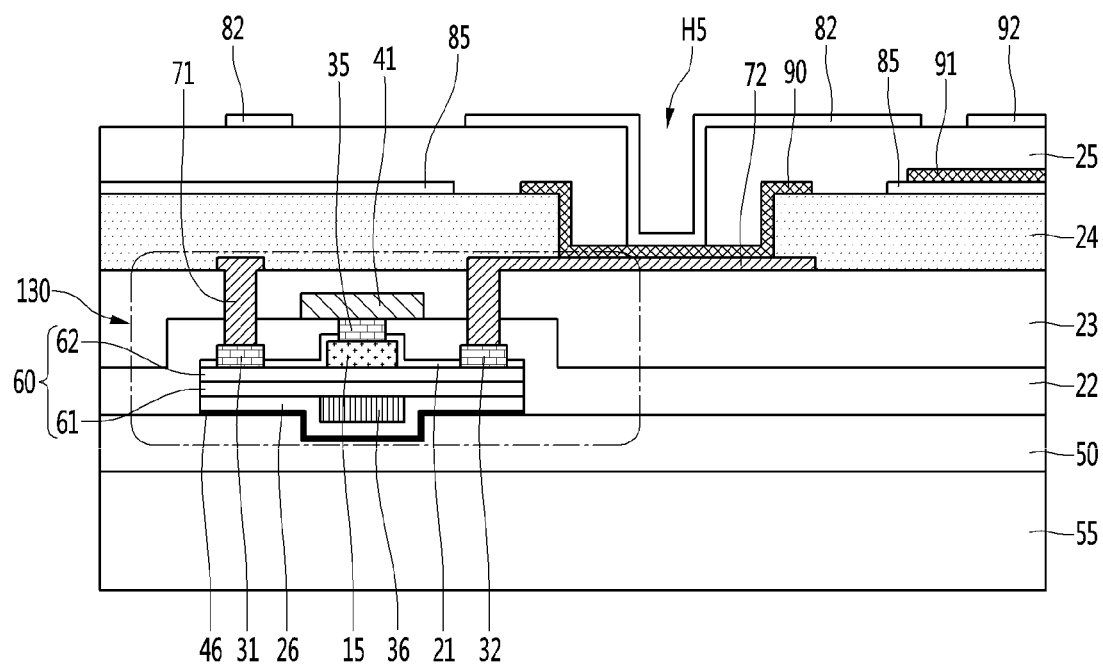
FIG. 28 is a view illustrating still another example of a thin film transistor substrate according to an embodiment of the present invention.

FIG. 28 is a view illustrating still another example of a thin film transistor substrate according to an embodiment of the present invention. The thin film transistor substrate shown in FIG. 28 is an embodiment to which a thin film transistor having a double gate structure is applied, and description of a part overlapping with those described with reference to FIGS. 1 to 27 may be omitted.

The thin film transistor substrate according to an embodiment may comprise a pixel electrode 82, a common electrode 85, a metal layer 90, a touch panel lower electrode 91, and a touch panel upper electrode 92.

The common electrode 85 may be disposed on a fourth passivation film 24. The pixel electrode 82 may be disposed on a fifth passivation film 25. The pixel electrode 82 may be electrically connected to a drain electrode 72. The metal layer 90 may be provided between the pixel electrode 82 and the drain electrode 72. The metal layer 90 may be disposed in contact with the drain electrode 72 exposed through the fourth passivation film 24. A partial region of the pixel electrode 82 may be electrically connected to the drain electrode 72 through the metal layer 90 through a fifth contact hole H5 provided in the fifth passivation film 25.

According to an embodiment, the touch panel upper electrode 92 may be provided on the fifth passivation film 25 and the touch panel lower electrode 91 may be disposed below the touch panel upper electrode 92. The touch panel lower electrode 91 may be disposed on the fourth passivation film 24 and may be electrically connected to the common electrode 85. The touch panel lower electrode 91 may be disposed between the common electrode 85 and the fifth passivation film 25. The touch panel upper electrode 92 may be disposed to be overlapped with the touch panel lower electrode 91 in a vertical direction.

The touch panel upper electrode 92 and the touch panel lower electrode 91 may form an in-cell touch panel provided in the display panel. Accordingly, the thin film transistor substrate according to an embodiment may detect a contact of the display panel from outside by using the in-cell touch panel.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 82 may be provided with a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The touch panel lower electrode 91 and the touch panel upper electrode 92 may be formed of a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The in-cell touch panel-integrated thin film transistor substrate according to an embodiment may be bonded to a color filter substrate to provide a liquid crystal display panel. A liquid crystal layer may be provided between the in-cell touch panel-integrated thin film transistor substrate and the color filter substrate. In the in-cell touch panel-integrated thin film transistor substrate according to an embodiment, an arrangement of the liquid crystal layer may be adjusted by a difference in voltage applied between the common electrode 85 and the pixel electrode 82, and a light transmission amount of a corresponding pixel may be controlled. The in-cell touch panel-integrated liquid crystal display panel having such a structure may be referred to as a horizontal electric field type liquid crystal display panel, a transverse electric field type liquid crystal display panel, or an In Plane Switching (IPS) liquid crystal display panel. Since the in-cell touch panel-integrated liquid crystal display panel itself has no light source, a display device may be implemented by providing a light unit that supplies light to the in-cell touch panel-integrated liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 29:
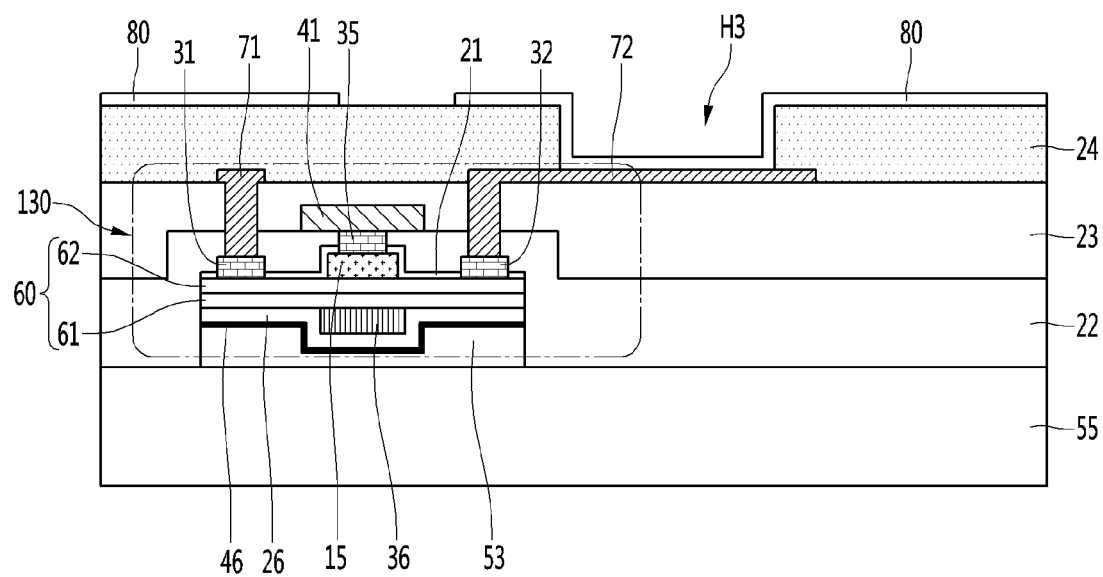
FIG. 29 is a view illustrating still another example of a thin film transistor substrate according to an embodiment of the present invention.
Figure 30:
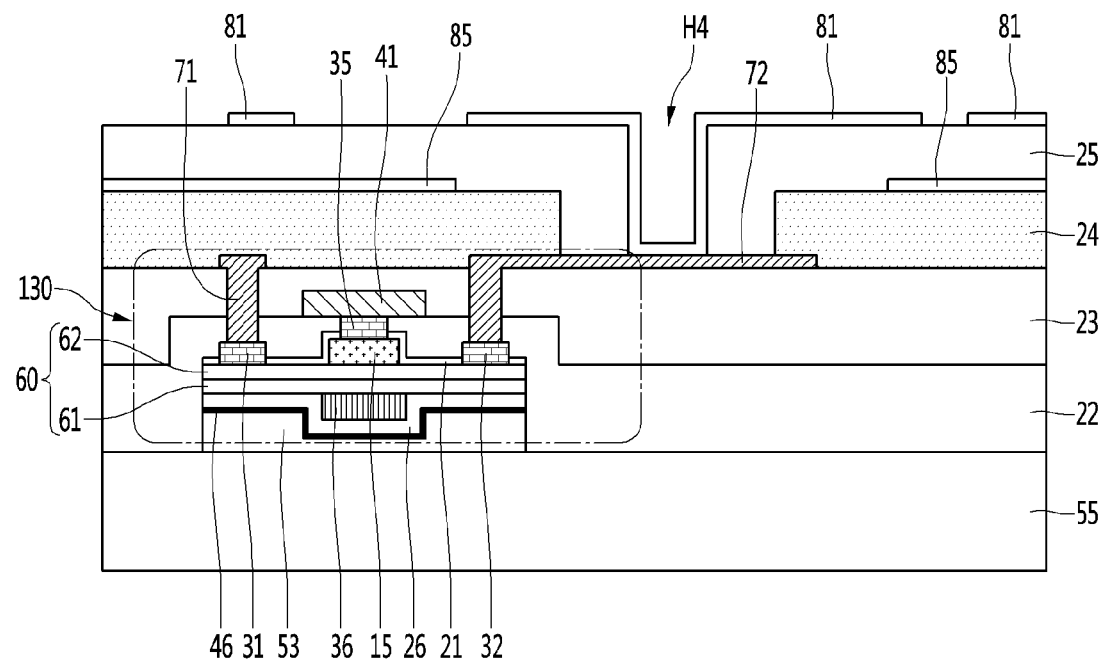
FIG. 30 is a view illustrating still another example of a thin film transistor substrate according to an embodiment of the present invention.
Figure 31:
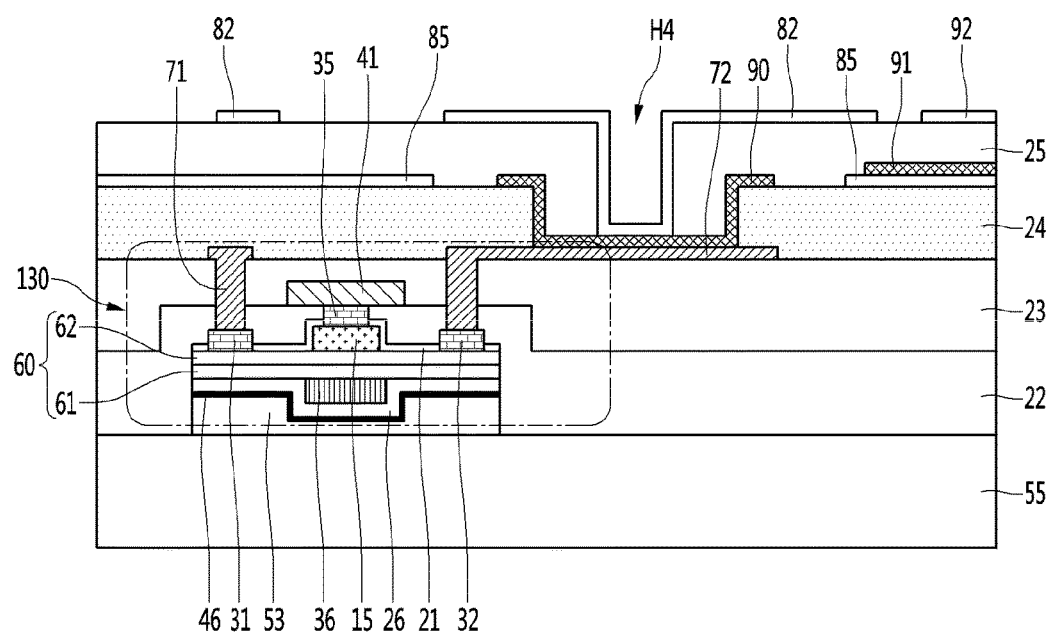
FIG. 31 is a view illustrating still another example of a thin film transistor substrate according to an embodiment of the present invention.

FIGS. 29 to 31 are views illustrating still another example of a thin film transistor substrate according to an embodiment of the present invention. Referring to FIGS. 29 to 31, in the description of the thin film transistor substrate according to an embodiment, description of contents overlapping with those described with reference to FIGS. 1 to 28 may be omitted. An embodiment shown in FIGS. 29 to 31 differs from that of each of FIGS. 19, 20, and 20 in the bonding layer structure.

As shown in FIGS. 29 to 31, a bonding layer 53 may be provided on the substrate 55. The bonding layer 53 may be disposed between the substrate 55 and the black matrix 46. For example, a width of the bonding layer 53 may be provided to be equal to a width of the black matrix 46. For example, the width of the bonding layer 53 may be provided to be equal to a width of the channel layer 60.

According to an embodiment, a second passivation film 22 may be disposed on the substrate 55. A lower surface of the second passivation film 22 may be disposed in contact with an upper surface of the substrate 55. In a region where the bonding layer 50 is not provided, the second passivation film 22 may be disposed in direct contact with the substrate 55.

In addition, according to an embodiment, a recess corresponding to a height and a width of the second gate electrode 36 may be provided on the bonding layer 50. A part of the sixth passivation film 26 may be disposed in at least a part of an upper portion and a side surface so as to correspond to a cross sectional shape of the second gate electrode 36, and provided in the recessed region. The black matrix 46 may be disposed in a shape corresponding to a shape of a lower portion of the sixth passivation film 26, and at least a part of the black matrix 46 may be disposed in the recessed region. At least a part of the second gate electrode 36 may be disposed in the recessed region. It is possible to minimize an increase in a thickness of the thin film transistor substrate according to providing the second gate electrode 36 with such a structure.

As described above, according to the embodiment shown in FIGS. 29 to 31, as compared with the embodiment shown in FIGS. 19, 20, and 21, since the second passivation film 22 and the substrate 55 may be disposed in direct contact with each other, a layer provided between the second passivation film 22 and the substrate 55 (for example, an illustrated bonding layer in FIGS. 19, 20, and 21) may be eliminated. Accordingly, according to the embodiment, since an interface between different material layers is reduced on a light path where light travels, light loss due to reflection/refraction at the interface may be reduced.

The bonding layer 53 according to an embodiment may comprise at least one of a reflective layer, a metal bonding layer, and an insulating layer as an example. The reflective layer may be disposed on the substrate 55, the metal bonding layer may be disposed on the reflective layer, and the insulating layer may be disposed on the metal bonding layer. For example, the bonding layer 53 may comprise the metal bonding layer, and the reflective layer and the insulating layer may be comprised selectively.

The insulating layer may complement the leakage characteristics of the channel layer 60. For example, the insulating layer may comprise a single layer or multiple layers including at least one material of a silicon-based oxide, a silicon-based nitride, a metal oxide including $Al_2O_3$, and an organic insulating material as an example.

The metal bonding layer may be provided for bonding with the substrate 55 disposed thereunder. For example, the metal bonding layer may comprise at least one material selected from the group consisting of gold (Au), tin (Sn), indium (In), nickel (Ni), silver (Ag), and copper (Cu), or an alloy thereof.

The reflective layer may reduce light absorption in the bonding layer. For example, the reflective layer may comprise at least one material selected from the group consisting of aluminum (Al), silver (Ag), and rhodium (Rh), or an alloy thereof. The reflective layer may be provided with a material having a reflection characteristic of more than 60% as an example.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 32:
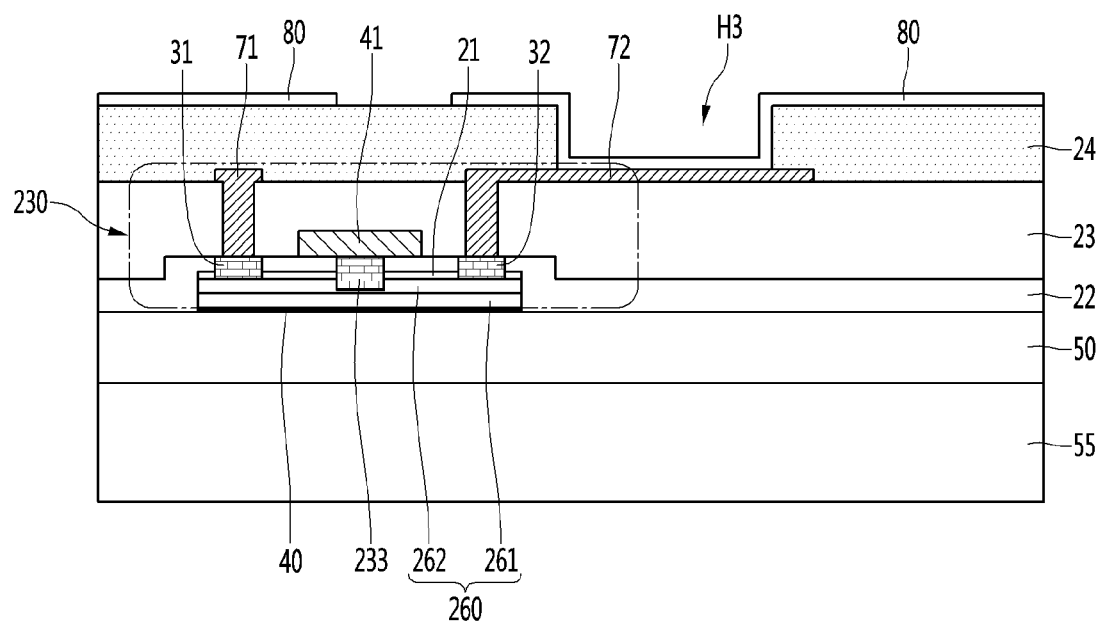
FIG. 32 is a view illustrating still another example of a thin film transistor substrate according to an embodiment of the present invention.

FIG. 32 is a view illustrating still another example of a thin film transistor substrate according to an embodiment of the present invention. The thin film transistor substrate shown in FIG. 32 is an embodiment to which a thin film transistor having a structure in which gates are disposed in a recessed region of a channel layer is applied, and description of contents overlapping with those described with reference to FIGS. 1 to 31 may be omitted.

As shown in FIG. 32, the thin film transistor substrate according to an embodiment of the present invention may comprise a substrate 55, a thin film transistor 230 disposed on the substrate 55, and a pixel electrode 80 electrically connected to the thin film transistor 230.

The thin film transistor 230 according to an embodiment may comprise a gate electrode 233, a channel layer 260, a source electrode 71, and a drain electrode 72. The source electrode 71 may be electrically connected to a first region of the channel layer 260. The source electrode 71 may be electrically connected to an upper surface of the channel layer 260. The drain electrode 72 may be electrically connected to a second region of the channel layer 260. The drain electrode 72 may be electrically connected to the upper surface of the channel layer 260. The gate electrode 233 may be disposed on the channel layer 260.

The channel layer 260 may comprise a recessed region recessed in a downward direction in the upper surface thereof. The gate electrode 233 may be disposed in the recessed region of the channel layer 260.

The channel layer 260 may be provided with, for example, a Group III-V compound semiconductor. For example, the channel layer 260 may be provided with a semiconductor material having an empirical formula of $In_xAl_yGa_{1-x-y}N$ ($0 \geq x \geq 1$, $0 \leq y \geq 1$, $0 \geq x+y \geq 1$). The channel layer 260 may comprise a single layer or multiple layers selected from, for example, GaN, AlN, AlGaN, InGaN, InN, InAlGaN, AlInN, AlGaAs, GaP, GaAs, GaAsP, AlGaInP and so on.

The channel layer 260 may comprise a first nitride semiconductor layer 261 and a second nitride semiconductor layer 262. The first nitride semiconductor layer 261 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layer 262 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). A recessed region recessed downwardly may be provided at an upper surface of the second nitride semiconductor layer 262. The gate electrode 233 may be disposed in the recessed region of the second nitride semiconductor layer 262. An upper surface of the gate electrode 233 may be disposed higher than the lowest surface of the second nitride semiconductor layer 262. The gate electrode 233 and the second nitride semiconductor layer 262 may be in Schottky contact with each other.

According to the channel layer 260 according to an embodiment, the first nitride semiconductor layer 261 may comprise a GaN semiconductor layer, and the second nitride semiconductor layer 262 may comprise an AlGaN semiconductor layer.

The substrate 55 may comprise a transparent substrate. The substrate 55 may be provided with a transparent substrate having a thickness of 0.1 mm to 3 mm as an example. In addition, the thickness of the substrate 55 may be changed according to application and size of an applied display device and may be selected within a thickness range of 0.4 to 1.1 mm. For example, the substrate 55 may be provided in a thickness of 0.6 to 0.8 mm. The substrate 55 may comprise at least one material selected from materials including silicon, glass, polyimide, and plastic. The substrate 55 may comprise a flexible substrate.

The substrate 55 is a substrate to be used in a transfer process, and serves to support the thin film transistor 230. In addition, the thin film transistor substrate according to an embodiment may comprise a bonding layer 50 provided between the substrate 55 and the thin film transistor 230.

The bonding layer 50 may comprise an organic material. The bonding layer 50 may be provided with a transparent material. The bonding layer 50 may be provided with, for example, a material having a transmittance of 70% or more. The bonding layer 50 may comprise an organic insulating material. The bonding layer 50 may comprise at least one material selected from the group consisting of acryl, benzocyclobutene (BCB), SU-8 polymer, and the like. The bonding layer 50 may be provided in a thickness of 0.5 to 6 µm as an example. A thickness of the bonding layer 50 may be different according to a type of a selected material and may be provided in a thickness of 1 to 3 µm. In addition, the bonding layer 50 may be provided in a thickness of 1.8 to 2.2 µm as an example.

The thin film transistor 230 according to an embodiment may comprise a source contact portion 31 disposed on the first region of the channel layer 60 and a drain contact portion 32 disposed on the second region of the channel layer 60. The source contact portion 31 may be disposed in contact with the first region of the channel layer 60. The drain contact portion 32 may be disposed in contact with the second region of the channel layer 260.

A thin film transistor 230 according to an embodiment may comprise a gate wiring 41 disposed on the gate electrode 233. The gate wiring 41 may be electrically connected to the gate electrode 233. A lower surface of the gate wiring 41 may be disposed in contact with an upper surface of the gate electrode 233.

The source electrode 71 may be electrically connected to the source contact portion 31. The source electrode 71 may be disposed in contact with an upper surface of the source contact portion 31. For example, the source electrode 71 may be electrically connected to a first region of the channel layer 260 via the source contact portion 31. The drain electrode 72 may be electrically connected to the drain contact portion 32. The drain electrode 72 may be disposed in contact with an upper surface of the drain contact portion 32. For example, the drain electrode 72 may be electrically connected to a second region of the channel layer 260 via the drain contact portion 32.

The source contact portion 31 and the drain contact portion 32 may be provided with a material in ohmic contact with the channel layer 260. The source contact portion 31 and the drain contact portion 32 may comprise a material in ohmic contact with the second nitride semiconductor layer 262. For example, the source contact portion 31 and the drain contact portion 32 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source contact portion 31 and the drain contact portion 32 may be provided in a thickness of 0.1 to 1 µm as an example. Since the source contact portion 31 and the drain contact portion 32 do not need to serve to spread a current as a layer for contacting with the channel layer 260, the source contact portion 31 and the drain contact portion 32 may be provided in a thickness of 1 µm or less.

The gate electrode 233 may be provided as a material in Schottky contact with the channel layer 260. The gate electrode 233 may be provided with a material which is in a Schottky contact with the second nitride semiconductor layer 262. The gate electrode 233 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the channel layer 260. In the plasma treatment, for example, fluorine (F) ion treatment may be applied. Accordingly, the thin film transistor 230 according to an embodiment may be provided with a threshold voltage by the Schottky contact and may have a normally off characteristic. When a voltage equal to or higher than the threshold voltage is applied to the gate electrode 233, a channel formed under the gate electrode 233 is turned on to allow a current to flow the channel layer 260.

Meanwhile, according to the channel layer 260 according to an embodiment, the first nitride semiconductor layer 261 may comprise a GaN semiconductor layer, and the second nitride semiconductor layer 262 may comprise an AlGaN semiconductor layer. As a thickness of the second nitride semiconductor layer 262 is larger, the two-dimensional electron gas (2 DEG) is well formed, and thus it is difficult to make a normally off characteristic. In addition, when the thickness of the second nitride semiconductor layer 262 is too thin, there is a problem that gate leakage may be increased. Accordingly, it may be desirable that the thickness of the second nitride semiconductor layer 262 disposed under the recessed region is provided in a thickness of 2 to 10 nm. In addition, as a method for reducing gate leakage, an insulator may be disposed between the gate electrode 233 and the second nitride semiconductor layer 262 to be provided in a Metal-Insulator-Semiconductor (MIS) structure. For example, the second nitride semiconductor layer 262 in a region where the recess is not formed may be provided in a thickness of 15 to 25 nm. In addition, the recess may be provided in a width of 1.5 to 2.5 µm as an example.

The gate wiring 41 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The gate wiring 41 may be provided in a thickness of 0.1 to 3 μm as an example. Since the gate wiring 41 serves to sequentially apply a voltage to a plurality of transistors, the gate wiring 41 may be provided to be thicker than a thickness of the gate electrode 33.

The source electrode 71 and the drain electrode 72 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The source electrode 71 and the drain electrode 72 may be provided in a thickness of 0.1 to 3 μm as an example. Since the source electrode 71 serves to sequentially apply a voltage to the plurality of transistors, the source electrode 71 may be provided to be thicker than a thickness of the source contact portion 31. Also, the drain electrode 72 may be provided to be thicker than a thickness of the drain contact portion 32.

The thin film transistor substrate according to an embodiment may comprise a first passivation film 21 disposed on the channel layer 260. The first passivation film 21 may be disposed on the second nitride semiconductor layer 262. A lower surface of the first passivation film 21 may be disposed in contact with an upper surface of the second nitride semiconductor layer 262.

According to an embodiment, the source contact portion 31 may be disposed to pass through the first passivation film 21. The source contact portion 31 may be disposed to be surrounded by the first passivation film 21. The source contact portion 31 may be disposed to pass through the first passivation film 21 and provided in contact with the first region of the channel layer 260. The drain contact portion 32 may be disposed to pass through the first passivation film 21. The drain contact portion 32 may be disposed to be surrounded by the first passivation film 21. The drain contact portion 32 may be disposed to pass through the first passivation film 21 and provided in contact with the second region of the channel layer 260.

The first passivation film 21 may be provided with an insulating material. The first passivation film 21 may comprise a single layer or multiple layers comprising at least one of a silicon-based oxide, a silicon-based nitride, a metal oxide comprising $Al_2O_3$, and an organic insulating material as an example.

According to an embodiment, a second passivation film 22 may be disposed on the substrate 55 and the first passivation film 21. The gate electrode 233 may be disposed to pass through at least one of the first passivation film 21 and the second passivation film 22. For example, the gate electrode 233 may be disposed to pass through the first passivation film 21 and the second passivation film 22. The gate electrode 233 may pass through at least one of the first passivation film 21 and the second passivation film 22 and be disposed in contact with the channel layer 260. For example, the gate electrode 233 may pass through the first passivation film 21 and the second passivation film 22 and be disposed in contact with the channel layer 260. The gate wiring 41 may be disposed on the second passivation film 22 and be electrically connected to the gate electrode 233.

The second passivation film 22 may be provided with an insulating material. The second passivation film 22 may comprise a single layer or multiple layers including at least one material of a silicon-based oxide, a silicon-based nitride, a metal oxide including $Al_2O_3$, and an organic insulating material as an example.

According to an embodiment, a third passivation film 23 may be disposed on the second passivation film 22. The third passivation film 23 may be disposed on the second passivation film 22 and the gate wiring 41. The gate wiring 41 may be disposed in contact with the gate electrode 233 thereon and provided to be surrounded by the third passivation film 23.

The source electrode 71 may pass through the second passivation film 22 and the third passivation film 23 and be electrically connected to the source contact portion 31. The source electrode 71 may comprise a first region disposed on the third passivation film 23. The source electrode 71 may comprise a second region passing through the third passivation film 23 and the second passivation film 22. The drain electrode 72 may pass through the second passivation film 22 and the third passivation film 23 and be electrically connected to the drain contact portion 32. The drain electrode 72 may comprise a first region disposed on the third passivation film 23. The drain electrode 72 may comprise a second region passing through the third passivation film 23 and the second passivation film 22.

The third passivation film 23 may comprise an insulating material. The third passivation film 23 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a fourth passivation film 24 disposed on the third passivation film 23. The fourth passivation film 24 may be disposed on the source electrode 71 and the drain electrode 72. The fourth passivation film 24 may comprise a contact hole H3 provided on the drain electrode 72.

The fourth passivation film 24 may comprise a single layer or multiple layers comprising at least one material of a silicon-based oxide, a silicon-based nitride, a metal oxide comprising $Al_2O_3$, and an organic insulating material as an example.

According to an embodiment, the pixel electrode 80 may be disposed on the fourth passivation film 24. The pixel electrode 80 may be electrically connected to the drain electrode 72 via the contact hole H3 provided in the fourth passivation film 24. A lower surface of the pixel electrode 80 may be disposed in contact with an upper surface of the drain electrode 72.

The pixel electrode 80 may be provided with a transparent conductive material. The pixel electrode 80 may be provided with, for example, a transparent conductive oxide film. The pixel electrode 80 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The thin film transistor substrate according to an embodiment may comprise a black matrix 40 between the substrate 55 and the channel layer 260. A width of the channel layer 260 may be provided to be equal to a width of the black matrix 40. The black matrix 40 may be provided in a single layer or multiple layers including at least one material selected from among a Si-based material, a Ga-based material, an Al-based material, and an organic material. The black matrix 40 may block light incident on the thin film transistor 230. Accordingly, it is possible to prevent the thin film transistor 230 from deteriorating due to a photo current or the like.

According to an embodiment, the bonding layer 50 may be disposed between the substrate 55 and the channel layer 260. The bonding layer 50 may be disposed between the substrate 55 and the black matrix 40. For example, the bonding layer 50 may be disposed on an entire region of the substrate 55.

The thin film transistor substrate according to an embodiment may be bonded to a color filter substrate to provide a liquid crystal display panel. A liquid crystal layer may be provided between the thin film transistor substrate and the color filter substrate. A common electrode may be provided at the color filter substrate, and an arrangement of the liquid crystal layer disposed between the common electrode and the pixel electrode provided on the thin film transistor substrate may be controlled by a difference in voltage applied therebetween, and a light transmission amount of a corresponding pixel may be controlled. The liquid crystal display panel having such a structure may be referred to as a vertical electric field type liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 33:
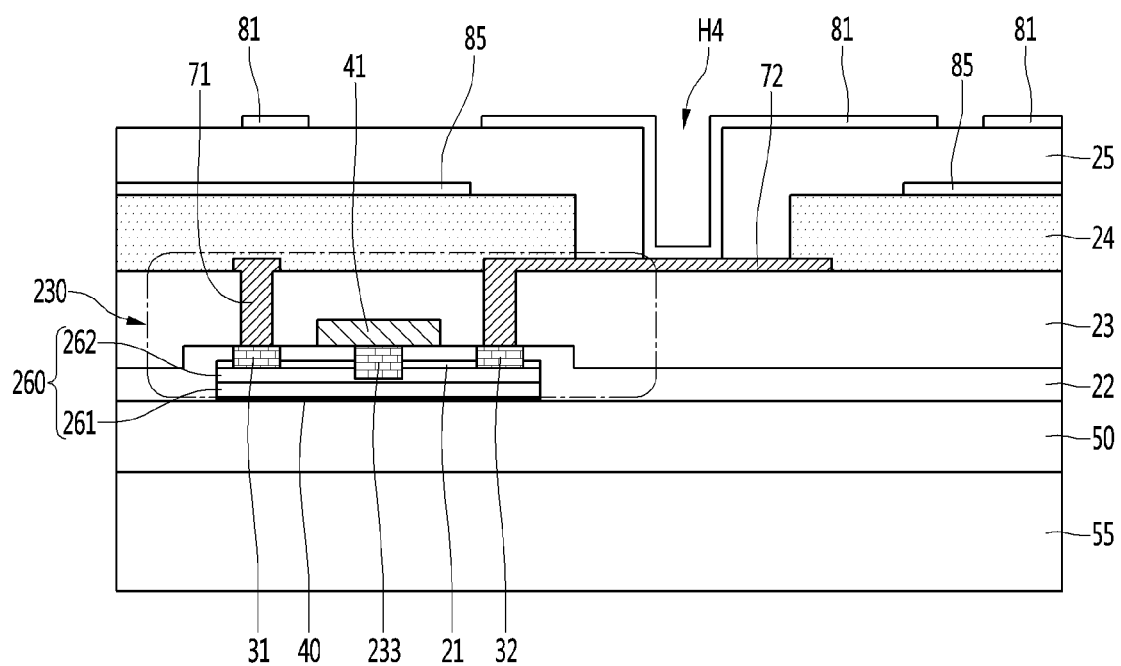
FIG. 33 is a view illustrating still another example of a thin film transistor substrate according to an embodiment of the present invention.

FIG. 33 is a view illustrating still another example of a thin film transistor substrate according to an embodiment of the present invention. The thin film transistor substrate shown in FIG. 33 is an embodiment to which a thin film transistor having a structure in which gates are disposed in a recessed region of a channel layer is applied, and description of contents overlapping with those described with reference to FIGS. 1 to 32 may be omitted.

The thin film transistor substrate described with reference to FIG. 32 may be applied to a vertical electric field type liquid crystal display panel. Meanwhile, the thin film transistor substrate described with reference to FIG. 33 may be applied to a horizontal electric field type liquid crystal display panel.

As shown in FIG. 33, the thin film transistor substrate according to an embodiment may comprise a pixel electrode 81, a common electrode 85, and a fifth passivation film 25.

The common electrode 85 may be disposed on a fourth passivation film 24. The fifth passivation film 25 may be disposed on the fourth passivation film 24. The fifth passivation film 25 may be disposed on the common electrode 85 and the fourth passivation film 24. The common electrode 85 may be disposed between the fourth passivation film 24 and the fifth passivation film 25. In addition, the fifth passivation film 25 may be provided on a drain electrode 72 exposed through the fourth passivation film 24. The pixel electrode 81 may be disposed on the fifth passivation film 25. A partial region of the pixel electrode 81 may be electrically connected to the drain electrode 72 through a fourth contact hole H4 provided in the fifth passivation film 25. A partial region of the pixel electrode 81 may be disposed in contact with the upper surface of the drain electrode 72 through the fourth contact hole H4. The pixel electrode 81 may be disposed in contact with the upper surface of the drain electrode 72 by passing through the fourth passivation film 24 and the fifth passivation film 25. A partial region of the pixel electrode 81 and a partial region of the common electrode 85 may be overlapped with each other in a vertical direction.

The thin film transistor substrate according to an embodiment may comprise a plurality of thin film transistors 230 disposed in a region in which a gate wiring 41 and a data wiring 73 intersect with each other. The pixel electrode 81 may be disposed at a region that is defined by the gate wiring 41 and the data wiring 73. The pixel electrode 81 may comprise a portion extending in a finger shape. A partial region of the pixel electrode 81 may be disposed and overlapped with the gate wiring 41.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 81 may be provided with a transparent conductive material. The pixel electrode 81 may be provided with, for example, a transparent conductive oxide film. The pixel electrode 81 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The fifth passivation film 25 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may be bonded to a color filter substrate to provide a liquid crystal display panel. A liquid crystal layer may be provided between the thin film transistor substrate and the color filter substrate. In the thin film transistor substrate according to an embodiment, an arrangement of the liquid crystal layer may be adjusted by a difference in voltage applied between the common electrode 85 and the pixel electrode 81, and a light transmission amount of a corresponding pixel may be controlled. The liquid crystal display panel having such a structure may be referred to as a horizontal electric field type liquid crystal display panel, a transverse electric field type liquid crystal display panel, or an In Plane Switching (IPS) liquid crystal display panel. Since the liquid crystal display panel itself has no light source, a display device may be implemented by providing a light unit that supplies light to the liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 34:
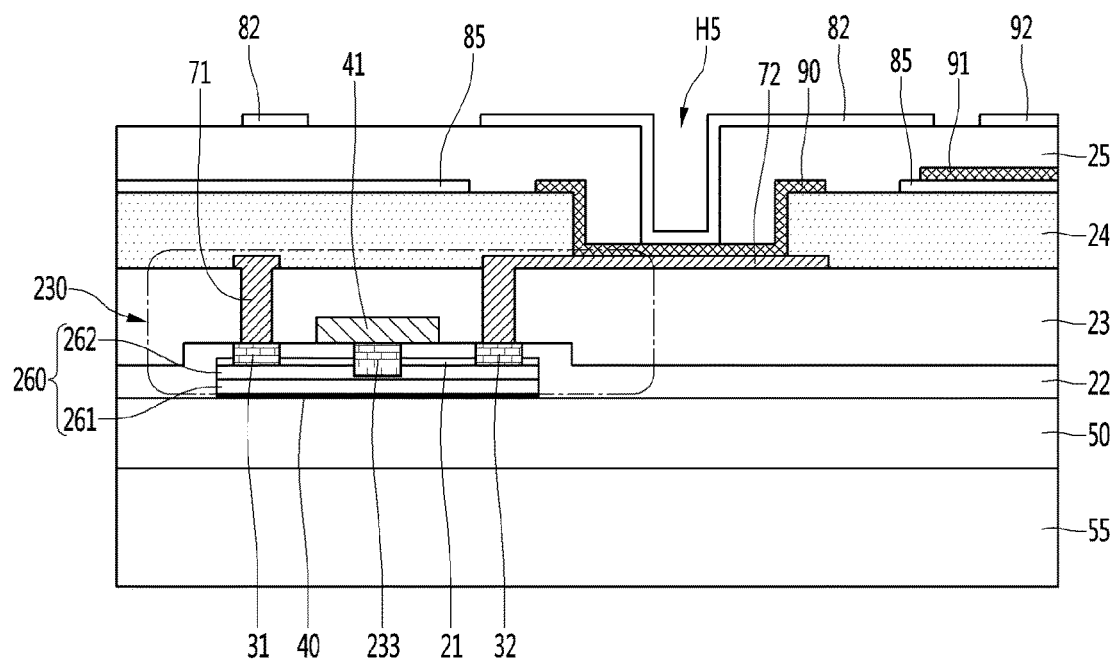
FIG. 34 is a view illustrating still another example of a thin film transistor substrate according to an embodiment of the present invention.

FIG. 34 is a view illustrating still another example of a thin film transistor substrate according to an embodiment of the present invention. The thin film transistor substrate shown in FIG. 34 is an embodiment to which a thin film transistor having a structure in which gates are disposed in a recessed region of a channel layer is applied, and description of contents overlapping with those described with reference to FIGS. 1 to 33 may be omitted.

The thin film transistor substrate according to an embodiment may comprise a pixel electrode 82, a common electrode 85, a metal layer 90, a touch panel lower electrode 91, and a touch panel upper electrode 92.

The common electrode 85 may be disposed on a fourth passivation film 24. The pixel electrode 82 may be disposed on a fifth passivation film 25. The pixel electrode 82 may be electrically connected to a drain electrode 72. The metal layer 90 may be provided between the pixel electrode 82 and the drain electrode 72. The metal layer 90 may be disposed in contact with the drain electrode 72 exposed through the fourth passivation film 24. A partial region of the pixel electrode 82 may be electrically connected to the drain electrode 72 through the metal layer 90 through a fifth contact hole H5 provided in the fifth passivation film 25.

According to an embodiment, the touch panel upper electrode 92 may be provided on the fifth passivation film 25 and the touch panel lower electrode 91 may be disposed below the touch panel upper electrode 92. The touch panel lower electrode 91 may be disposed on the fourth passivation film 24 and may be electrically connected to the common electrode 85. The touch panel lower electrode 91 may be disposed between the common electrode 85 and the fifth passivation film 25. The touch panel upper electrode 92 may be disposed to be overlapped with the touch panel lower electrode 91 in a vertical direction.

The touch panel upper electrode 92 and the touch panel lower electrode 91 may form an in-cell touch panel provided in the display panel. Accordingly, the thin film transistor substrate according to an embodiment may detect a contact of the display panel from outside by using the in-cell touch panel.

The common electrode 85 may be provided with a transparent conductive material. The common electrode 85 may be provided with, for example, a transparent conductive oxide film. The common electrode 85 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The pixel electrode 82 may be provided with a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The touch panel lower electrode 91 and the touch panel upper electrode 92 may be formed of a transparent conductive material. The pixel electrode 82 may be provided with, for example, a transparent conductive oxide film. The pixel electrode 82 may comprise at least one material selected from among indium tin oxide (ITO), indium zinc oxide (IZO), aluminum zinc oxide (AZO), aluminum gallium zinc oxide (AGZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), and IZO nitride (IZON).

The in-cell touch panel-integrated thin film transistor substrate according to an embodiment may be bonded to a color filter substrate to provide a liquid crystal display panel. A liquid crystal layer may be provided between the in-cell touch panel-integrated thin film transistor substrate and the color filter substrate. In the in-cell touch panel-integrated thin film transistor substrate according to an embodiment, an arrangement of the liquid crystal layer may be adjusted by a difference in voltage applied between the common electrode 85 and the pixel electrode 82, and a light transmission amount of a corresponding pixel may be controlled. The in-cell touch panel-integrated liquid crystal display panel having such a structure may be referred to as a horizontal electric field type liquid crystal display panel, a transverse electric field type liquid crystal display panel, or an In Plane Switching (IPS) liquid crystal display panel. Since the in-cell touch panel-integrated liquid crystal display panel itself has no light source, a display device may be implemented by providing a light unit that supplies light to the in-cell touch panel-integrated liquid crystal display panel.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 35:
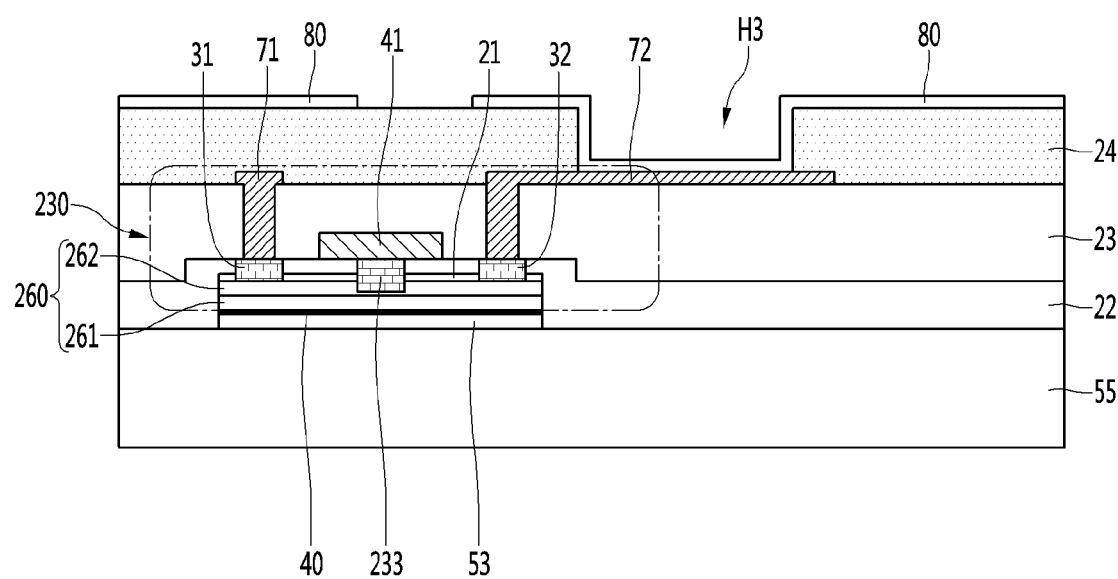
FIG. 35 is a view illustrating still another example of a thin film transistor substrate according to an embodiment of the present invention.
Figure 36:
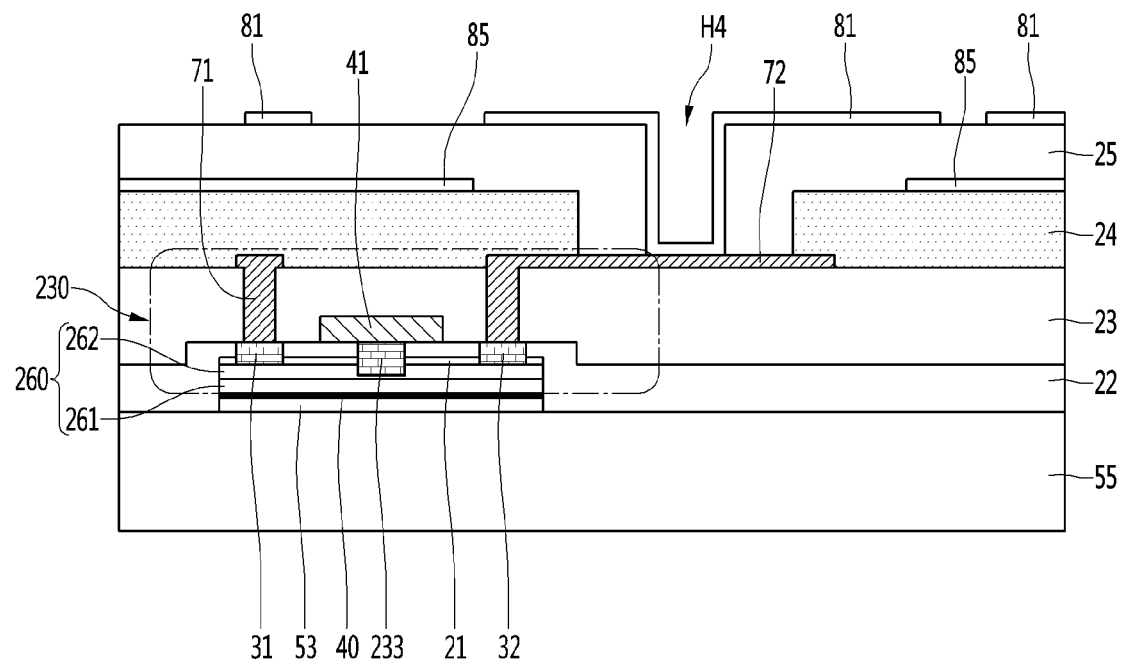
FIG. 36 is a view illustrating still another example of a thin film transistor substrate according to an embodiment of the present invention.
Figure 37:
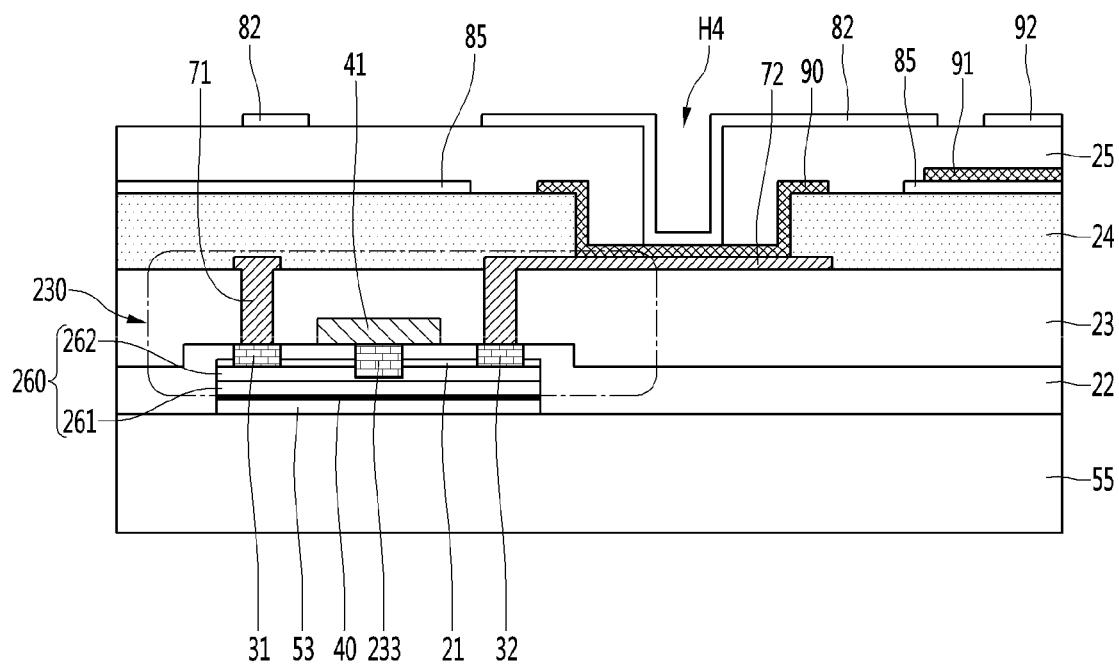
FIG. 37 is a view illustrating still another example of a thin film transistor substrate according to an embodiment of the present invention.

FIGS. 35 to 37 are views illustrating still another example of a thin film transistor substrate according to an embodiment of the present invention. Referring to FIGS. 35 to 37, in the description of the thin film transistor substrate according to an embodiment, description of contents overlapping with those described with reference to FIGS. 1 to 34 may be omitted. An embodiment shown in FIGS. 35 to 37 differs from that of each of FIGS. 32, 33, and 34 in the bonding layer structure.

As shown in FIGS. 35 to 37, a bonding layer 53 may be provided on the substrate 55. The bonding layer 53 may be disposed between the substrate 55 and the black matrix 40. For example, a width of the bonding layer 53 may be provided to be equal to a width of the black matrix 40. For example, the width of the bonding layer 53 may be provided to be equal to a width of the channel layer 260.

According to an embodiment, a second passivation film 22 may be disposed on the substrate 55. A lower surface of the second passivation film 22 may be disposed in contact with an upper surface of the substrate 55. In a region where the bonding layer 50 is not provided, the second passivation film 22 may be disposed in direct contact with the substrate 55.

As described above, according to the embodiment shown in FIGS. 35 to 37, as compared with the embodiment shown in FIGS. 32, 33, and 34, since the second passivation film 22 and the substrate 55 may be disposed in direct contact with each other, a layer provided between the second passivation film 22 and the substrate 55 (for example, an illustrated bonding layer in FIGS. 32, 33, and 34) may be eliminated. Accordingly, according to the embodiment, since an interface between different material layers is reduced on a light path where light travels, light loss due to reflection/refraction at the interface may be reduced.

The bonding layer 53 according to an embodiment may comprise at least one of a reflective layer, a metal bonding layer, an organic bonding layer, and an insulating layer as an example. The reflective layer may be disposed on the substrate 55, the metal bonding layer may be disposed on the reflective layer, and the insulating layer may be disposed on the metal bonding layer. For example, the bonding layer 53 may comprise at least one of the metal bonding layer and the organic bonding layer, and the reflective layer and the insulating layer may be comprised selectively.

The insulating layer may complement the leakage characteristics of the channel layer 260. For example, the insulating layer may comprise a single layer or multiple layers including at least one material of a silicon-based oxide, a silicon-based nitride, a metal oxide including $Al_2O_3$, and an organic insulating material as an example.

The metal bonding layer or the organic bonding layer may be provided for bonding with the substrate 55 disposed thereunder. For example, the metal bonding layer may comprise at least one material selected from the group consisting of gold (Au), tin (Sn), indium (In), nickel (Ni), silver (Ag), and copper (Cu), or an alloy thereof. For example, the organic bonding layer may comprise at least one material selected from the group consisting of acryl, benzocyclobutene (BCB), SU-8 polymer, and the like.

The reflective layer may reduce light absorption in the bonding layer. For example, the reflective layer may comprise at least one material selected from the group consisting of aluminum (Al), silver (Ag), and rhodium (Rh), or an alloy thereof. The reflective layer may be provided with a material having a reflection characteristic of more than 60% as an example.

Meanwhile, according to an embodiment, for example, when the bonding layer 53 comprises the metal bonding layer and the reflective layer, the black matrix 40 may be omitted.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 38:
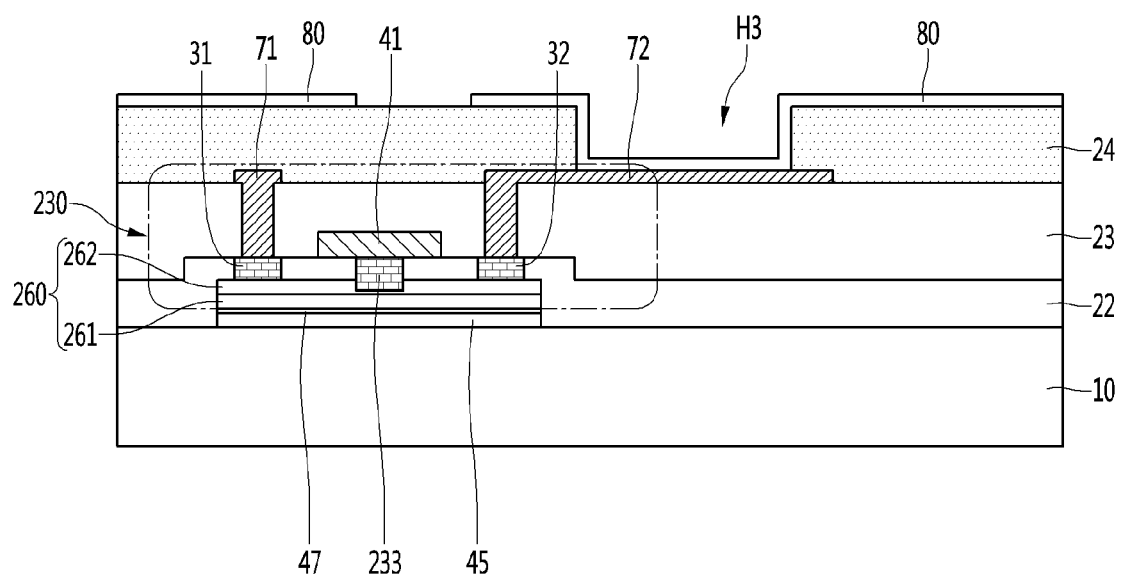
FIG. 38 is a view illustrating still another example of a thin film transistor substrate according to an embodiment of the present invention.
Figure 39:
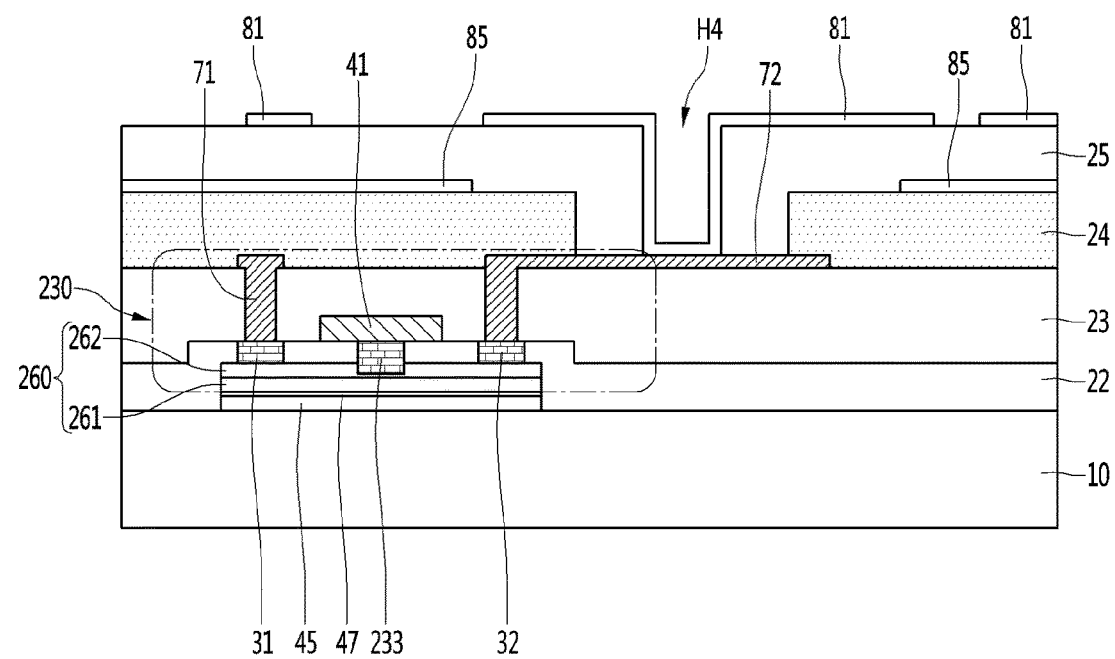
FIG. 39 is a view illustrating still another example of a thin film transistor substrate according to an embodiment of the present invention.
Figure 40:
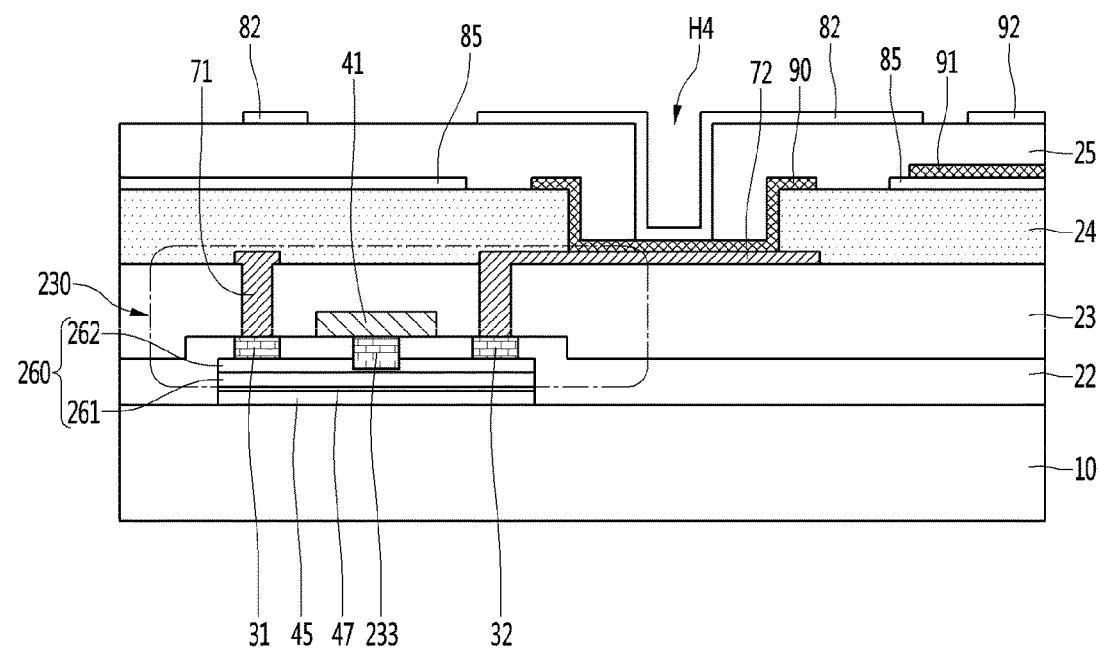
FIG. 40 is a view illustrating still another example of a thin film transistor substrate according to an embodiment of the present invention.

FIGS. 38 to 40 are views illustrating still another example of a thin film transistor substrate according to an embodiment of the present invention. Referring to FIGS. 38 to 40, in the description of the thin film transistor substrate according to the embodiment, description of contents overlapping with those described with reference to FIGS. 1 to 37 may be omitted. An embodiment shown in FIGS. 38 to 40 differs from that of each of FIGS. 32, 33, and 34 in that a transfer process is not applied and a thin film transistor is provided on a growth substrate.

As shown in FIGS. 38 to 40, the thin film transistor substrate according to the embodiment may comprise a growth substrate 10 as a substrate instead of a support substrate used in the transfer process. For example, the growth substrate 10 may comprise at least one of group consisting of sapphire, SiC, GaAs, GaN, ZnO, Si, GaP, InP and Ge.

A black matrix 45 may be disposed on the growth substrate 10. The black matrix 45 is disposed on the growth substrate 10 and may prevent light from being incident on the channel layer 260. The black matrix 45 may be provided with a material that absorbs or reflects visible rays as an example. Thus, according to the embodiment, light is incident on the channel layer 260 and it is possible to prevent a thin film transistor 230 from being deteriorated due to a photo current or the like. For example, the black matrix 45 may be provided in a single layer or multiple layers including at least one material selected from among a Si-based material, a Ga-based material, an Al-based material, and an organic material. The black matrix 45 may selectively comprise a material such as Si, GaAs, or the like.

According to an embodiment, a buffer layer 47 may be provided on the black matrix 45. The buffer layer 47 may be provided between the black matrix 45 and the channel layer 260. The buffer layer 47 may help a growth of a nitride semiconductor layer constituting the channel layer 260. For example, the buffer layer 47 may comprise a single layer or multiple layers including at least one material selected from the group consisting of AlN, AlInN, and AlGaN.

For example, a width of the black matrix 45 may be provided to be equal to a width of the buffer layer 47. For example, the width of the black matrix 45 may be provided to be equal to a width of the channel layer 260. The width of the buffer layer 47 may be provided to be equal to the width of the channel layer 260.

According to an embodiment, the second passivation film 22 may be disposed on the growth substrate 10. A lower surface of the second passivation film 22 may be disposed in contact with an upper surface of the growth substrate 10. In a region where the black matrix 45 is not provided, the second passivation film 22 may be disposed in direct contact with the growth substrate 10.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

Therefore, according to the thin film transistor substrate, the display panel and the display device comprising the same, a high resolution can be realized and a smooth moving picture can be reproduced by providing a high carrier mobility.

Figure 41:
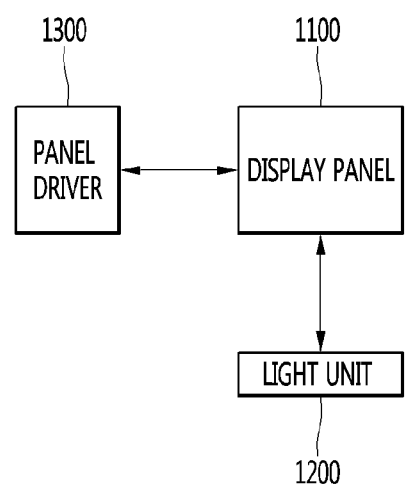
FIG. 41 is a block diagram illustrating an example of a display device comprising a thin film transistor substrate according to an embodiment of the present invention.

FIG. 41 is a block diagram illustrating an example of a display device comprising a thin film transistor substrate according to an embodiment of the present invention.

The display device according to an embodiment may comprise a display panel 1100, a light unit 1200, and a panel driver 1300 as shown in FIG. 41.

The display panel 1100 may comprise any one of the thin film transistor substrates described with reference to FIGS. 1 to 40 and a color filter substrate disposed on the thin film transistor substrate. The display panel 1100 may comprise a liquid crystal layer disposed between the thin film transistor substrate and the color filter substrate.

The light unit 1200 may be disposed under the display panel 1100 and may supply light to the display panel 1100. The panel driver 1300 may provide a driving signal to the display panel 1100. The panel driver 1300 may control the light transmittance of a plurality of pixels provided in the display panel 1100 and may display an image on the display panel 1100 by using light provided from the light unit 1200.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate. Meanwhile, as explained above, according to an embodiment, a thin film transistor and a pixel electrode are provided on a growth substrate and a thin film transistor substrate having an excellent electron mobility may be provided.

Therefore, according to the thin film transistor substrate, the display panel and the display device comprising the same, a high resolution can be realized and a smooth moving picture can be reproduced by providing a high carrier mobility.

Figure 42:
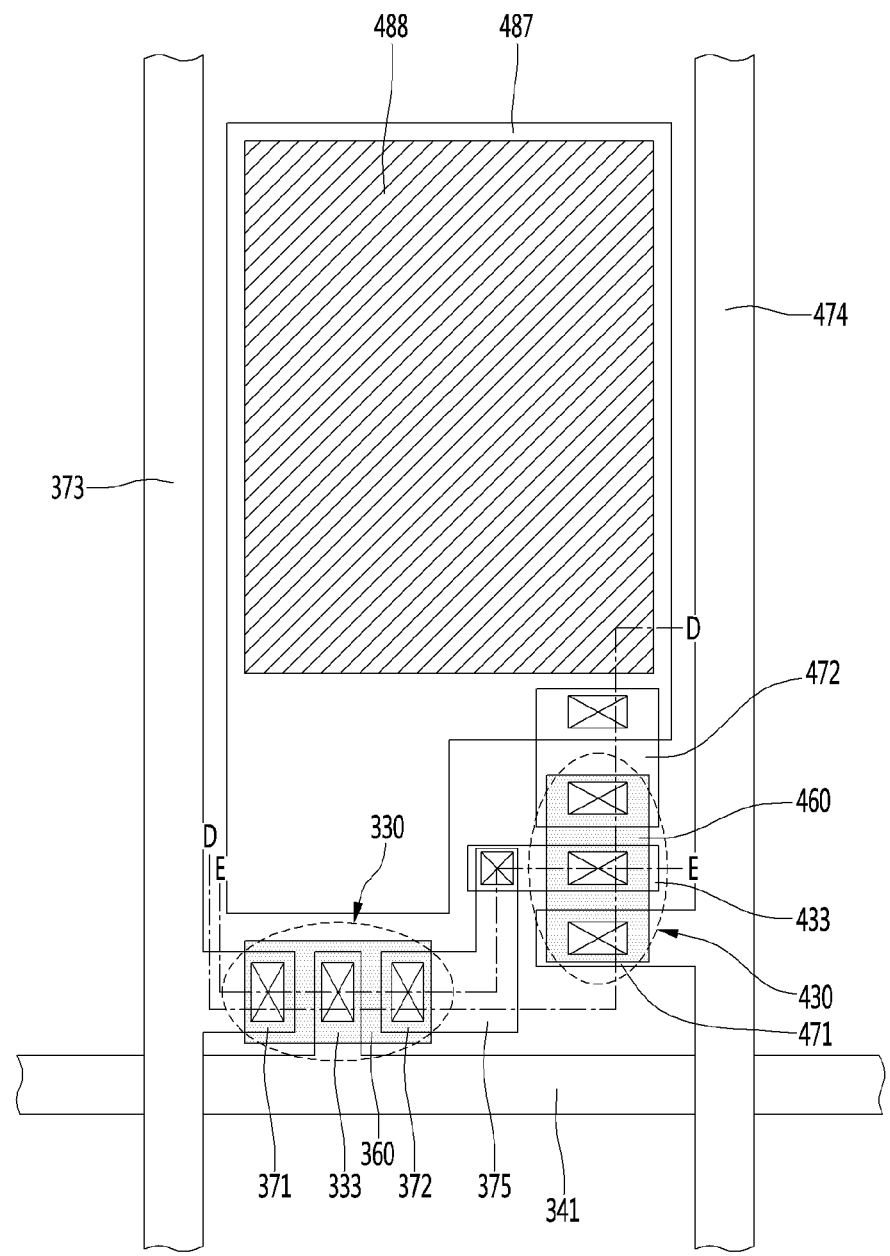
FIG. 42 is a view illustrating still another example of a thin film transistor substrate according to an embodiment of the present invention.
Figure 43:
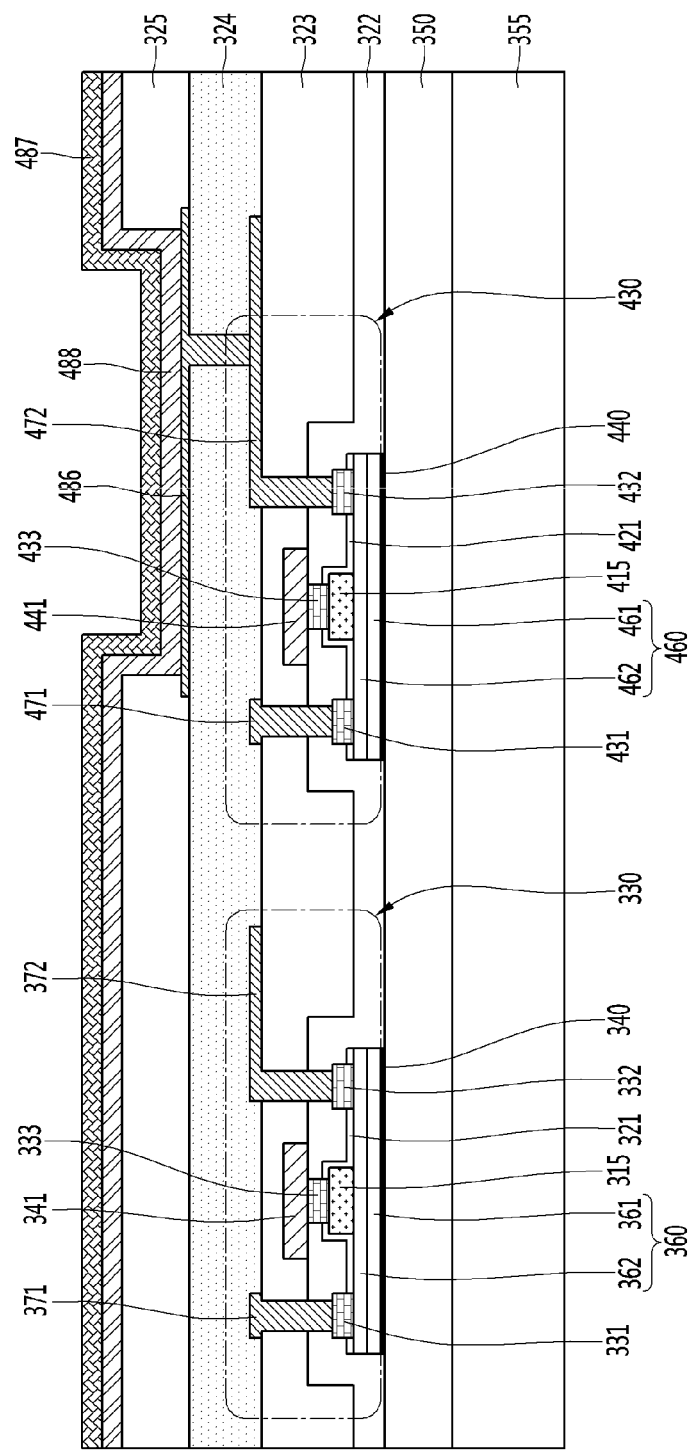
FIG. 43 is a cross-sectional view taken along line D-D of the thin film transistor substrate shown in FIG. 42 according to the embodiment of the present invention.

FIG. 42 is a view illustrating still another example of a thin film transistor substrate according to an embodiment of the present invention. FIG. 43 is a cross-sectional view taken along line D-D of the thin film transistor substrate shown in FIG. 42, and FIG. 44 is a cross-sectional view taken along line E-E of the thin film transistor substrate shown in FIG. 42.

Embodiments described with reference to FIGS. 1 to 41 relate to a thin film transistor substrate capable of being applied to a liquid crystal display device, and the thin film transistor substrate described with reference to FIGS. 42 to 44 may be applied to an organic light-emitting display device.

The thin film transistor substrate according to an embodiment may comprise a switching thin film transistor 330 and a driving thin film transistor 430. The switching thin film transistor 330 may receive a signal from a gate line 341 and a data line 373 and may provide a gate signal and a data signal to a corresponding pixel. The switching thin film transistor 330 may comprise a first gate electrode 333, a first source electrode 371, and a first drain electrode 372. The driving thin film transistor 430 may comprise a second gate electrode 433, a second source electrode 471, and a second drain electrode 472. The second gate electrode 433 of the driving thin film transistor 430 may be electrically connected to the first drain electrode 372 of the switching thin film transistor 330. The second source electrode 471 of the driving thin film transistor 430 may be connected to a driving power supply line (Vdd) 474. Operations of the switching thin film transistor 330 and the driving thin film transistor 430 will be described later with reference to FIG. 45.

Figure 44:
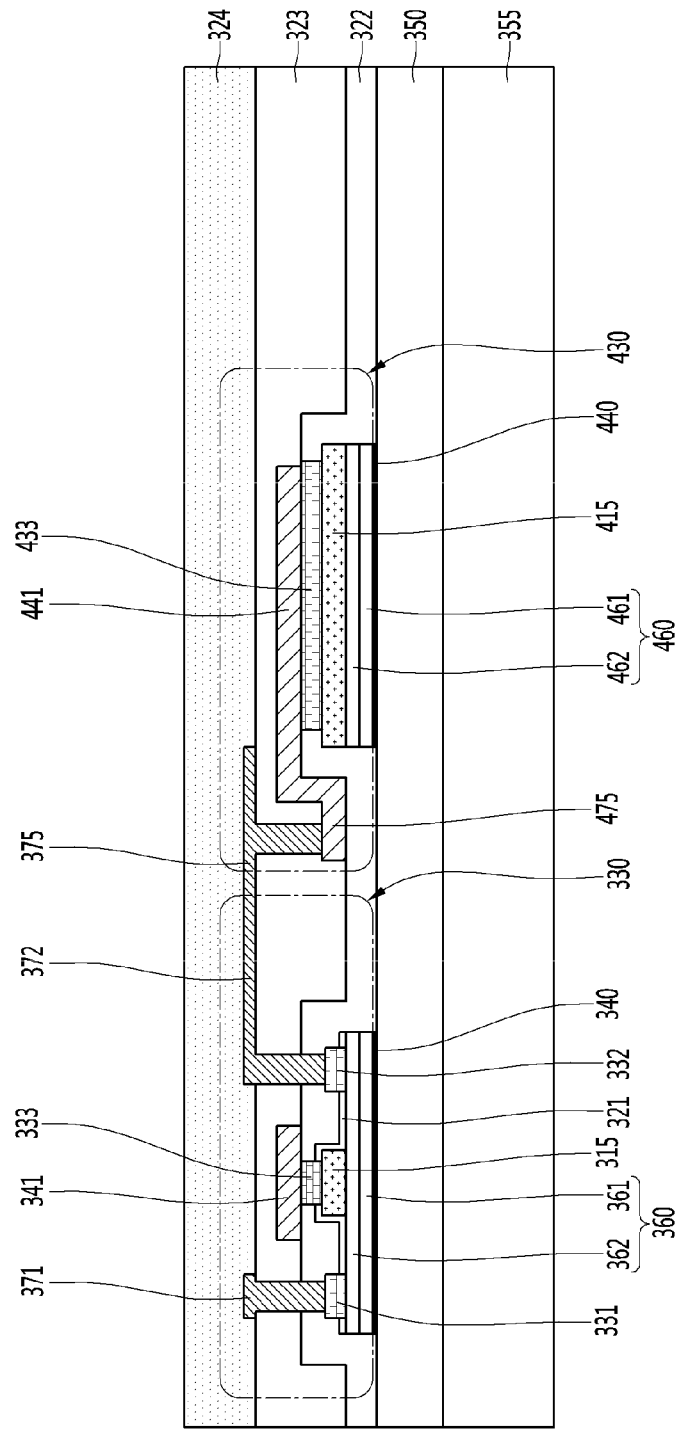
FIG. 44 is a cross-sectional view taken along line E-E of the thin film transistor substrate shown in FIG. 42 according to the embodiment of the present invention.

As shown in FIGS. 42 to 44, the thin film transistor substrate according to an embodiment of the present invention may comprise a substrate 355, the switching thin film transistor 330 disposed on the substrate 355, the driving thin film transistor 430, and a light-emitting layer 488 electrically connected to the driving thin film transistor 430.

The switching thin film transistor 330 according to an embodiment may comprise a first depletion forming layer 315, a first gate electrode 333, a first channel layer 360, a first source electrode 371, and a first drain electrode 372. The first source electrode 371 may be electrically connected to a first region of the first channel layer 360. The first source electrode 371 may be electrically connected to an upper surface of the first channel layer 360. The first drain electrode 372 may be electrically connected to a second region of the first channel layer 360. The first drain electrode 372 may be electrically connected to the upper surface of the first channel layer 360. The first gate electrode 333 may be disposed on the first channel layer 360. The first depletion forming layer 315 may be disposed on between the first region and the second region of the first channel layer 360. The first depletion forming layer 315 may be disposed between the first channel layer 360 and the first gate electrode 333.

The driving thin film transistor 430 according to an embodiment may comprise a second depletion forming layer 415, a second gate electrode 433, a second channel layer 460, a second source electrode 471, and a second drain electrode 472. The second source electrode 471 may be electrically connected to a first region of the second channel layer 460. The second source electrode 471 may be electrically connected to an upper surface of the second channel layer 460. The second drain electrode 472 may be electrically connected to a second region of the second channel layer 460. The second drain electrode 472 may be electrically connected to the upper surface of the second channel layer 460. The second gate electrode 433 may be disposed on the second channel layer 460. The second depletion forming layer 415 may be disposed on between the first region and the second region of the second channel layer 460. The second depletion forming layer 415 may be disposed between the second channel layer 460 and the second gate electrode 433.

The structures of the switching thin film transistor 330 and the driving thin film transistor 430 may be similar to each other, and in the description of the driving thin film transistor 430, description of contents overlapping with those described with reference to the switching thin film transistor 330 may be omitted.

The first channel layer 360 and the second channel layer 460 may be provided with, for example, a Group III-V compound semiconductor. For example, the first channel layer 360 and the second channel layer 460 may be provided with a semiconductor material having an empirical formula of $In_xAl_yGa_{1-x-y}N$ ($0 \geq x \geq 1$, $0 \geq y \geq 1$, $0 \geq x+y \geq 1$). The first channel layer 360 and the second channel layer 460 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first channel layer 360 and the second channel layer 460 may be formed of different materials.

The first channel layer 360 and the second channel layer 460 may each comprise first nitride semiconductor layers 361 and 461 and second nitride semiconductor layers 362 and 462. The first nitride semiconductor layers 361 and 461 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layers 362 and 462 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the first channel layer 360 and the second channel layer 460 according to an embodiment, the first nitride semiconductor layers 361 and 461 may comprise a GaN semiconductor layer, and the second nitride semiconductor layers 362 and 462 may comprise an AlGaN semiconductor layer. The second nitride semiconductor layer 362 of the first channel layer 360 may be disposed between the first nitride semiconductor layer 361 and the first depletion forming layer 315. The second nitride semiconductor layer 462 of the second channel layer 460 may be disposed between the first nitride semiconductor layer 461 and the second depletion forming layer 415.

The first depletion forming layer 315 and the second depletion forming layer 415 may be provided with, for example, a group III-V compound semiconductor. For example, the first depletion forming layer 315 and the second depletion forming layer 415 may be provided with a semiconductor material having an empirical formula of $In_xAl_yGa_{1-x-y}N$ ($0 \geq x \geq 1$, $0 \geq y \geq 1$, $0 \geq x+y \geq 1$). The first depletion forming layer 315 and the second depletion forming layer 415 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first depletion forming layer 315 and the second depletion forming layer 415 may comprise a nitride semiconductor layer doped with a p-type dopant. For example, the first depletion forming layer 315 and the second depletion forming layer 415 may comprise a GaN semiconductor layer doped with a p-type dopant or an AlGaN semiconductor layer doped with a p-type dopant. The first depletion forming layer 315 and the second depletion forming layer 415 may comprise a single layer or multiple layers provided with, for example, a semiconductor material having an empirical formula of $p-Al_xGa_{1-x}N$ ($0 \geq x \geq 0.3$).

The first depletion forming layer 315 and the second depletion forming layer 415 may be provided in a thickness of 2 to 300 nm as an example. The first depletion forming layer 315 and the second depletion forming layer 415 may be provided in a thickness of at least 2 nm in order to provide a depletion region at two-dimensional electron gas (2 DEG) provided at the first channel layer 360 and the second channel layer 460. In addition, the first depletion forming layer 315 and the second depletion forming layer 415 may be provided in a thickness of 30 nm or more in consideration of a thickness deviation according to a manufacturing process. In addition, the first depletion forming layer 315 and the second depletion forming layer 415 may be provided in a thickness of 200 nm or less in consideration of a thickness deviation according to a manufacturing process. The first depletion forming layer 315 and the second depletion forming layer 415 may be provided in a thickness of 50 to 100 nm as an example.

The first depletion forming layer 315 and the second depletion forming layer 415 may comprise different materials. Substances added to the first depletion forming layer 315 and the second depletion forming layer 415, and addition amounts of the added substances may be different from each other.

The first depletion forming layer 315 and the second depletion forming layer 415 may serve to form a depletion region in a two-dimensional electron gas (2 DEG) provided in the first channel layer 360 and the second channel layer 460. The energy bandgap of a portion of the second nitride semiconductor layer 362 positioned thereunder may be increased by the first depletion forming layer 315. As a result, the depletion region of the 2 DEG may be provided at a portion of the first channel layer 360 corresponding to the first depletion forming layer 315. Therefore, a region corresponding to the position in which the first depletion forming layer 315 is disposed in the 2 DEG provided at the first channel layer 360 may be cut off. A region in which the 2 DEG is cut off at the first channel layer 360 may be referred to as a cut-off region, and, for example, a cut-off region may be formed at the second nitride semiconductor layer 362. The switching thin film transistor 330 may have a normally-off characteristic due to such a cut-off region. When a voltage equal to or higher than a threshold voltage is applied to the first gate electrode 333, the 2 DEG is generated at the cut-off region and the switching thin film transistor 330 is turned on. When a channel formed at a lower portion of the first gate electrode 333 is turned on, a current may flow via the 2 DEG formed at the first channel layer 360. Accordingly, the current flow from the first region to the second region of the first channel layer 360 may be controlled according to a voltage applied to the first gate electrode 333. The second depletion forming layer 415 may perform a function similar to that of the first depletion forming layer 315.

The substrate 355 may comprise a transparent substrate. The substrate 355 may be provided with a transparent substrate having a thickness of 0.1 mm to 3 mm as an example. In addition, the thickness of the substrate 355 may be changed according to application and size of an applied display device and may be selected within a thickness range of 0.4 to 1.1 mm. For example, the substrate 355 may be provided in a thickness of 0.6 to 0.8 mm. The substrate 355 may comprise at least one material selected from materials including silicon, glass, polyimide, and plastic. The substrate 355 may comprise a flexible substrate.

The substrate 355 is a substrate to be used in a transfer process, and serves to support the switching thin film transistor 330 and the driving thin film transistor 430. In addition, the thin film transistor substrate according to an embodiment may comprise a bonding layer 350 provided between the substrate 355 and the switching thin film transistor 330. The bonding layer 350 may be disposed between the substrate 355 and the driving thin film transistor 430.

The bonding layer 350 may comprise an organic material. The bonding layer 350 may be provided with a transparent material. The bonding layer 350 may be provided with, for example, a material having a transmittance of 70% or more. The bonding layer 350 may comprise an organic insulating material. The bonding layer 350 may comprise at least one material selected from the group consisting of acryl, benzocyclobutene (BCB), SU-8 polymer, and the like. The bonding layer 350 may be provided in a thickness of 0.5 to 6 μm as an example. A thickness of the bonding layer 350 may be different according to a type of a selected material and may be provided in a thickness of 1 to 3 μm. In addition, the bonding layer 350 may be provided in a thickness of 1.8 to 2.2 μm as an example.

The switching thin film transistor 330 according to an embodiment may comprise a first source contact portion 331 disposed on the first region of the first channel layer 360 and a first drain contact portion 332 disposed on the second region of the first channel layer 360. The first source contact portion 331 may be disposed in contact with the first region of the first channel layer 360. The first drain contact portion 332 may be disposed in contact with the second region of the first channel layer 360.

A switching thin film transistor 330 according to an embodiment may comprise a first gate wiring 341 disposed on the first gate electrode 333. The first gate wiring 341 may be electrically connected to the first gate electrode 333. A lower surface of the first gate wiring 341 may be disposed in contact with an upper surface of the first gate electrode 333.

The first source electrode 371 may be electrically connected to the first source contact portion 331. The first source electrode 371 may be disposed in contact with an upper surface of the first source contact portion 331. For example, the first source electrode 371 may be electrically connected to a first region of the first channel layer 360 via the first source contact portion 331. The first drain electrode 372 may be electrically connected to the first drain contact portion 332. The first drain electrode 372 may be disposed in contact with an upper surface of the first drain contact portion 332. For example, the first drain electrode 372 may be electrically connected to a second region of the first channel layer 360 via the first drain contact portion 332.

The driving thin film transistor 430 according to an embodiment may comprise a second source contact portion 431 disposed on the first region of the second channel layer 460 and a second drain contact portion 432 disposed on the second region of the second channel layer 460. The second source contact portion 431 may be disposed in contact with the first region of the second channel layer 460. The second drain contact portion 432 may be disposed in contact with the second region of the second channel layer 460.

A driving thin film transistor 430 according to an embodiment may comprise a second gate wiring 441 disposed on the second gate electrode 433. The second gate wiring 441 may be electrically connected to the second gate electrode 433. A lower surface of the second gate wiring 441 may be disposed in contact with an upper surface of the second gate electrode 433.

The second source electrode 471 may be electrically connected to the second source contact portion 431. The second source electrode 471 may be disposed in contact with an upper surface of the second source contact portion 431. For example, the second source electrode 471 may be electrically connected to a first region of the second channel layer 460 via the second source contact portion 431. The second drain electrode 472 may be electrically connected to the second drain contact portion 432. The second drain electrode 472 may be disposed in contact with an upper surface of the second drain contact portion 432. For example, the second drain electrode 472 may be electrically connected to a second region of the second channel layer 460 via the second drain contact portion 432.

The first source contact portion 331 and the first drain contact portion 332 may be provided with a material in ohmic contact with the first channel layer 360. The first source contact portion 331 and the first drain contact portion 332 may comprise a material in ohmic contact with the second nitride semiconductor layer 362. The second source contact portion 431 and the second drain contact portion 432 may be provided with a material in ohmic contact with the second channel layer 460. The second source contact portion 431 and the second drain contact portion 432 may comprise a material in ohmic contact with the second nitride semiconductor layer 462. For example, the first source contact portion 331, the first drain contact portion 332, the second source contact portion 431, and the second drain contact portion 432 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source contact portion 331, the first drain contact portion 332, the second source contact portion 431, and the second drain contact portion 432 may be provided in a thickness of 0.1 to 1 µm as an example. The first source contact portion 331, the first drain contact portion 332, the second source contact portion 431, and the second drain contact portion 432 do not need to serve to spread a current as a layer for contacting with the first channel layer 360 and the second channel layer 460. Accordingly, the first source contact portion 331, the first drain contact portion 332, the second source contact portion 431, and the second drain contact portion 432 may be provided in a thickness of 1 µm or less.

The first gate electrode 333 may be provided with a material in ohmic contact with the first depletion forming layer 315. The second gate electrode 433 may be provided with a material in ohmic contact with the second depletion forming layer 415. For example, the first gate electrode 333 and the second gate electrode 433 may be provided with a material in ohmic contact with a p-type nitride layer. The first gate electrode 333 and the second gate electrode 433 may comprise a single layer or multiple layers comprising at least one material selected from the group consisting of tungsten (W), tungsten silicon (WSi2), titanium nitride (TiN), tantalum (Ta), tantalum nitride (TaN), palladium (Pd), nickel (Ni), and platinum (Pt). The first gate electrode 333 and the second gate electrode 433 may be provided in a thickness of 0.1 to 1 µm as an example. Since the first gate electrode 335 and the second gate electrode 433 does not need to serve to spread a current as a layer for contacting with the first depletion forming layer 315 and the second depletion forming layer 415, the first gate electrode 335 and the second gate electrode 435 may be provided in a thickness of 1 µm or less.

The first gate wiring 341 and the second gate wiring 441 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first gate wiring 341 and the second gate wiring 441 may be provided in a thickness of 0.1 to 3 µm as an example.

Since the first gate wiring 341 and the second gate wiring 441 serves to sequentially apply a voltage to a plurality of transistors, the first gate wiring 341 and the second gate wiring 441 may be provided to be thicker than a thickness of the first gate electrode 333 and the second gate electrode 433.

The first source electrode 371, the first drain electrode 372, the second source electrode 471, and the second drain electrode 472 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source electrode 371, the first drain electrode 372, the second source electrode 471, and the second drain electrode 472 may be provided in a thickness of 0.1 to 3 µm as an example. Since the first source electrode 371 and the second source electrode 471 serve to sequentially apply a voltage to the plurality of transistors, the first source electrode 371 and the second source electrode 471 may be provided to be thicker than a thickness of the first source contact portion 331 and the second source contact portion 431. Also, the first drain electrode 372 and the second drain electrode 472 may be provided to be thicker than a thickness of the first drain contact portion 332 and the second drain contact portion 432.

The thin film transistor substrate according to an embodiment may comprise a first passivation film 321 and 421 disposed on the first channel layer 360 and the second channel layer 460. The first passivation film 321 and 421 may be disposed on the second nitride semiconductor layer 362 of the first channel layer 360 and the second nitride semiconductor layer 462 of the second channel layer 460. A lower surface of the first passivation film 321 and 421 may be disposed in contact with an upper surface of the second nitride semiconductor layer 362 of the first channel layer 360 and the second nitride semiconductor layer 462 of the second channel layer 460. The first passivation film 321 and 421 may be disposed on the first depletion forming layer 315 and the second depletion forming layer 415. The first passivation film 321 and 421 may be disposed at a side surface of the first depletion forming layer 315 and the second depletion forming layer 415. The first passivation film 321 and 421 may be disposed so as to surround the side surface of the first depletion forming layer 315 and the second depletion forming layer 415.

According to an embodiment, the first source contact portion 331 may be disposed to pass through the first passivation film 321. The first source contact portion 331 may be disposed to be surrounded by the first passivation film 321. The first source contact portion 331 may be disposed to pass through the first passivation film 321 and provided in contact with the first region of the first channel layer 360. The first drain contact portion 332 may be disposed to pass through the first passivation film 321. The first drain contact portion 332 may be disposed to be surrounded by the first passivation film 321. The first drain contact portion 332 may be disposed to pass through the first passivation film 321 and provided in contact with the second region of the first channel layer 360.

According to an embodiment, the second source contact portion 431 may be disposed to pass through the first passivation film 421. The second source contact portion 431 may be disposed to be surrounded by the first passivation film 421. The second source contact portion 431 may be disposed to pass through the first passivation film 421 and provided in contact with the first region of the second channel layer 460. The second drain contact portion 432 may be disposed to pass through the first passivation film 421. The second drain contact portion 432 may be disposed to be surrounded by the first passivation film 421. The second drain contact portion 432 may be disposed to pass through the first passivation film 421 and provided in contact with the second region of the second channel layer 460.

The first passivation film 321 and 421 may be provided with an insulating material. The first passivation film 321 and 421 may comprise a single layer or multiple layers comprising at least one material of a silicon-based oxide, a silicon-based nitride, a metal oxide comprising $Al_2O_3$, and an organic insulating material as an example.

According to an embodiment, a second passivation film 322 may be disposed on the substrate 355 and the first passivation film 321 and 421. The first gate electrode 333 may be disposed to pass through at least one of the first passivation film 321 and the second passivation film 322. For example, the first gate electrode 333 may be disposed to pass through the first passivation film 321 and the second passivation film 322. The first gate electrode 333 may pass through at least one of the first passivation film 321 and the second passivation film 322 and be disposed in contact with the first depletion forming layer 315. For example, the first gate electrode 333 may pass through the first passivation film 321 and the second passivation film 322 and be disposed in contact with the first depletion forming layer 315. The first gate wiring 341 may be disposed on the second passivation film 322 and be electrically connected to the first gate electrode 333. The second gate electrode 433 may be disposed to pass through at least one of the first passivation film 321 and the second passivation film 322. For example, the second gate electrode 433 may be disposed to pass through the first passivation film 321 and the second passivation film 322. The second gate electrode 433 may pass through at least one of the first passivation film 321 and the second passivation film 322 and be disposed in contact with the second depletion forming layer 415. For example, the second gate electrode 433 may pass through the first passivation film 321 and the second passivation film 322 and be disposed in contact with the second depletion forming layer 415. The second gate wiring 441 may be disposed on the second passivation film 322 and be electrically connected to the second gate electrode 433.

The second passivation film 322 may be provided with an insulating material. The second passivation film 322 may comprise a single layer or multiple layers including at least one material of a silicon-based oxide, a silicon-based nitride, a metal oxide including $Al_2O_3$, and an organic insulating material as an example.

According to an embodiment, a third passivation film 323 may be disposed on the second passivation film 322. The third passivation film 323 may be disposed on the second passivation film 322, the first gate wiring 341, and the second gate wiring 342. The first gate wiring 341 may be disposed in contact with the first gate electrode 333 thereon and provided to be surrounded by the third passivation film 323. The second gate wiring 441 may be disposed in contact with the second gate electrode 433 thereon and provided to be surrounded by the third passivation film 323.

The first source electrode 371 may pass through the second passivation film 322 and the third passivation film 323 and be electrically connected to the first source contact portion 331. The first source electrode 371 may comprise a first region disposed on the third passivation film 323. The first source electrode 371 may comprise a second region passing through the third passivation film 323 and the second passivation film 322. The first drain electrode 372 may pass through the second passivation film 322 and the third passivation film 323 and be electrically connected to the first drain contact portion 332. The first drain electrode 372 may comprise a first region disposed on the third passivation film 323. The first drain electrode 372 may comprise a second region passing through the third passivation film 323 and the second passivation film 322.

The second source electrode 471 may pass through the second passivation film 322 and the third passivation film 323 and be electrically connected to the second source contact portion 431. The second source electrode 471 may comprise a first region disposed on the third passivation film 323. The second source electrode 471 may comprise a second region passing through the third passivation film 323 and the second passivation film 322. The second drain electrode 472 may pass through the second passivation film 322 and the third passivation film 323 and be electrically connected to the second drain contact portion 432. The second drain electrode 472 may comprise a first region disposed on the third passivation film 323. The second drain electrode 472 may comprise a second region passing through the third passivation film 323 and the second passivation film 322.

According to an embodiment, a first drain-gate connecting wiring 375 may be disposed on the third passivation film 323. The first drain-gate connecting wiring 375 may comprise a first region disposed on the third passivation film 323. The first drain-gate connecting wiring 375 may comprise a second region passing through the third passivation film 323. The first region of the first drain-gate connecting wiring 375 may be electrically connected to the first drain electrode 372. The first region of the first drain-gate connecting wiring 375 may be disposed to be extending from the first drain electrode 372. For example, the first drain-gate connecting wiring 375 and the first drain electrode 372 may be integrally formed in the same process. In addition, the first drain-gate connecting wiring 375 and the first drain electrode 372 may be separately formed in different processes and electrically connected to each other.

According to an embodiment, a second drain-gate connecting wiring 475 may be disposed on the second passivation film 322. The second drain-gate connecting wiring 475 may be electrically connected to the first drain-gate connecting wiring 375. The second region of the first drain-gate connecting wiring 375 may be disposed in contact with the second drain-gate connecting wiring 475. The second drain-gate connecting wiring 475 may be electrically connected to the second gate wiring 441. The second drain-gate connecting wiring 475 may be disposed to be extending from the second gate wiring 441. For example, the second drain-gate connecting wiring 475 and the second gate wiring 441 may be integrally formed in the same process. In addition, the second drain-gate connecting wiring 475 and the second gate wiring 441 may be formed in separate processes and electrically connected to each other. The first drain electrode 372 may be electrically connected to the second gate electrode 433 via the first drain-gate connecting wiring 375, the second drain-gate connecting wiring 475, and the second gate wiring 441.

As shown in FIG. 44, the second channel layer 460 and the second depletion forming layer 415 may be formed in the same width. When a width of the second depletion forming layer 415 is smaller than that of the second channel layer 460, a leakage current may be generated. In other words, the length of the second channel layer 460 provided along the direction in which the second gate electrode 433 is extended and disposed and the length of the second depletion forming layer 415 may be provided in the same length.

The third passivation film 323 may comprise an insulating material. For example, the third passivation film 323 may comprise a single layer or multiple layers comprising at least one material among a silicon-based oxide, a silicon nitride, a metal oxide containing $Al_2O_3$, and an organic insulator.

The thin film transistor substrate according to an embodiment may comprise a fourth passivation film 324 disposed on the third passivation film 323. The fourth passivation film 324 may be disposed on the first source electrode 371, the first drain electrode 372, the second source electrode 471, and the second drain electrode 472.

For example, the fourth passivation film 324 may comprise a single layer or multiple layers containing at least one material of a silicon-based oxide, a silicon-based nitride, a metal oxide containing $Al_2O_3$, and an organic insulating material.

The thin film transistor substrate according to an embodiment may comprise a lower electrode 486 disposed on the driving thin film transistor 430. The lower electrode 486 may be electrically connected to the driving thin film transistor 430. The lower electrode 486 may be electrically connected to the second drain electrode 472 of the driving thin film transistor 430. The lower electrode 486 may be disposed on the fourth passivation film 324. The lower electrode 486 may be electrically connected to the second drain electrode 472 through a contact hole provided in the fourth passivation film 324. A lower surface of the lower electrode 486 may be disposed in contact with an upper surface of the second drain electrode 472.

In addition, the thin film transistor substrate according to an embodiment may comprise a fifth passivation film 325 disposed on the fourth passivation film 324. The light-emitting layer 488 may be disposed on the lower electrode 486. An upper electrode 487 may be disposed on the light-emitting layer 488. The light-emitting layer 488 and the upper electrode 487 may be disposed on the fifth passivation film 325. A first region of the light-emitting layer 488 may be disposed on the fifth passivation film 325, and a second region of the light-emitting layer 488 may be disposed in contact with an upper surface of the lower electrode 486 through a contact hole provided in the fifth passivation film 325. The light-emitting layer 488 may emit light of any one of red, green, blue, and white as an example. The light-emitting layer 488 may be provided with an organic material as an example.

The lower electrode 486 and the upper electrode 487, for example, may comprise one material selected from ITO, ITO/Ag, ITO/Ag/ITO, and ITO/Ag/IZO, or an alloy containing the material. The lower electrode 486 and the upper electrode 487 may comprise different materials. One of the upper electrode 486 and the lower electrode 487 may be formed of a transparent electrode, and light emitted from the light-emitting layer 488 in a direction of the transparent electrode may be emitted to the outside.

The thin film transistor substrate according to an embodiment may comprise a first black matrix 340 between the substrate 355 and the first channel layer 360. A width of the first channel layer 360 may be provided to be equal to a width of the first black matrix 340. The first black matrix 340 may be provided in a single layer or multiple layers including at least one material selected from among a Si-based material, a Ga-based material, an Al-based material, and an organic material. The first black matrix 340 may block light incident on the switching thin film transistor 330. Accordingly, it is possible to prevent the switching thin film transistor 330 from deteriorating due to a photo current or the like.

The thin film transistor substrate according to an embodiment may comprise a second black matrix 440 between the substrate 355 and the second channel layer 460. A width of the second channel layer 460 may be provided to be equal to a width of the second black matrix 440. The second black matrix 440 may be provided in a single layer or multiple layers including at least one material selected from among a Si-based material, a Ga-based material, an Al-based material, and an organic material. The second black matrix 440 may block light incident on the driving thin film transistor 430. Accordingly, it is possible to prevent the driving thin film transistor 430 from deteriorating due to a photo current or the like.

According to an embodiment, the bonding layer 350 may be disposed between the substrate 355 and the first channel layer 360. The bonding layer 350 may be disposed between the substrate 355 and the first black matrix 340. The bonding layer 350 may be disposed between the substrate 355 and the second channel layer 460. The bonding layer 350 may be disposed between the substrate 355 and the second black matrix 440. For example, the bonding layer 350 may be disposed on an entire region of the substrate 355.

Figure 45:
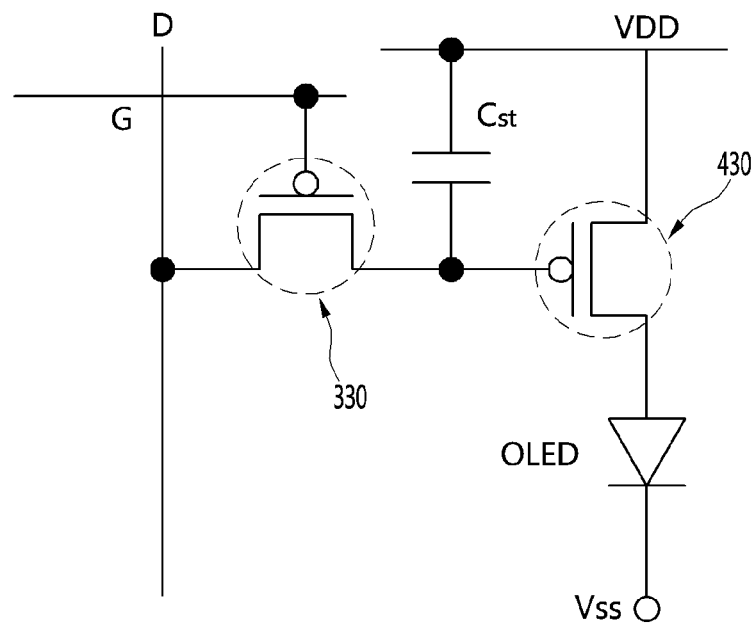
FIG. 45 is a circuit diagram equivalently illustrating one pixel in the thin film transistor substrate described with reference to FIGS. 42 to 44.

FIG. 45 is a circuit diagram equivalently illustrating one pixel in the thin film transistor substrate described with reference to FIGS. 42 to 44.

As shown in FIG. 45, a pixel of the thin film transistor substrate according to an embodiment of the present invention may comprise an organic light-emitting diode (OLED), a data line D and a gate line G crossing each other, a switching thin film transistor 330 for sequentially transmitting data of scan pulse SP on the gate line G to a pixel, a driving thin film transistor 430 generating a current by a voltage between a gate and a source terminal, and a storage capacitor Cst for storing and maintaining data for a predetermined time. In this way, the structure constituted by two transistors 330 and 430 and one capacitor Cst may be simply referred to as a 2T-1C structure.

The switching thin film transistor 330 is turned on in response to a scan pulse SP from the gate line G, thereby conducting a current path between its source electrode and drain electrode. During a gate on-time period of the switching thin film transistor 330, a data voltage from the data line D passes through the source electrode and the drain electrode of the switching thin film transistor 330 and is applied to the gate electrode of the driving thin film transistor 430 and the storage capacitor Cst. The driving thin film transistor 430 controls a current flowing to the OLED according to a voltage difference between its gate electrode and source electrode. The storage capacitor Cst constantly maintains a voltage supplied to the gate electrode of the driving thin film transistor 430 during one frame period by storing the data voltage applied to its one side electrode. A driving power supply line VDD may be connected to the source electrode of the driving thin film transistor 430. The OLED provided in the structure as shown in FIG. 45 may be connected between the drain electrode of the driving thin film transistor 430 and a low potential driving voltage source VSS. In addition, the OLED may be disposed to be connected between the source electrode of the driving thin film transistor 430 and the driving power supply line VDD.

According to the thin film transistor substrate according to an embodiment, a high carrier mobility may be implemented by providing the thin film transistor comprising the nitride-based semiconductor layer. For example, an electron mobility (cm$^2$/Vs) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 46:
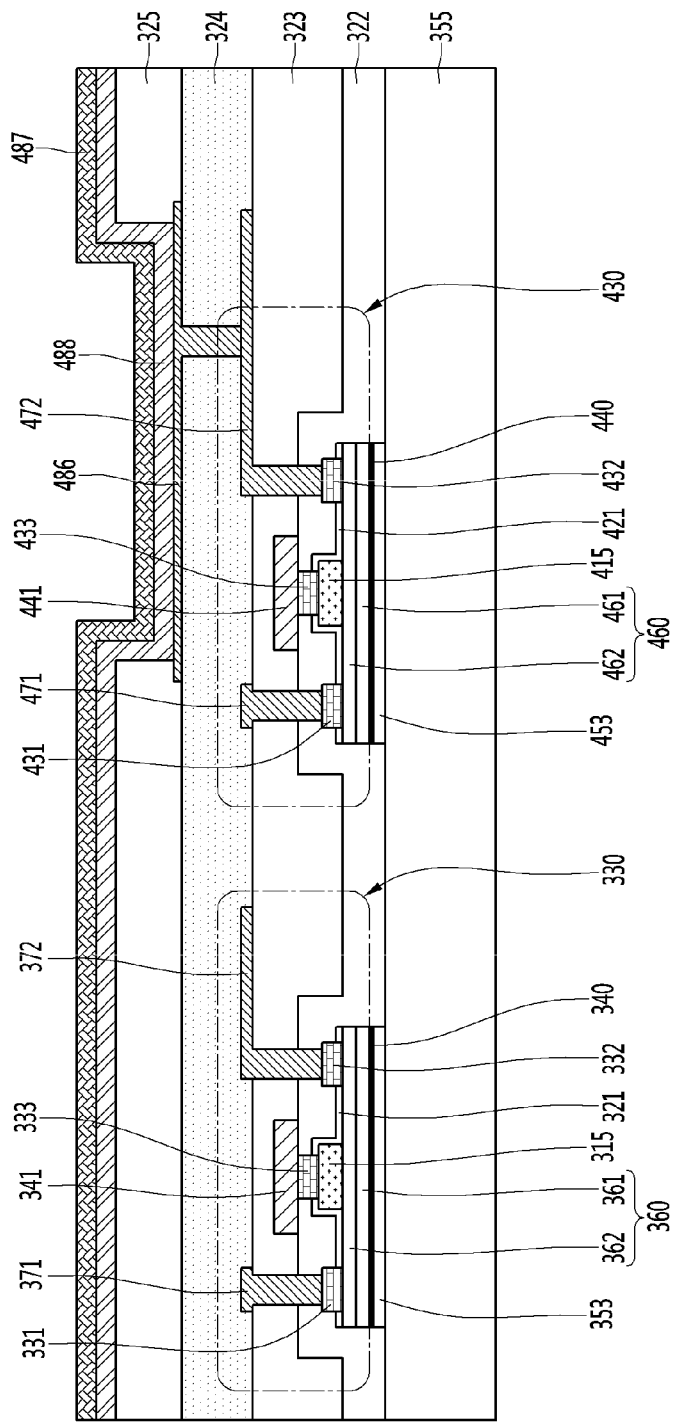
FIG. 46 is a view illustrating still another example of a thin film transistor substrate according to an embodiment of the present invention.

FIG. 46 is a view illustrating still another example of a thin film transistor substrate according to an embodiment of the present invention. Referring to FIG. 46, in the description of the thin film transistor substrate according to an embodiment, description of a part overlapping with those described with reference to FIGS. 1 to 45 may be omitted. An embodiment shown in FIG. 46 differs from that of each of FIGS. 42 to 45 in the bonding layer structure.

As shown in FIG. 46, a first bonding layer 353 and a second bonding layer 453 may be provided on the substrate 355. The first bonding layer 353 may be disposed between the substrate 355 and the first black matrix 340. For example, a width of the first bonding layer 353 may be provided to be equal to a width of the first black matrix 340. For example, the width of the first bonding layer 353 may be provided to be equal to a width of the first channel layer 360. The second bonding layer 453 may be disposed between the substrate 355 and the second black matrix 440. For example, a width of the second bonding layer 453 may be provided to be equal to a width of the second black matrix 440. For example, the width of the second bonding layer 453 may be provided to be equal to a width of the second channel layer 460.

According to an embodiment, a second passivation film 322 may be disposed on the substrate 355. A lower surface of the second passivation film 322 may be disposed in contact with an upper surface of the substrate 355. In a region where the first bonding layer 350 is not provided, the second passivation film 322 may be disposed in direct contact with the substrate 355. In a region where the second bonding layer 450 is not provided, the second passivation film 322 may be disposed in direct contact with the substrate 355.

As described above, according to the embodiment shown in FIG. 46, as compared with the embodiment shown in FIG. 43, since the second passivation film 322 and the substrate 355 may be disposed in direct contact with each other, a layer provided between the second passivation film 322 and the substrate 355 (for example, an illustrated bonding layer in FIG. 43) may be eliminated. Accordingly, according to the embodiment, since an interface between different material layers is reduced on a light path where light travels, light loss due to reflection/refraction at the interface may be reduced.

The first bonding layer 353 and the second bonding layer 453 according to an embodiment may comprise at least one of a reflective layer, a metal bonding layer, an organic bonding layer, and an insulating layer as an example. The reflective layer may be disposed on the substrate 355, the metal bonding layer may be disposed on the reflective layer, and the insulating layer may be disposed on the metal bonding layer. For example, the first bonding layer 353 and the second bonding layer 453 may comprise at least one of the metal bonding layer and the organic bonding layer, and the reflective layer and the insulating layer may be comprised selectively.

The insulating layer may complement the leakage characteristics of the first channel layer 360 and the second channel layer 460. For example, the insulating layer may comprise a single layer or multiple layers including at least one material of a silicon-based oxide, a silicon-based nitride, a metal oxide including $Al_2O_3$, and an organic insulating material as an example.

The metal bonding layer or the organic bonding layer may be provided for bonding with the substrate 355 disposed thereunder. For example, the metal bonding layer may comprise at least one material selected from the group consisting of gold (Au), tin (Sn), indium (In), nickel (Ni), silver (Ag), and copper (Cu), or an alloy thereof. For example, the organic bonding layer may comprise at least one material selected from the group consisting of acryl, benzocyclobutene (BCB), SU-8 polymer, and the like.

The reflective layer may reduce light absorption in the bonding layer. For example, the reflective layer may comprise at least one material selected from the group consisting of aluminum (Al), silver (Ag), and rhodium (Rh), or an alloy thereof. The reflective layer may be provided with a material having a reflection characteristic of more than 60% as an example.

Meanwhile, according to an embodiment, for example, when the first bonding layer 353 and the second bonding layer 453 comprise the metal bonding layer and the reflective layer, the first black matrix 340 and the second black matrix 440 may be omitted.

According to the thin film transistor substrate according to an embodiment, a high carrier mobility may be implemented by providing the thin film transistor comprising the nitride-based semiconductor layer. For example, an electron mobility (cm$^2$/Vs) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 47:
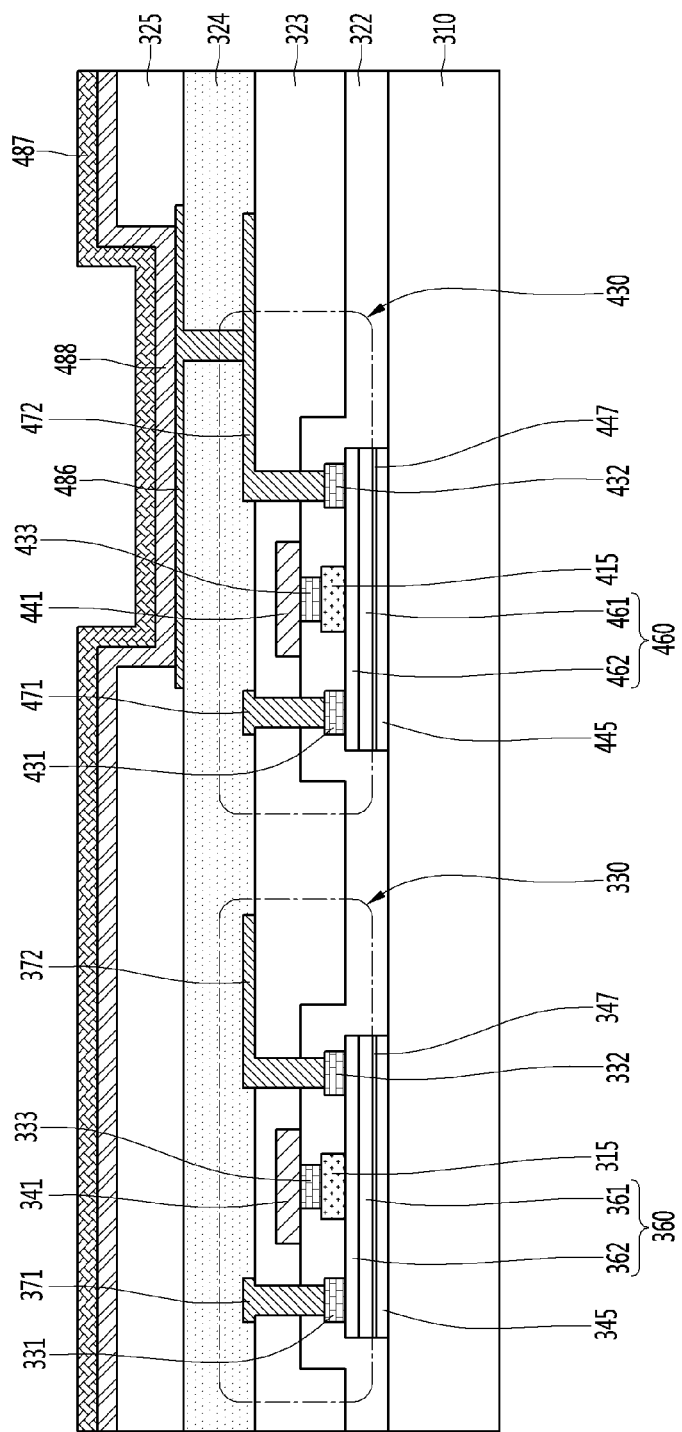
FIG. 47 is a view illustrating still another example of a thin film transistor substrate according to an embodiment of the present invention.

FIG. 47 is view illustrating still another example of a thin film transistor substrate according to an embodiment of the present invention. Referring to FIG. 47, in the description of the thin film transistor substrate according to the embodiment, description of contents overlapping with those described with reference to FIGS. 1 to 46 may be omitted. An embodiment shown in FIG. 47 differs from that of each of FIG. 45 in that a transfer process is not applied and a thin film transistor is provided on a growth substrate.

As shown in FIG. 47, the thin film transistor substrate according to the embodiment may comprise a growth substrate 310 as a substrate instead of a support substrate used in the transfer process. For example, the growth substrate 310 may comprise at least one of group consisting of sapphire, SiC, GaAs, GaN, ZnO, Si, GaP, InP and Ge.

A first black matrix 345 and a second black matrix 445 may be disposed on the growth substrate 310. The first black matrix 345 is disposed on the growth substrate 310 and may prevent light from being incident on the first channel layer 360. The first black matrix 345 may be provided with a material that absorbs or reflects visible rays as an example. Thus, according to the embodiment, light is incident on the first channel layer 360 and it is possible to prevent a switching thin film transistor 330 from being deteriorated due to a photo current or the like. The second black matrix 445 is disposed on the growth substrate 310 and may prevent light from being incident on the second channel layer 460. The second black matrix 445 may be provided with a material that absorbs or reflects visible rays as an example. Thus, according to the embodiment, light is incident on the second channel layer 460 and it is possible to prevent a driving thin film transistor 330 from being deteriorated due to a photo current or the like.

For example, the first black matrix 345 and the second black matrix 445 may be provided in a single layer or multiple layers including at least one material selected from among a Si-based material, a Ga-based material, an Al-based material, and an organic material. The first black matrix 345 and the second black matrix 445 may selectively comprise a material such as Si, GaAs, or the like.

According to an embodiment, a first buffer layer 347 may be provided on the first black matrix 345. The first buffer layer 347 may be provided between the first black matrix 345 and the first channel layer 360. The first buffer layer 347 may help a growth of a nitride semiconductor layer constituting the first channel layer 360. A second buffer layer 447 may be provided on the second black matrix 445. The second buffer layer 447 may be provided between the second black matrix 445 and the second channel layer 460. The second buffer layer 447 may help a growth of a nitride semiconductor layer constituting the second channel layer 460. For example, the first buffer layer 347 and the second buffer layer 447 may comprise a single layer or multiple layers including at least one material selected from the group consisting of AlN, AlInN, and AlGaN.

For example, a width of the first black matrix 345 may be provided to be equal to a width of the first buffer layer 347. For example, the width of the first black matrix 345 may be provided to be equal to a width of the first channel layer 360. The width of the first buffer layer 347 may be provided to be equal to the width of the first channel layer 360. A width of the second black matrix 445 may be provided to be equal to a width of the second buffer layer 447. For example, the width of the second black matrix 445 may be provided to be equal to a width of the second channel layer 460. The width of the second buffer layer 447 may be provided to be equal to the width of the second channel layer 460.

According to an embodiment, the second passivation film 322 may be disposed on the growth substrate 310. A lower surface of the second passivation film 322 may be disposed in contact with an upper surface of the growth substrate 310. In a region where the first black matrix 345 and the second black matrix 445 is not provided, the second passivation film 322 may be disposed in direct contact with the growth substrate 310.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

Therefore, according to the thin film transistor substrate, the display panel and the display device comprising the same, a high resolution can be realized and a smooth moving picture can be reproduced by providing a high carrier mobility.

Figure 48:
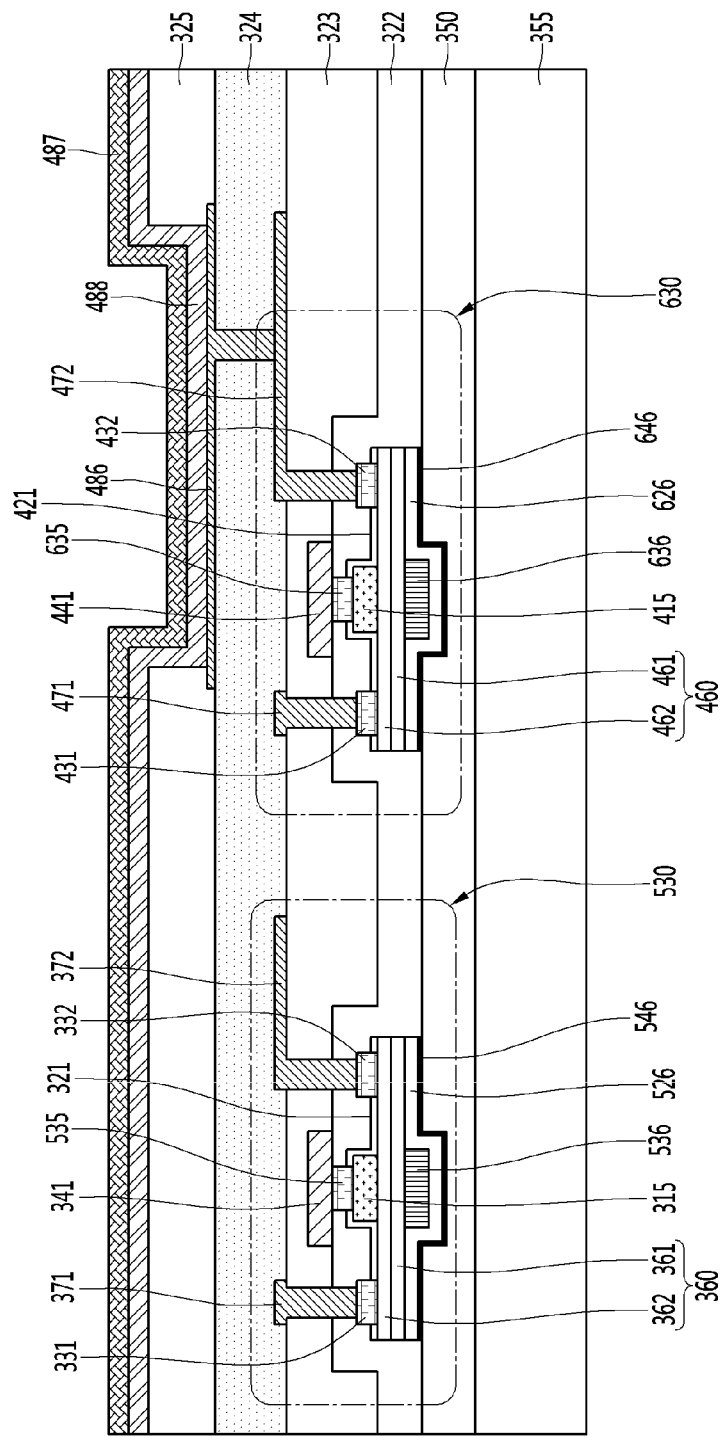
FIG. 48 is a view illustrating still another example of a thin film transistor substrate according to an embodiment of the present invention.

FIG. 48 is a view illustrating still another example of a thin film transistor substrate according to an embodiment of the present invention. FIG. 48 is a cross-sectional view taken along line D-D of the thin film transistor substrate shown in FIG. 42. The thin film transistor substrate shown in FIG. 48 is an embodiment to which a switching thin film transistor having a double gate structure is applied, and description of contents overlapping with those described with reference to FIGS. 1 to 47 may be omitted.

The thin film transistor substrate according to an embodiment may comprise a switching thin film transistor 530 and a driving thin film transistor 630. The switching thin film transistor 530 may receive a signal from a gate line 341 and a data line 373 and may provide a gate signal and a data signal to a corresponding pixel. A gate electrode 635 of the driving thin film transistor 630 may be electrically connected to the drain electrode 372 of the switching thin film transistor 530.

As shown in FIG. 48, the thin film transistor substrate according to an embodiment of the present invention may comprise a substrate 355, the switching thin film transistor 530 disposed on the substrate 355, the driving thin film transistor 630, and a light-emitting layer 488 electrically connected to the driving thin film transistor 630.

The switching thin film transistor 530 according to an embodiment may comprise a first depletion forming layer 315, a first gate electrode 535, a first double gate electrode 536, a first channel layer 360, a first source electrode 371, and a first drain electrode 372. The first source electrode 371 may be electrically connected to a first region of the first channel layer 360. The first source electrode 371 may be electrically connected to an upper surface of the first channel layer 360. The first drain electrode 372 may be electrically connected to a second region of the first channel layer 360.

The first drain electrode 372 may be electrically connected to the upper surface of the first channel layer 360. The first gate electrode 535 may be disposed on the first channel layer 360. The first double gate electrode 536 may be disposed under the first channel layer 360. The first depletion forming layer 315 may be disposed on between the first region and the second region of the first channel layer 360. The first depletion forming layer 315 may be disposed between the first channel layer 360 and the first gate electrode 535.

The driving thin film transistor 630 according to an embodiment may comprise a second depletion forming layer 415, a second gate electrode 635, a second double gate electrode 636, a second channel layer 460, a second source electrode 471, and a second drain electrode 472. The second source electrode 471 may be electrically connected to a first region of the second channel layer 460. The second source electrode 471 may be electrically connected to an upper surface of the second channel layer 460. The second drain electrode 472 may be electrically connected to a second region of the second channel layer 460. The second drain electrode 472 may be electrically connected to the upper surface of the second channel layer 460. The second gate electrode 635 may be disposed on the second channel layer 460. The second depletion forming layer 415 may be disposed on between the first region and the second region of the second channel layer 460. The second depletion forming layer 415 may be disposed between the second channel layer 460 and the second gate electrode 635.

The first channel layer 360 and the second channel layer 460 may be provided with, for example, a Group III-V compound semiconductor. For example, the first channel layer 360 and the second channel layer 460 may be provided with a semiconductor material having an empirical formula of $In_xAl_yGa_{1-x-y}N$ ($0 \geq x \geq 1$, $0 \geq y \geq 1$, $0 \geq x+y \geq 1$). The first channel layer 360 and the second channel layer 460 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first channel layer 360 and the second channel layer 460 may be formed of different materials.

The first channel layer 360 and the second channel layer 460 may each comprise first nitride semiconductor layers 361 and 461 and second nitride semiconductor layers 362 and 462. The first nitride semiconductor layers 361 and 461 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layers 362 and 462 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$).

According to the first channel layer 360 and the second channel layer 460 according to an embodiment, the first nitride semiconductor layers 361 and 461 may comprise a GaN semiconductor layer, and the second nitride semiconductor layers 362 and 462 may comprise an AlGaN semiconductor layer. The second nitride semiconductor layer 362 of the first channel layer 360 may be disposed between the first nitride semiconductor layer 361 and the first depletion forming layer 315. The second nitride semiconductor layer 462 of the second channel layer 460 may be disposed between the first nitride semiconductor layer 461 and the second depletion forming layer 415.

The first depletion forming layer 315 and the second depletion forming layer 415 may be provided with, for example, a group III-V compound semiconductor. For example, the first depletion forming layer 315 and the second depletion forming layer 415 may be provided with a semiconductor material having an empirical formula of $In_xAl_yGa_{1-x-y}N$ ($0 \geq x \geq 1$, $0 \geq y \geq 1$, $0 \geq x+y \geq 1$). The first depletion forming layer 315 and the second depletion forming layer 415 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first depletion forming layer 315 and the second depletion forming layer 415 may comprise a nitride semiconductor layer doped with a p-type dopant. For example, the first depletion forming layer 315 and the second depletion forming layer 415 may comprise a GaN semiconductor layer doped with a p-type dopant or an AlGaN semiconductor layer doped with a p-type dopant. The first depletion forming layer 315 and the second depletion forming layer 415 may comprise a single layer or multiple layers provided with, for example, a semiconductor material having an empirical formula of $p\text{-}Al_xGa_{1-x}N$ ($0 \geq x \geq 0.3$).

The first depletion forming layer 315 and the second depletion forming layer 415 may be provided in a thickness of 2 to 300 nm as an example. The first depletion forming layer 315 and the second depletion forming layer 415 may be provided in a thickness of at least 2 nm in order to provide a depletion region at two-dimensional electron gas (2 DEG) provided at the first channel layer 360 and the second channel layer 460. In addition, the first depletion forming layer 315 and the second depletion forming layer 415 may be provided in a thickness of 30 nm or more in consideration of a thickness deviation according to a manufacturing process. In addition, the first depletion forming layer 315 and the second depletion forming layer 415 may be provided in a thickness of 200 nm or less in consideration of a thickness deviation according to a manufacturing process. The first depletion forming layer 315 and the second depletion forming layer 415 may be provided in a thickness of 50 to 100 nm as an example.

The first depletion forming layer 315 and the second depletion forming layer 415 may comprise different materials. Substances added to the first depletion forming layer 315 and the second depletion forming layer 415, and addition amounts of the added substances may be different from each other.

The first depletion forming layer 315 and the second depletion forming layer 415 may serve to form a depletion region in a two-dimensional electron gas (2 DEG) provided in the first channel layer 360 and the second channel layer 460. The energy bandgap of a portion of the second nitride semiconductor layer 362 positioned thereunder may be increased by the first depletion forming layer 315. As a result, the depletion region of the 2 DEG may be provided at a portion of the first channel layer 360 corresponding to the first depletion forming layer 315. Therefore, a region corresponding to the position in which the first depletion forming layer 315 is disposed in the 2 DEG provided at the first channel layer 360 may be cut off. A region in which the 2 DEG is cut off at the first channel layer 360 may be referred to as a cut-off region, and, for example, a cut-off region may be formed at the second nitride semiconductor layer 362. The switching thin film transistor 530 may have a normally-off characteristic due to such a cut-off region. When a voltage equal to or higher than a threshold voltage is applied to the first gate electrode 333, the 2 DEG is generated at the cut-off region and the switching thin film transistor 530 is turned on. When a channel formed at a lower portion of the first gate electrode 333 is turned on, a current may flow via the 2 DEG formed at the first channel layer 360. Accordingly, the current flow from the first region to the second region of the first channel layer 360 may be controlled according to a voltage applied to the first gate electrode 535 and the first double gate electrode 536.

The energy bandgap of a portion of the second nitride semiconductor layer 462 positioned thereunder may be increased by the second depletion forming layer 415. As a result, the depletion region of the 2 DEG may be provided at a portion of the second channel layer 460 corresponding to the second depletion forming layer 415. Therefore, a region corresponding to the position in which the second depletion forming layer 415 is disposed in the 2 DEG provided at the second channel layer 460 may be cut off. A region in which the 2 DEG is cut off at the second channel layer 460 may be referred to as a cut-off region, and, for example, a cut-off region may be formed at the second nitride semiconductor layer 462. The driving thin film transistor 630 may have a normally-off characteristic due to such a cut-off region. When a voltage equal to or higher than a threshold voltage is applied to the second gate electrode 635, the 2 DEG is generated at the cut-off region and the driving thin film transistor 630 is turned on. When a channel formed at a lower portion of the second gate electrode 635 is turned on, a current may flow via the 2 DEG formed at the second channel layer 460. Accordingly, the current flow from the first region to the second region of the second channel layer 460 may be controlled according to a voltage applied to the second gate electrode 635 and the second double gate electrode 636.

According to an embodiment, the first double gate electrode 536 may be disposed under the first channel layer 360. The first gate electrode 535 and the first double gate electrode 536 may be disposed to be overlapped with each other in a vertical direction. According to an embodiment, the first gate electrode 535 and the first double gate electrode 536 are disposed below and above the first channel layer 360, so that a current flow in the first channel layer 360 may be controlled to be efficient and reliable. The second double gate electrode 636 may be disposed under the second channel layer 460. The second gate electrode 635 and the second double gate electrode 636 may be disposed to be overlapped with each other in a vertical direction. According to an embodiment, the second gate electrode 635 and the second double gate electrode 636 are disposed below and above the second channel layer 460, so that a current flow in the second channel layer 460 may be controlled to be efficient and reliable.

Meanwhile, in the description of the embodiment with reference to FIG. 48, it is described based on the case that all of the switching thin film transistor and the driving thin film transistor may be provided as a double gate structure, however, at least one of the switching thin film transistor and the driving thin film transistor may be provided as a double gate structure.

The substrate 355 may comprise a transparent substrate. The substrate 355 may be provided with a transparent substrate having a thickness of 0.1 mm to 3 mm as an example. In addition, the thickness of the substrate 355 may be changed according to application and size of an applied display device and may be selected within a thickness range of 0.4 to 1.1 mm. For example, the substrate 355 may be provided in a thickness of 0.6 to 0.8 mm. The substrate 355 may comprise at least one material selected from materials including silicon, glass, polyimide, and plastic.

The substrate 355 may comprise a flexible substrate. The substrate 355 is a substrate to be used in a transfer process, and serves to support the switching thin film transistor 530 and the driving thin film transistor 630. In addition, the thin film transistor substrate according to an embodiment may comprise a bonding layer 350 provided between the substrate 355 and the switching thin film transistor 530. The bonding layer 350 may be disposed between the substrate 355 and the driving thin film transistor 630.

The bonding layer 350 may comprise an organic material. The bonding layer 350 may be provided with a transparent material. The bonding layer 350 may be provided with, for example, a material having a transmittance of 70% or more. The bonding layer 350 may comprise an organic insulating material. The bonding layer 350 may comprise at least one material selected from the group consisting of acryl, benzocyclobutene (BCB), SU-8 polymer, and the like. The bonding layer 350 may be provided in a thickness of 0.5 to 6 μm as an example. A thickness of the bonding layer 350 may be different according to a type of a selected material and may be provided in a thickness of 1 to 3 μm. In addition, the bonding layer 350 may be provided in a thickness of 1.8 to 2.2 μm as an example.

The switching thin film transistor 530 according to an embodiment may comprise a first source contact portion 331 disposed on the first region of the first channel layer 360 and a first drain contact portion 332 disposed on the second region of the first channel layer 360. The first source contact portion 331 may be disposed in contact with the first region of the first channel layer 360. The first drain contact portion 332 may be disposed in contact with the second region of the first channel layer 360.

A switching thin film transistor 530 according to an embodiment may comprise a first gate wiring 341 disposed on the first gate electrode 535. The first gate wiring 341 may be electrically connected to the first gate electrode 535. A lower surface of the first gate wiring 341 may be disposed in contact with an upper surface of the first gate electrode 535.

The first source electrode 371 may be electrically connected to the first source contact portion 331. The first source electrode 371 may be disposed in contact with an upper surface of the first source contact portion 331. For example, the first source electrode 371 may be electrically connected to a first region of the first channel layer 360 via the first source contact portion 331. The first drain electrode 372 may be electrically connected to the first drain contact portion 332. The first drain electrode 372 may be disposed in contact with an upper surface of the first drain contact portion 332. For example, the first drain electrode 372 may be electrically connected to a second region of the first channel layer 360 via the first drain contact portion 332.

The driving thin film transistor 630 according to an embodiment may comprise a second source contact portion 431 disposed on the first region of the second channel layer 460 and a second drain contact portion 432 disposed on the second region of the second channel layer 460. The second source contact portion 431 may be disposed in contact with the first region of the second channel layer 460. The second drain contact portion 432 may be disposed in contact with the second region of the second channel layer 460.

A driving thin film transistor 630 according to an embodiment may comprise a second gate wiring 441 disposed on the second gate electrode 635. The second gate wiring 441 may be electrically connected to the second gate electrode 635. A lower surface of the second gate wiring 441 may be disposed in contact with an upper surface of the second gate electrode 635.

The second source electrode 471 may be electrically connected to the second source contact portion 431. The second source electrode 471 may be disposed in contact with an upper surface of the second source contact portion 431.

For example, the second source electrode 471 may be electrically connected to a first region of the second channel layer 460 via the second source contact portion 431. The second drain electrode 472 may be electrically connected to the second drain contact portion 432. The second drain electrode 472 may be disposed in contact with an upper surface of the second drain contact portion 432. For example, the second drain electrode 472 may be electrically connected to a second region of the second channel layer 460 via the second drain contact portion 432.

The first source contact portion 331 and the first drain contact portion 332 may be provided with a material in ohmic contact with the first channel layer 360. The first source contact portion 331 and the first drain contact portion 332 may comprise a material in ohmic contact with the second nitride semiconductor layer 362. The second source contact portion 431 and the second drain contact portion 432 may be provided with a material in ohmic contact with the second channel layer 460. The second source contact portion 431 and the second drain contact portion 432 may comprise a material in ohmic contact with the second nitride semiconductor layer 462. For example, the first source contact portion 331, the first drain contact portion 332, the second source contact portion 431, and the second drain contact portion 432 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source contact portion 331, the first drain contact portion 332, the second source contact portion 431 and the second drain contact portion 432 may be provided in a thickness of 0.1 to 1 μm as an example. The first source contact portion 331, the first drain contact portion 332, the second source contact portion 431, and the second drain contact portion 432 do not need to serve to spread a current as a layer for contacting with the first channel layer 360 and the second channel layer 460. Accordingly, the first source contact portion 331, the first drain contact portion 332, the second source contact portion 431, and the second drain contact portion 432 may be provided in a thickness of 1 μm or less.

The first gate electrode 535 may be provided with a material in ohmic contact with the first depletion forming layer 315. The second gate electrode 635 may be provided with a material in ohmic contact with the second depletion forming layer 415. For example, the first gate electrode 535 and the second gate electrode 635 may be provided with a material in ohmic contact with a p-type nitride layer. The first gate electrode 535 and the second gate electrode 635 may comprise a single layer or multiple layers comprising at least one material selected from the group consisting of tungsten (W), tungsten silicon (WSi2), titanium nitride (TiN), tantalum (Ta), tantalum nitride (TaN), palladium (Pd), nickel (Ni), and platinum (Pt). The first gate electrode 535 and the second gate electrode 635 may be provided in a thickness of 0.1 to 1 μm as an example. The first gate electrode 535 and the second gate electrode 635 do not need to serve to spread a current as a layer for contacting with the first depletion forming layer 315 and the second depletion forming layer 415. Accordingly, the first gate electrode 535 and the second gate electrode 635 may be provided in a thickness of 1 μm or less.

The first gate wiring 341 and the second gate wiring 441 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first gate wiring 341 and the second gate wiring 441 may be provided in a thickness of 0.1 to 3 μm as an example. The first gate wiring 341 and the second gate wiring 441 serve to sequentially apply a voltage to a plurality of transistors. Accordingly, the first gate wiring 341 and the second gate wiring 441 may be provided to be thicker than a thickness of the first gate electrode 535 and the second gate electrode 635.

The first source electrode 371, the first drain electrode 372, the second source electrode 471, and the second drain electrode 472 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source electrode 371, the first drain electrode 372, the second source electrode 471, and the second drain electrode 472 may be provided in a thickness of 0.1 to 3 μm as an example. The first source electrode 371 and the second source electrode 471 serve to sequentially apply a voltage to the plurality of transistors. Accordingly, the first source electrode 371 and the second source electrode 471 may be provided to be thicker than a thickness of the first source contact portion 331 and the second source contact portion 431. Also, the first drain electrode 372 and the second drain electrode 472 may be provided to be thicker than a thickness of the first drain contact portion 332 and the second drain contact portion 432.

The thin film transistor substrate according to an embodiment may comprise a first passivation film 321 and 421 disposed on the first channel layer 360 and the second channel layer 460. The first passivation film 321 and 421 may be disposed on the second nitride semiconductor layer 362 of the first channel layer 360 and the second nitride semiconductor layer 462 of the second channel layer 460. A lower surface of the first passivation film 321 and 421 may be disposed in contact with an upper surface of the second nitride semiconductor layer 362 of the first channel layer 360 and the second nitride semiconductor layer 462 of the second channel layer 460. The first passivation film 321 and 421 may be disposed on the first depletion forming layer 315 and the second depletion forming layer 415. The first passivation film 321 and 421 may be disposed at a side surface of the first depletion forming layer 315 and the second depletion forming layer 415. The first passivation film 321 and 421 may be disposed so as to surround the side surface of the first depletion forming layer 315 and the second depletion forming layer 415.

According to an embodiment, the first source contact portion 331 may be disposed to pass through the first passivation film 321. The first source contact portion 331 may be disposed to be surrounded by the first passivation film 321. The first source contact portion 331 may be disposed to pass through the first passivation film 321 and provided in contact with the first region of the first channel layer 360. The first drain contact portion 332 may be disposed to pass through the first passivation film 321. The first drain contact portion 332 may be disposed to be surrounded by the first passivation film 321. The first drain contact portion 332 may be disposed to pass through the first passivation film 321 and provided in contact with the second region of the first channel layer 360.

According to an embodiment, the second source contact portion 431 may be disposed to pass through the first passivation film 421. The second source contact portion 431 may be disposed to be surrounded by the first passivation film 421. The second source contact portion 431 may be disposed to pass through the first passivation film 421 and provided in contact with the first region of the second channel layer 460. The second drain contact portion 432 may be disposed to pass through the first passivation film 421. The second drain contact portion 432 may be disposed to be surrounded by the first passivation film 421. The second drain contact portion 432 may be disposed to pass through the first passivation film 421 and provided in contact with the second region of the second channel layer 460.

The first passivation film 321 and 421 may be provided with an insulating material. The first passivation film 321 and 421 may comprise a single layer or multiple layers comprising at least one material of a silicon-based oxide, a silicon-based nitride, a metal oxide comprising $Al_2O_3$, and an organic insulating material as an example.

According to an embodiment, a second passivation film 322 may be disposed on the substrate 355 and the first passivation film 321 and 421. The first gate electrode 535 may be disposed to pass through at least one of the first passivation film 321 and the second passivation film 322. For example, the first gate electrode 535 may be disposed to pass through the first passivation film 321 and the second passivation film 322. The first gate electrode 535 may pass through at least one of the first passivation film 321 and the second passivation film 322 and be disposed in contact with the first depletion forming layer 315. For example, the first gate electrode 535 may pass through the first passivation film 321 and the second passivation film 322 and be disposed in contact with the first depletion forming layer 315. The first gate wiring 341 may be disposed on the second passivation film 322 and be electrically connected to the first gate electrode 535. The second gate electrode 635 may be disposed to pass through at least one of the first passivation film 321 and the second passivation film 322. For example, the second gate electrode 635 may be disposed to pass through the first passivation film 321 and the second passivation film 322. The second gate electrode 635 may pass through at least one of the first passivation film 321 and the second passivation film 322 and be disposed in contact with the second depletion forming layer 415. For example, the second gate electrode 635 may pass through the first passivation film 321 and the second passivation film 322 and be disposed in contact with the second depletion forming layer 415. The second gate wiring 441 may be disposed on the second passivation film 322 and be electrically connected to the second gate electrode 635.

The second passivation film 322 may be provided with an insulating material. The second passivation film 322 may comprise a single layer or multiple layers including at least one material of a silicon-based oxide, a silicon-based nitride, a metal oxide including $Al_2O_3$, and an organic insulating material as an example.

According to an embodiment, a third passivation film 323 may be disposed on the second passivation film 322. The third passivation film 323 may be disposed on the second passivation film 322, the first gate wiring 341, and the second gate wiring 342. The first gate wiring 341 may be disposed in contact with the first gate electrode 535 thereon and provided to be surrounded by the third passivation film 323. The second gate wiring 441 may be disposed in contact with the second gate electrode 635 thereon and provided to be surrounded by the third passivation film 323.

The first source electrode 371 may pass through the second passivation film 322 and the third passivation film 323 and be electrically connected to the first source contact portion 331. The first source electrode 371 may comprise a first region disposed on the third passivation film 323. The first source electrode 371 may comprise a second region passing through the third passivation film 323 and the second passivation film 322. The first drain electrode 372 may pass through the second passivation film 322 and the third passivation film 323 and be electrically connected to the first drain contact portion 332. The first drain electrode 372 may comprise a first region disposed on the third passivation film 323. The first drain electrode 372 may comprise a second region passing through the third passivation film 323 and the second passivation film 322.

The second source electrode 471 may pass through the second passivation film 322 and the third passivation film 323 and be electrically connected to the second source contact portion 431. The second source electrode 471 may comprise a first region disposed on the third passivation film 323. The second source electrode 471 may comprise a second region passing through the third passivation film 323 and the second passivation film 322. The second drain electrode 472 may pass through the second passivation film 322 and the third passivation film 323 and be electrically connected to the second drain contact portion 432. The second drain electrode 472 may comprise a first region disposed on the third passivation film 323. The second drain electrode 472 may comprise a second region passing through the third passivation film 323 and the second passivation film 322.

The first double gate electrode 536 may be disposed under the first channel layer 360. The first double gate electrode 536 may be disposed under the first nitride semiconductor layer 361. A sixth passivation film 526 may be disposed under the first double gate electrode 536 and the first channel layer 360. The first double gate electrode 536 may be disposed in contact with a lower surface of the first channel layer 360. The first double gate electrode 536 may be in Schottky contact with the first nitride semiconductor layer 361. The first double gate electrode 536 may comprise a single layer or multiple layers including at least one material selected from the group consisting of nickel (Ni), platinum (Pt), gold (Au), and palladium (Pd), or an alloy thereof. For example, the Schottky contact may be implemented by plasma treatment of the first channel layer 360.

The second double gate electrode 636 may be disposed under the second channel layer 460. The second double gate electrode 636 may be disposed under the first nitride semiconductor layer 461. A sixth passivation film 626 may be disposed under the second double gate electrode 636 and the second channel layer 460. The second double gate electrode 636 may be disposed in contact with a lower surface of the second channel layer 460. The second double gate electrode 636 may be in Schottky contact with the first nitride semiconductor layer 461. The second double gate electrode 636 may comprise a single layer or multiple layers including at least one material selected from the group consisting of nickel (Ni), platinum (Pt), gold (Au), and palladium (Pd), or an alloy thereof. For example, the Schottky contact may be implemented by plasma treatment of the second channel layer 460.

The first gate electrode 535 and the first double gate electrode 536 may be electrically connected. The second gate electrode 635 and the second double gate electrode 636 may be electrically connected. The second drain electrode 372 of the switching thin film transistor 530 and the second gate electrode 635 of the driving thin film transistor 630 may be electrically connected.

The third passivation film 323 may comprise an insulating material. The third passivation film 323 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a fourth passivation film 324 disposed on the third passivation film 323. The fourth passivation film 324 may be disposed on the first source electrode 371, the first drain electrode 372, the second source electrode 471, and the second drain electrode 472.

The fourth passivation film 324 may comprise a single layer or multiple layers comprising at least one material of a silicon-based oxide, a silicon-based nitride, a metal oxide comprising $Al_2O_3$, and an organic insulating material as an example.

The thin film transistor substrate according to an embodiment may comprise a lower electrode 486 disposed on the driving thin film transistor 630. The lower electrode 486 may be electrically connected to the driving thin film transistor 630. The lower electrode 486 may be electrically connected to the second drain electrode 472 of the driving thin film transistor 630. The lower electrode 486 may be disposed on the fourth passivation film 324. The lower electrode 486 may be electrically connected to the second drain electrode 472 through a contact hole provided in the fourth passivation film 324. A lower surface of the lower electrode 486 may be disposed in contact with an upper surface of the second drain electrode 472.

In addition, the thin film transistor substrate according to an embodiment may comprise a fifth passivation film 325 disposed on the fourth passivation film 324. The light-emitting layer 488 may be disposed on the lower electrode 486. An upper electrode 487 may be disposed on the light-emitting layer 488. The light-emitting layer 488 and the upper electrode 487 may be disposed on the fifth passivation film 325. A first region of the light-emitting layer 488 may be disposed on the fifth passivation film 325, and a second region of the light-emitting layer 488 may be disposed in contact with an upper surface of the lower electrode 486 through a contact hole provided in the fifth passivation film 325. The light-emitting layer 488 may emit light of any one of red, green, blue, and white as an example. The light-emitting layer 488 may be provided with an organic material as an example.

The lower electrode 486 and the upper electrode 487, for example, may comprise one material selected from ITO, ITO/Ag, ITO/Ag/ITO, and ITO/Ag/IZO, or an alloy containing the material. The lower electrode 486 and the upper electrode 487 may comprise different materials. One of the upper electrode 486 and the lower electrode 487 may be formed of a transparent electrode, and light emitted from the light-emitting layer 488 in a direction of the transparent electrode may be emitted to the outside.

The thin film transistor substrate according to an embodiment may comprise a first black matrix 546 between the substrate 355 and the first channel layer 360. The first black matrix 546 may be disposed between the substrate 355 and the sixth passivation film 526. The first black matrix 546 may be disposed between the substrate 355 and the first double gate electrode 536. The first black matrix 546 may be disposed in a shape corresponding to a shape of a lower portion of the sixth passivation film 526. A width of the first channel layer 360 may be provided to be equal to a width of the first black matrix 546. The first black matrix 546 may be provided in a single layer or multiple layers including at least one material selected from among a Si-based material, a Ga-based material, an Al-based material, and an organic material. The first black matrix 546 may block light incident on the switching thin film transistor 530. Accordingly, it is possible to prevent the switching thin film transistor 530 from deteriorating due to a photo current or the like.

The thin film transistor substrate according to an embodiment may comprise a second black matrix 646 between the substrate 355 and the second channel layer 460. The second black matrix 646 may be disposed between the substrate 355 and the sixth passivation film 626. The second black matrix 646 may be disposed between the substrate 355 and the second double gate electrode 636. The second black matrix 646 may be disposed in a shape corresponding to a shape of a lower portion of the sixth passivation film 626. A width of the second channel layer 460 may be provided to be equal to a width of the second black matrix 646. The second black matrix 646 may be provided in a single layer or multiple layers including at least one material selected from among a Si-based material, a Ga-based material, an Al-based material, and an organic material. The second black matrix 646 may block light incident on the driving thin film transistor 630. Accordingly, it is possible to prevent the driving thin film transistor 630 from deteriorating due to a photo current or the like.

According to an embodiment, the bonding layer 350 may be disposed between the substrate 355 and the firsts channel layer 360. The bonding layer 350 may be disposed between the substrate 355 and the first black matrix 546. The bonding layer 350 may be disposed between the substrate 355 and the second channel layer 460. The bonding layer 350 may be disposed between the substrate 355 and the second black matrix 646. For example, the bonding layer 350 may be disposed on an entire region of the substrate 355. The bonding layer 350 may be disposed in contact with the second passivation film 322. An upper surface of the bonding layer 350 and a lower surface of the second passivation film 322 may be disposed in contact with each other. For example, in a region where the first black matrix 346 and the second black matrix are not provided, the upper surface of the first bonding layer 350 and the lower surface of the second passivation film 322 may be disposed in direct contact with each other.

In addition, according to an embodiment, a recess corresponding to a height and a width of the first double gate electrode 536 and the second double gate electrode 636 may be provided on the bonding layer 350. A part of the sixth passivation film 526 and 626 may be disposed in at least a part of an upper portion and a side surface so as to correspond to a cross sectional shape of the first double gate electrode 536 and the second double gate electrode 636, and provided in the recessed region. The first black matrix 546 may be disposed in a shape corresponding to a shape of a lower portion of the sixth passivation film 526, and at least a part of the first black matrix 546 may be disposed in the recessed region. The second black matrix 646 may be disposed in a shape corresponding to a shape of a lower portion of the sixth passivation film 626, and at least a part of the second black matrix 646 may be disposed in the recessed region. At least a part of the first double gate electrode 536 and the second double gate electrode 636 may be disposed in the recessed region. It is possible to minimize an increase in a thickness of the thin film transistor substrate according to providing the first double gate electrode 536 and the second double gate electrode 636 with such a structure.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 49:
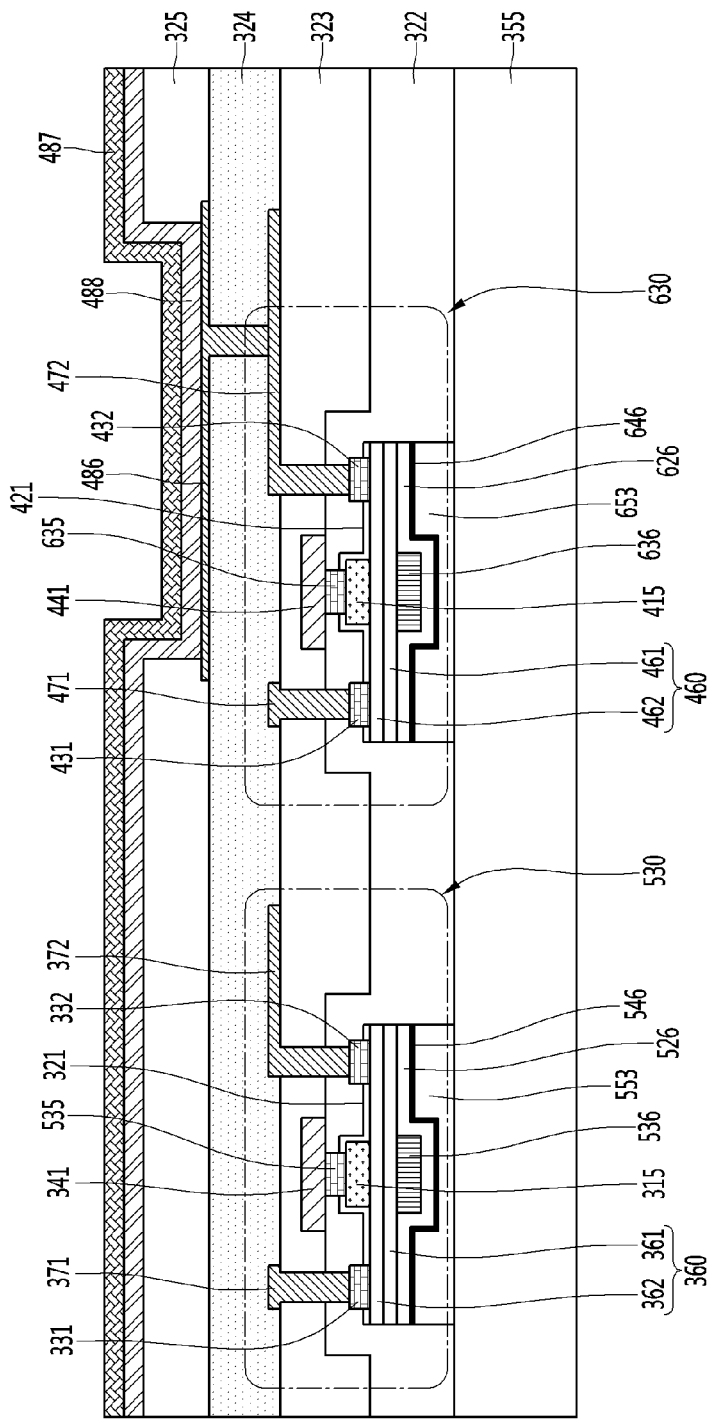
FIG. 49 is a view illustrating still another example of a thin film transistor substrate according to an embodiment of the present invention.

FIG. 49 is a view illustrating still another example of a thin film transistor substrate according to an embodiment of the present invention. Referring to FIG. 49, in the description of the thin film transistor substrate according to an embodiment, description of a part overlapping with those described with reference to FIGS. 1 to 48 may be omitted. An embodiment shown in FIG. 49 differs from that of each of FIG. 48 in the bonding layer structure.

As shown in FIG. 49, a first bonding layer 553 and a second bonding layer 653 may be provided on the substrate 355. The first bonding layer 553 may be disposed between the substrate 355 and the first black matrix 546. For example, a width of the first bonding layer 553 may be provided to be equal to a width of the first black matrix 546. For example, the width of the first bonding layer 553 may be provided to be equal to a width of the first channel layer 360. The second bonding layer 653 may be disposed between the substrate 355 and the second black matrix 646. For example, a width of the second bonding layer 653 may be provided to be equal to a width of the second black matrix 646. For example, the width of the second bonding layer 653 may be provided to be equal to a width of the second channel layer 460.

According to an embodiment, a second passivation film 322 may be disposed on the substrate 355. A lower surface of the second passivation film 322 may be disposed in contact with an upper surface of the substrate 355. In a region where the first bonding layer 553 is not provided, the second passivation film 322 may be disposed in direct contact with the substrate 355. In a region where the second bonding layer 653 is not provided, the second passivation film 322 may be disposed in direct contact with the substrate 355.

In addition, according to an embodiment, a recess corresponding to a height and a width of the first double gate electrode 536 and the second double gate electrode 636 may be provided on the first bonding layer 526 and the second bonding layer 626. A part of the sixth passivation film 526 and 626 may be disposed in at least a part of an upper portion and a side surface so as to correspond to a cross sectional shape of the first double gate electrode 536 and the second double gate electrode 636, and provided in the recessed region. The first black matrix 546 may be disposed in a shape corresponding to a shape of a lower portion of the sixth passivation film 526, and at least a part of the first black matrix 546 may be disposed in the recessed region. The second black matrix 646 may be disposed in a shape corresponding to a shape of a lower portion of the sixth passivation film 626, and at least a part of the second black matrix 646 may be disposed in the recessed region. At least a part of the first double gate electrode 536 and the second double gate electrode 636 may be disposed in the recessed region. It is possible to minimize an increase in a thickness of the thin film transistor substrate according to providing the first double gate electrode 536 and the second double gate electrode 636 with such a structure.

As described above, according to the embodiment shown in FIG. 49, as compared with the embodiment shown in FIG. 48, since the second passivation film 322 and the substrate 355 may be disposed in direct contact with each other, a layer provided between the second passivation film 322 and the substrate 355 (for example, an illustrated bonding layer in FIG. 48) may be eliminated. Accordingly, according to the embodiment, since an interface between different material layers is reduced on a light path where light travels, light loss due to reflection/refraction at the interface may be reduced.

The first bonding layer 553 and the second bonding layer 653 according to an embodiment may comprise at least one of a reflective layer, a metal bonding layer, an organic bonding layer, and an insulating layer as an example. The reflective layer may be disposed on the substrate 355, the metal bonding layer may be disposed on the reflective layer, and the insulating layer may be disposed on the metal bonding layer. For example, the first bonding layer 553 and the second bonding layer 653 may comprise at least one of the metal bonding layer and the organic bonding layer, and the reflective layer and the insulating layer may be comprised selectively.

The insulating layer may complement the leakage characteristics of the first channel layer 360 and the second channel layer 460. For example, the insulating layer may comprise a single layer or multiple layers including at least one material of a silicon-based oxide, a silicon-based nitride, a metal oxide including $Al_2O_3$, and an organic insulating material as an example.

The metal bonding layer or the organic bonding layer may be provided for bonding with the substrate 355 disposed thereunder. For example, the metal bonding layer may comprise at least one material selected from the group consisting of gold (Au), tin (Sn), indium (In), nickel (Ni), silver (Ag), and copper (Cu), or an alloy thereof. For example, the organic bonding layer may comprise at least one material selected from the group consisting of acryl, benzocyclobutene (BCB), SU-8 polymer, and the like.

The reflective layer may reduce light absorption in the bonding layer. For example, the reflective layer may comprise at least one material selected from the group consisting of aluminum (Al), silver (Ag), and rhodium (Rh), or an alloy thereof. The reflective layer may be provided with a material having a reflection characteristic of more than 60% as an example.

Meanwhile, according to an embodiment, for example, when the first bonding layer 553 and the second bonding layer 653 comprise the metal bonding layer and the reflective layer, the first black matrix 546 and the second black matrix 646 may be omitted.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 50:
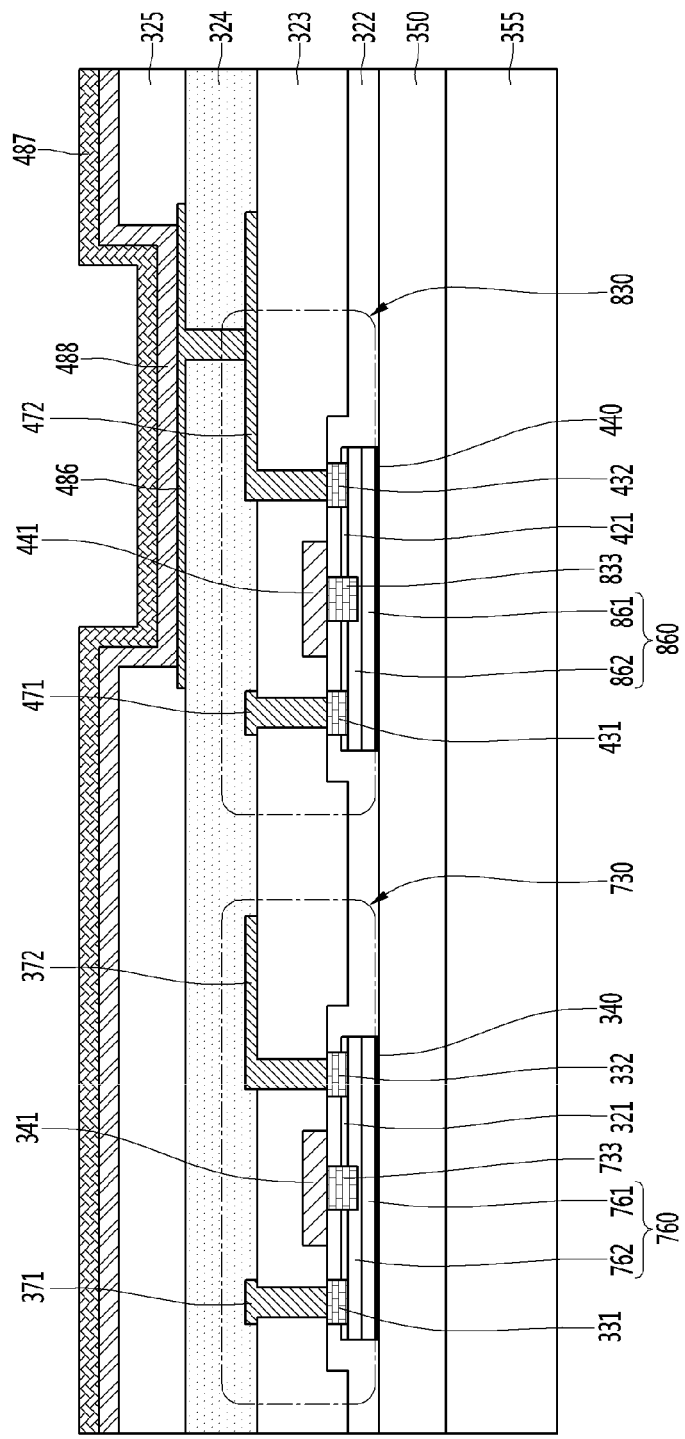
FIG. 50 is a view illustrating still another example of a thin film transistor substrate according to an embodiment of the present invention.

FIG. 50 is a view illustrating still another example of a thin film transistor substrate according to an embodiment of the present invention. FIG. 50 is a cross-sectional view taken along line D-D of the thin film transistor substrate shown in FIG. 42.

The thin film transistor substrate shown in FIG. 50 is an embodiment to which a thin film transistor having a gate electrode disposed in a recessed region of a channel layer is applied, and description of contents overlapping with those described with reference to FIGS. 1 to 49 may be omitted.

The thin film transistor substrate according to an embodiment may comprise a switching thin film transistor 730 and a driving thin film transistor 830. The switching thin film transistor 730 may receive a signal from a first gate line 341 and a first data line 373 and may provide a gate signal and a data signal to a corresponding pixel. A second gate electrode 833 of the driving thin film transistor 830 may be electrically connected to the first drain electrode 372 of the switching thin film transistor 830.

As shown in FIG. 50, the thin film transistor substrate according to an embodiment of the present invention may comprise a substrate 355, the switching thin film transistor 730 disposed on the substrate 355, the driving thin film transistor 830, and a light-emitting layer 488 electrically connected to the driving thin film transistor 830.

The switching thin film transistor 730 according to an embodiment may comprise a first gate electrode 733, a first channel layer 760, a first source electrode 371, and a first drain electrode 372. The first source electrode 371 may be electrically connected to a first region of the first channel layer 760. The first source electrode 371 may be electrically connected to an upper surface of the first channel layer 760. The first drain electrode 372 may be electrically connected to a second region of the first channel layer 760. The first drain electrode 372 may be electrically connected to the upper surface of the first channel layer 760. The first gate electrode 733 may be disposed on the first channel layer 760.

The first channel layer 760 may comprise a recessed region recessed in a downward direction in the upper surface thereof. The first gate electrode 733 may be disposed in the recessed region of the first channel layer 760.

The driving thin film transistor 830 according to an embodiment may comprise a second gate electrode 833, a second channel layer 860, a second source electrode 471, and a second drain electrode 472. The second source electrode 471 may be electrically connected to a first region of the second channel layer 860. The second source electrode 471 may be electrically connected to an upper surface of the second channel layer 860. The second drain electrode 472 may be electrically connected to a second region of the second channel layer 860. The second drain electrode 472 may be electrically connected to the upper surface of the second channel layer 860. The second gate electrode 833 may be disposed on the second channel layer 860.

The second channel layer 860 may comprise a recessed region recessed in a downward direction in the upper surface thereof. The second gate electrode 833 may be disposed in the recessed region of the second channel layer 860.

The structures of the switching thin film transistor 730 and the driving thin film transistor 830 may be similar to each other, and in the description of the driving thin film transistor 830, description of contents overlapping with those described with reference to the switching thin film transistor 730 may be omitted.

The first channel layer 760 and the second channel layer 860 may be provided with, for example, a Group III-V compound semiconductor. For example, the first channel layer 760 and the second channel layer 860 may be provided with a semiconductor material having an empirical formula of $In_xAl_yGa_{1-x-y}N$ ($0 \geq x \geq 1$, $0 \geq y \geq 1$, $0 \geq x+y \geq 1$). The first channel layer 760 and the second channel layer 860 may comprise a single layer or multiple layers selected from, for example, GaN, AlN, AlGaN, InGaN, InN, InAlGaN, AlInN, AlGaAs, GaP, GaAs, GaAsP, AlGaInP and so on. The first channel layer 760 and the second channel layer 860 may be formed of different materials.

The first channel layer 760 and the second channel layer 860 may each comprise first nitride semiconductor layers 761 and 861 and second nitride semiconductor layers 762 and 862. The first nitride semiconductor layers 761 and 861 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). The second nitride semiconductor layers 762 and 862 may be provided with, for example, a semiconductor material having an empirical formula of $In_xAl_yGa_{1-x-y}N$ ($0 \geq x \geq 1$, $0 \geq y \geq 1$, $0 \geq x+y \geq 1$). A recessed region recessed downwardly may be provided in an upper surface of the second nitride semiconductor layer 762 and 862. The first gate electrode 733 may be disposed in the recessed region of the second nitride semiconductor layer 762. An upper surface of the first gate electrode 733 may be disposed higher than the highest surface of the second nitride semiconductor layer 762. The first gate electrode 733 may be in Schottky contact with the second nitride semiconductor layer 762. The second gate electrode 833 may be disposed in the recessed region of the second nitride semiconductor layer 862. An upper surface of the second gate electrode 833 may be disposed higher than the highest surface of the second nitride semiconductor layer 862. The second gate electrode 833 may be in Schottky contact with the second nitride semiconductor layer 862. According to the first channel layer 760 and the second channel layer 860 according to an embodiment, the first nitride semiconductor layer 761, 861 may comprise a GaN semiconductor layer, and the second nitride semiconductor layer 762 and 862 may comprise an AlGaN semiconductor layer.

The substrate 355 may comprise a transparent substrate. The substrate 355 may be provided with a transparent substrate having a thickness of 0.1 mm to 3 mm as an example. In addition, the thickness of the substrate 355 may be changed according to application and size of an applied display device and may be selected within a thickness range of 0.4 to 1.1 mm. For example, the substrate 355 may be provided in a thickness of 0.6 to 0.8 mm. The substrate 355 may comprise at least one material selected from materials including silicon, glass, polyimide, and plastic. The substrate 355 may comprise a flexible substrate.

The substrate 355 is a substrate to be used in a transfer process, and serves to support the switching thin film transistor 730 and the driving thin film transistor 830. In addition, the thin film transistor substrate according to an embodiment may comprise a bonding layer 350 provided between the substrate 355 and the switching thin film transistor 730. The bonding layer 350 may be disposed between the substrate 355 and the driving thin film transistor 830.

The bonding layer 350 may comprise an organic material. The bonding layer 350 may be provided with a transparent material. The bonding layer 350 may be provided with, for example, a material having a transmittance of 70% or more. The bonding layer 350 may comprise an organic insulating material. The bonding layer 350 may comprise at least one material selected from the group consisting of acryl, benzocyclobutene (BCB), SU-8 polymer, and the like. The bonding layer 350 may be provided in a thickness of 0.5 to 6 μm as an example. A thickness of the bonding layer 350 may be different according to a type of a selected material and may be provided in a thickness of 1 to 3 μm. In addition, the bonding layer 350 may be provided in a thickness of 1.8 to 2.2 μm as an example.

The switching thin film transistor 730 according to an embodiment may comprise a first source contact portion 331 disposed on the first region of the first channel layer 760 and a first drain contact portion 332 disposed on the second region of the first channel layer 760. The first source contact portion 331 may be disposed in contact with the first region of the first channel layer 760. The first drain contact portion 332 may be disposed in contact with the second region of the first channel layer 760.

A switching thin film transistor 730 according to an embodiment may comprise a first gate wiring 341 disposed on the first gate electrode 733. The first gate wiring 341 may be electrically connected to the first gate electrode 733. A lower surface of the first gate wiring 341 may be disposed in contact with an upper surface of the first gate electrode 733.

The first source electrode 371 may be electrically connected to the first source contact portion 331. The first source electrode 371 may be disposed in contact with an upper surface of the first source contact portion 331. For example, the first source electrode 371 may be electrically connected to a first region of the first channel layer 760 via the first source contact portion 331. The first drain electrode 372 may be electrically connected to the first drain contact portion 332. The first drain electrode 372 may be disposed in contact with an upper surface of the first drain contact portion 332. For example, the first drain electrode 372 may be electrically connected to a second region of the first channel layer 760 via the first drain contact portion 332.

The driving thin film transistor 830 according to an embodiment may comprise a second source contact portion 431 disposed on the first region of the second channel layer 860 and a second drain contact portion 432 disposed on the second region of the second channel layer 860. The second source contact portion 431 may be disposed in contact with the first region of the second channel layer 860. The second drain contact portion 432 may be disposed in contact with the second region of the second channel layer 860.

A driving thin film transistor 830 according to an embodiment may comprise a second gate wiring 441 disposed on the second gate electrode 433. The second gate wiring 441 may be electrically connected to the second gate electrode 433. A lower surface of the second gate wiring 441 may be disposed in contact with an upper surface of the second gate electrode 433.

The second source electrode 471 may be electrically connected to the second source contact portion 431. The second source electrode 471 may be disposed in contact with an upper surface of the second source contact portion 431. For example, the second source electrode 471 may be electrically connected to a first region of the second channel layer 860 via the second source contact portion 431. The second drain electrode 472 may be electrically connected to the second drain contact portion 432. The second drain electrode 472 may be disposed in contact with an upper surface of the second drain contact portion 432. For example, the second drain electrode 472 may be electrically connected to a second region of the second channel layer 860 via the second drain contact portion 432.

The first source contact portion 331 and the first drain contact portion 332 may be provided with a material in ohmic contact with the first channel layer 760. The first source contact portion 331 and the first drain contact portion 332 may comprise a material in ohmic contact with the second nitride semiconductor layer 762. The second source contact portion 431 and the second drain contact portion 432 may be provided with a material in ohmic contact with the second channel layer 860. The second source contact portion 431 and the second drain contact portion 432 may comprise a material in ohmic contact with the second nitride semiconductor layer 862. For example, the first source contact portion 331, the first drain contact portion 332, the second source contact portion 431, and the second drain contact portion 432 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source contact portion 331, the first drain contact portion 332, the second source contact portion 431, and the second drain contact portion 432 may be provided in a thickness of 0.1 to 1 μm as an example. The first source contact portion 331, the first drain contact portion 332, the second source contact portion 431, and the second drain contact portion 432 do not need to serve to spread a current as a layer for contacting with the first channel layer 760 and the second channel layer 860. Accordingly, the first source contact portion 331, the first drain contact portion 332, the second source contact portion 431, and the second drain contact portion 432 may be provided in a thickness of 1 μm or less.

The first gate electrode 733 may be provided as a material in Schottky contact with the first channel layer 760. The first gate electrode 733 may be provided with a material which is in a Schottky contact with the second nitride semiconductor layer 762. The first gate electrode 733 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the first channel layer 760. In the plasma treatment, for example, fluorine (F) ion treatment may be applied. Accordingly, the switching thin film transistor 730 according to an embodiment may be provided with a threshold voltage by the Schottky contact and may have a normally off characteristic. When a voltage equal to or higher than the threshold voltage is applied to the first gate electrode 733, a channel formed under the first gate electrode 733 is turned on to allow a current to flow the first channel layer 760.

The second gate electrode 833 may be provided as a material in Schottky contact with the second channel layer 860. The second gate electrode 833 may be provided with a material which is in a Schottky contact with the second nitride semiconductor layer 862. The second gate electrode 833 may comprise a single layer or multiple layers comprising at least one material selected from the group consisting of nickel (Ni), platinum (Pt), gold (Au), and palladium (Pd), or an alloy thereof. For example, the Schottky contact may be implemented by plasma treatment of the second channel layer 860. In the plasma treatment, for example, fluorine (F) ion treatment may be applied. Accordingly, the driving thin film transistor 830 according to an embodiment may be provided with a threshold voltage by the Schottky contact and may have a normally off characteristic. When a voltage equal to or higher than the threshold voltage is applied to the second gate electrode 833, a channel formed under the second gate electrode 833 is turned on to allow a current to flow the second channel layer 860.

Meanwhile, according to the first channel layer 760 according to an embodiment, the first nitride semiconductor layer 761 may comprise a GaN semiconductor layer, and the second nitride semiconductor layer 762 may comprise an AlGaN semiconductor layer. As a thickness of the second nitride semiconductor layer 762 is larger, the two-dimensional electron gas (2 DEG) is well formed, and thus it is difficult to make a normally off characteristic. In addition, when the thickness of the second nitride semiconductor layer 762 is too thin, there is a problem that gate leakage may be increased. Accordingly, it may be desirable that the thickness of the second nitride semiconductor layer 762 disposed under the recessed region is provided in a thickness of 2 to 10 nm. In addition, as a method for reducing gate leakage, an insulator may be disposed between the gate electrode 733 and the second nitride semiconductor layer 762 to be provided in a Metal-Insulator-Semiconductor (MIS) structure. For example, the second nitride semiconductor layer 762 in a region where the recess is not formed may be provided in a thickness of 15 to 25 nm. In addition, the recess may be provided in a width of 1.5 to 2.5 μm as an example.

Meanwhile, according to the second channel layer 860 according to an embodiment, the first nitride semiconductor layer 861 may comprise a GaN semiconductor layer, and the second nitride semiconductor layer 862 may comprise an AlGaN semiconductor layer. As a thickness of the second nitride semiconductor layer 862 is larger, the two-dimensional electron gas (2 DEG) is well formed, and thus it is difficult to make a normally off characteristic. In addition, when the thickness of the second nitride semiconductor layer 862 is too thin, there is a problem that gate leakage may be increased. Accordingly, it may be desirable that the thickness of the second nitride semiconductor layer 862 disposed under the recessed region is provided in a thickness of 2 to 10 nm. In addition, as a method for reducing gate leakage, an insulator may be disposed between the gate electrode 833 and the second nitride semiconductor layer 862 to be provided in a Metal-Insulator-Semiconductor (MIS) structure. For example, the second nitride semiconductor layer 862 in a region where the recess is not formed may be provided in a thickness of 15 to 25 nm. In addition, the recess may be provided in a width of 1.5 to 2.5 μm as an example.

The first gate wiring 341 and the second gate wiring 441 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first gate wiring 341 and the second gate wiring 441 may be provided in a thickness of 0.1 to 3 μm as an example. Since the first gate wiring 341 and the second gate wiring 441 serves to sequentially apply a voltage to a plurality of transistors, the first gate wiring 341 and the second gate wiring 441 may be provided to be thicker than a thickness of the first gate electrode 733 and the second gate electrode 833.

The first source electrode 371, the first drain electrode 372, the second source electrode 471, and the second drain electrode 472 may comprise a single layer or multiple layers comprising at least one material selected from the group consisting of aluminum (Al), an aluminum alloy (Al alloy), tungsten (W), copper (Cu), a copper alloy (Cu alloy), molybdenum (Mo), silver (Ag), a silver alloy (Ag alloy), gold (Au), a gold alloy (Au alloy), chromium (Cr), titanium (Ti), a titanium alloy (Ti alloy), molybdenum tungsten (MoW), molybdenum titanium (MoTi), and copper/molybdenum titanium (Cu/MoTi). The first source electrode 371, the first drain electrode 372, the second source electrode 471, and the second drain electrode 472 may be provided in a thickness of 0.1 to 3 μm as an example. Since the first source electrode 371 and the second source electrode 471 serve to sequentially apply a voltage to the plurality of transistors, the first source electrode 371 and the second source electrode 471 may be provided to be thicker than a thickness of the first source contact portion 331 and the second source contact portion 431. Also, the first drain electrode 372 and the second drain electrode 472 may be provided to be thicker than a thickness of the first drain contact portion 332 and the second drain contact portion 432.

The thin film transistor substrate according to an embodiment may comprise a first passivation film 321 and 421 disposed on the first channel layer 760 and the second channel layer 860. The first passivation film 321 and 421 may be disposed on the second nitride semiconductor layer 762 of the first channel layer 760 and the second nitride semiconductor layer 862 of the second channel layer 860. A lower surface of the first passivation film 321 and 421 may be disposed in contact with an upper surface of the second nitride semiconductor layer 762 of the first channel layer 760 and the second nitride semiconductor layer 862 of the second channel layer 860.

According to an embodiment, the first source contact portion 331 may be disposed to pass through the first passivation film 321. The first source contact portion 331 may be disposed to be surrounded by the first passivation film 321. The first source contact portion 331 may be disposed to pass through the first passivation film 321 and provided in contact with the first region of the first channel layer 760. The first drain contact portion 332 may be disposed to pass through the first passivation film 321. The first drain contact portion 332 may be disposed to be surrounded by the first passivation film 321. The first drain contact portion 332 may be disposed to pass through the first passivation film 321 and provided in contact with the second region of the first channel layer 760.

According to an embodiment, the second source contact portion 431 may be disposed to pass through the first passivation film 421. The second source contact portion 431 may be disposed to be surrounded by the first passivation film 421. The second source contact portion 431 may be disposed to pass through the first passivation film 421 and provided in contact with the first region of the second channel layer 860. The second drain contact portion 432 may be disposed to pass through the first passivation film 421. The second drain contact portion 432 may be disposed to be surrounded by the first passivation film 421. The second drain contact portion 432 may be disposed to pass through the first passivation film 421 and provided in contact with the second region of the second channel layer 860.

The first passivation film 321 and 421 may be provided with an insulating material. The first passivation film 321 and 421 may comprise a single layer or multiple layers comprising at least one material of a silicon-based oxide, a silicon-based nitride, a metal oxide comprising $Al_2O_3$, and an organic insulating material as an example.

According to an embodiment, a second passivation film 322 may be disposed on the substrate 355 and the first passivation film 321 and 421. The first gate electrode 733 may be disposed to pass through at least one of the first passivation film 321 and the second passivation film 322. For example, the first gate electrode 733 may be disposed to pass through the first passivation film 321 and the second passivation film 322. The first gate electrode 733 may pass through at least one of the first passivation film 321 and the second passivation film 322 and be disposed in contact with the first channel layer 760. For example, the first gate electrode 733 may pass through the first passivation film 321 and the second passivation film 322 and be disposed in contact with the first channel layer 760. The first gate wiring 341 may be disposed on the second passivation film 322 and be electrically connected to the first gate electrode 733. The second gate electrode 833 may be disposed to pass through at least one of the first passivation film 321 and the second passivation film 322. For example, the second gate electrode 833 may be disposed to pass through the first passivation film 321 and the second passivation film 322. The second gate electrode 833 may pass through at least one of the first passivation film 321 and the second passivation film 322 and be disposed in contact with the second channel layer 860. For example, the second gate electrode 833 may pass through the first passivation film 321 and the second passivation film 322 and be disposed in contact with the second channel layer 815. The second gate wiring 441 may be disposed on the second passivation film 322 and be electrically connected to the second gate electrode 833.

The second passivation film 322 may be provided with an insulating material. The second passivation film 322 may comprise a single layer or multiple layers including at least one material of a silicon-based oxide, a silicon-based nitride, a metal oxide including $Al_2O_3$, and an organic insulating material as an example.

According to an embodiment, a third passivation film 323 may be disposed on the second passivation film 322. The third passivation film 323 may be disposed on the second passivation film 322, the first gate wiring 341, and the second gate wiring 342.

The first gate wiring 341 may be disposed in contact with the first gate electrode 733 thereon and provided to be surrounded by the third passivation film 323. The second gate wiring 441 may be disposed in contact with the second gate electrode 833 thereon and provided to be surrounded by the third passivation film 323.

The first source electrode 371 may pass through the second passivation film 322 and the third passivation film 323 and be electrically connected to the first source contact portion 331. The first source electrode 371 may comprise a first region disposed on the third passivation film 323. The first source electrode 371 may comprise a second region passing through the third passivation film 323 and the second passivation film 322. The first drain electrode 372 may pass through the second passivation film 322 and the third passivation film 323 and be electrically connected to the first drain contact portion 332. The first drain electrode 372 may comprise a first region disposed on the third passivation film 323. The first drain electrode 372 may comprise a second region passing through the third passivation film 323 and the second passivation film 322.

The second source electrode 471 may pass through the second passivation film 322 and the third passivation film 323 and be electrically connected to the second source contact portion 431. The second source electrode 471 may comprise a first region disposed on the third passivation film 323. The second source electrode 471 may comprise a second region passing through the third passivation film 323 and the second passivation film 322. The second drain electrode 472 may pass through the second passivation film 322 and the third passivation film 323 and be electrically connected to the second drain contact portion 432. The second drain electrode 472 may comprise a first region disposed on the third passivation film 323. The second drain electrode 472 may comprise a second region passing through the third passivation film 323 and the second passivation film 322.

The third passivation film 323 may comprise an insulating material. For example, the third passivation film 323 may comprise a single layer or multiple layers comprising at least one material among a silicon-based oxide, a silicon nitride, a metal oxide containing $Al_2O_3$, and an organic insulator.

The thin film transistor substrate according to an embodiment may comprise a fourth passivation film 324 disposed on the third passivation film 323. The fourth passivation film 324 may be disposed on the first source electrode 371, the first drain electrode 372, the second source electrode 471, and the second drain electrode 472.

For example, the fourth passivation film 324 may comprise a single layer or multiple layers containing at least one material of a silicon-based oxide, a silicon-based nitride, a metal oxide containing $Al_2O_3$, and an organic insulating material.

The thin film transistor substrate according to an embodiment may comprise a lower electrode 486 disposed on the driving thin film transistor 830. The lower electrode 486 may be electrically connected to the driving thin film transistor 830. The lower electrode 486 may be electrically connected to the second drain electrode 472 of the driving thin film transistor 830. The lower electrode 486 may be disposed on the fourth passivation film 324. The lower electrode 486 may be electrically connected to the second drain electrode 472 through a contact hole provided in the fourth passivation film 324. A lower surface of the lower electrode 486 may be disposed in contact with an upper surface of the second drain electrode 472.

In addition, the thin film transistor substrate according to an embodiment may comprise a fifth passivation film 325 disposed on the fourth passivation film 324. The light-emitting layer 488 may be disposed on the lower electrode 486. An upper electrode 487 may be disposed on the light-emitting layer 488. The light-emitting layer 488 and the upper electrode 487 may be disposed on the fifth passivation film 325. A first region of the light-emitting layer 488 may be disposed on the fifth passivation film 325, and a second region of the light-emitting layer 488 may be disposed in contact with an upper surface of the lower electrode 486 through a contact hole provided in the fifth passivation film 325. The light-emitting layer 488 may emit light of any one of red, green, blue, and white as an example. The light-emitting layer 488 may be provided with an organic material as an example.

The lower electrode 486 and the upper electrode 487, for example, may comprise one material selected from ITO, ITO/Ag, ITO/Ag/ITO, and ITO/Ag/IZO, or an alloy containing the material. The lower electrode 486 and the upper electrode 487 may comprise different materials. One of the upper electrode 486 and the lower electrode 487 may be formed of a transparent electrode, and light emitted from the light-emitting layer 488 in a direction of the transparent electrode may be emitted to the outside.

The thin film transistor substrate according to an embodiment may comprise a first black matrix 340 between the substrate 355 and the first channel layer 760. A width of the first channel layer 760 may be provided to be equal to a width of the first black matrix 340. The first black matrix 340 may be provided in a single layer or multiple layers including at least one material selected from among a Si-based material, a Ga-based material, an Al-based material, and an organic material. The first black matrix 340 may block light incident on the switching thin film transistor 730. Accordingly, it is possible to prevent the switching thin film transistor 730 from deteriorating due to a photo current or the like.

The thin film transistor substrate according to an embodiment may comprise a second black matrix 440 between the substrate 355 and the second channel layer 860. A width of the second channel layer 860 may be provided to be equal to a width of the second black matrix 440. The second black matrix 440 may be provided in a single layer or multiple layers including at least one material selected from among a Si-based material, a Ga-based material, an Al-based material, and an organic material. The second black matrix 440 may block light incident on the driving thin film transistor 830. Accordingly, it is possible to prevent the driving thin film transistor 830 from deteriorating due to a photo current or the like.

According to an embodiment, the bonding layer 350 may be disposed between the substrate 355 and the first channel layer 760. The bonding layer 350 may be disposed between the substrate 355 and the first black matrix 340. The bonding layer 350 may be disposed between the substrate 355 and the second channel layer 860. The bonding layer 350 may be disposed between the substrate 355 and the second black matrix 440. For example, the bonding layer 350 may be disposed on an entire region of the substrate 355.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 51:
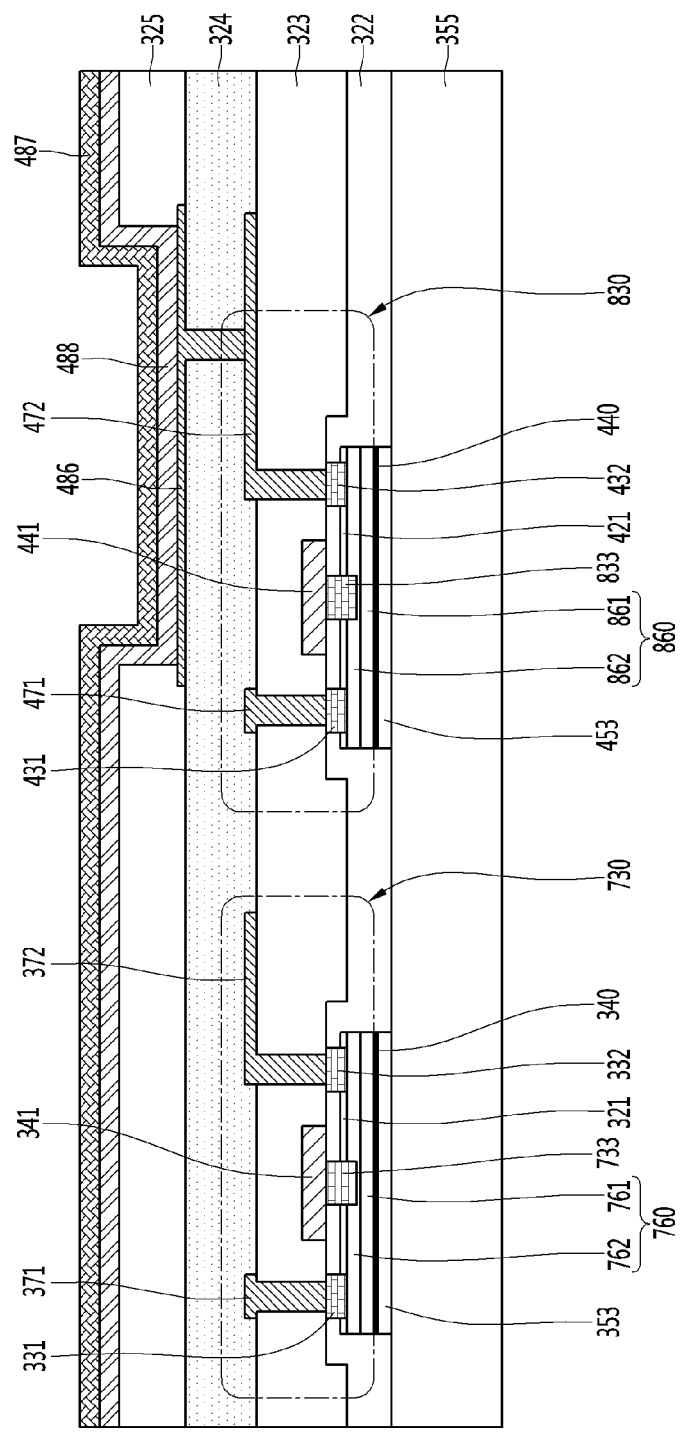
FIG. 51 is a view illustrating still another example of a thin film transistor substrate according to an embodiment of the present invention.

FIG. 51 is a view illustrating still another example of a thin film transistor substrate according to an embodiment of the present invention. Referring to FIG. 51, in the description of the thin film transistor substrate according to an embodiment, description of a part overlapping with those described with reference to FIGS. 1 to 50 may be omitted. An embodiment shown in FIG. 51 differs from that of FIG. 50 in the bonding layer structure.

As shown in FIG. 51, a first bonding layer 353 and a second bonding layer 453 may be provided on the substrate 355. The first bonding layer 353 may be disposed between the substrate 355 and the first black matrix 340. For example, a width of the first bonding layer 353 may be provided to be equal to a width of the first black matrix 340. For example, the width of the first bonding layer 353 may be provided to be equal to a width of the first channel layer 760. The second bonding layer 453 may be disposed between the substrate 355 and the second black matrix 440. For example, a width of the second bonding layer 453 may be provided to be equal to a width of the second black matrix 440. For example, the width of the second bonding layer 453 may be provided to be equal to a width of the second channel layer 860.

According to an embodiment, a second passivation film 322 may be disposed on the substrate 355. A lower surface of the second passivation film 322 may be disposed in contact with an upper surface of the substrate 355. In a region where the first bonding layer 350 is not provided, the second passivation film 322 may be disposed in direct contact with the substrate 355. In a region where the second bonding layer 450 is not provided, the second passivation film 322 may be disposed in direct contact with the substrate 355.

As described above, according to the embodiment shown in FIG. 51, as compared with the embodiment shown in FIG. 50, since the second passivation film 322 and the substrate 355 may be disposed in direct contact with each other, a layer provided between the second passivation film 322 and the substrate 355 (for example, an illustrated bonding layer in FIG. 50) may be eliminated. Accordingly, according to the embodiment, since an interface between different material layers is reduced on a light path where light travels, light loss due to reflection/refraction at the interface may be reduced.

The first bonding layer 353 and the second bonding layer 453 according to an embodiment may comprise at least one of a reflective layer, a metal bonding layer, an organic bonding layer, and an insulating layer as an example. The reflective layer may be disposed on the substrate 355, the metal bonding layer may be disposed on the reflective layer, and the insulating layer may be disposed on the metal bonding layer. For example, the first bonding layer 353 and the second bonding layer 453 may comprise at least one of the metal bonding layer and the organic bonding layer, and the reflective layer and the insulating layer may be comprised selectively.

The insulating layer may complement the leakage characteristics of the first channel layer 760 and the second channel layer 860. For example, the insulating layer may comprise a single layer or multiple layers including at least one material of a silicon-based oxide, a silicon-based nitride, a metal oxide including $Al_2O_3$, and an organic insulating material as an example.

The metal bonding layer or the organic bonding layer may be provided for bonding with the substrate 355 disposed thereunder. For example, the metal bonding layer may comprise at least one material selected from the group consisting of gold (Au), tin (Sn), indium (In), nickel (Ni), silver (Ag), and copper (Cu), or an alloy thereof. For example, the organic bonding layer may comprise at least one material selected from the group consisting of acryl, benzocyclobutene (BCB), SU-8 polymer, and the like.

The reflective layer may reduce light absorption in the bonding layer. For example, the reflective layer may comprise at least one material selected from the group consisting of aluminum (Al), silver (Ag), and rhodium (Rh), or an alloy thereof. The reflective layer may be provided with a material having a reflection characteristic of more than 60% as an example.

Meanwhile, according to an embodiment, for example, when the first bonding layer 353 and the second bonding layer 453 comprise the metal bonding layer and the reflective layer, the first black matrix 340 and the second black matrix 440 may be omitted.

According to the thin film transistor substrate according to an embodiment, a high carrier mobility may be implemented by providing the thin film transistor comprising the nitride-based semiconductor layer. For example, an electron mobility ($cm^2/Vs$) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

According to an embodiment, a high quality semiconductor layer may be formed by using the growth substrate and a thin film transistor substrate having an excellent electron mobility may be provided by applying a transfer process by using the support substrate.

Therefore, according to the thin film transistor substrate, the display panel and the display device comprising the same, a high resolution can be realized and a smooth moving picture can be reproduced by providing a high carrier mobility.

Figure 52:
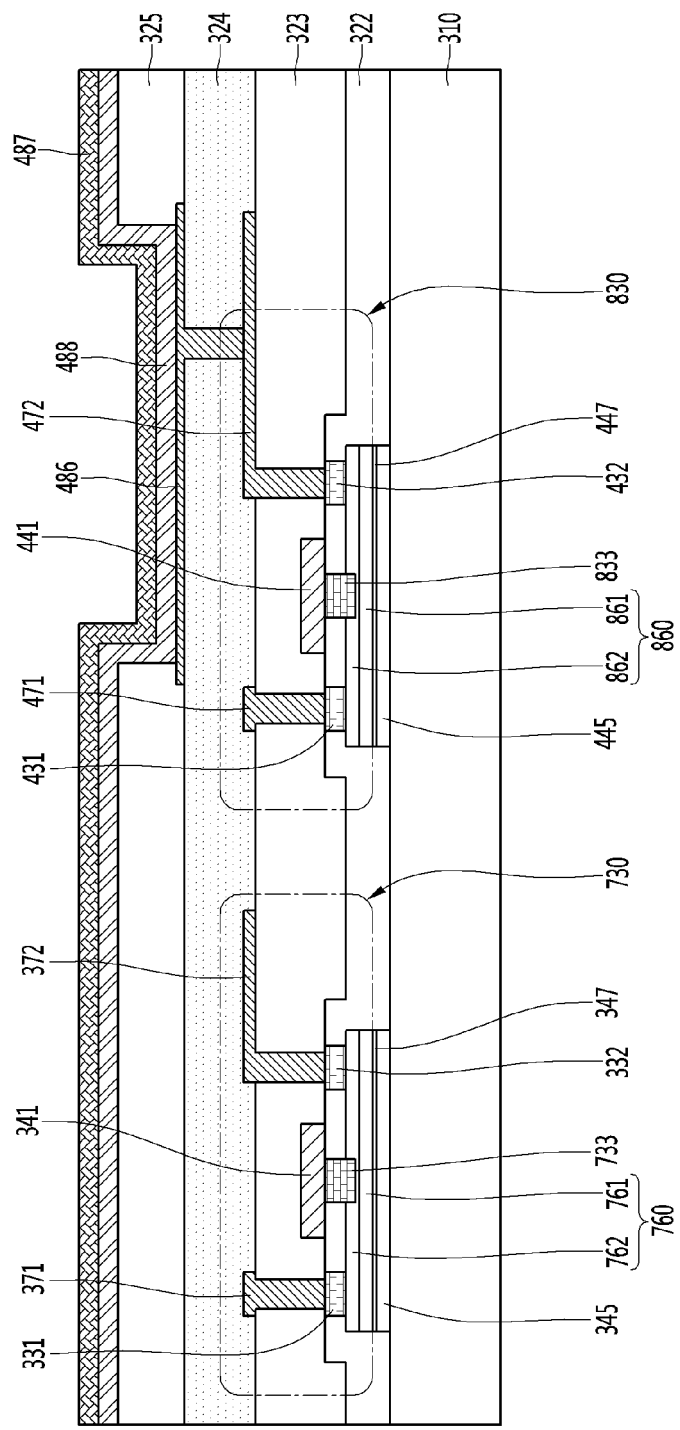
FIG. 52 is a view illustrating still another example of a thin film transistor substrate according to an embodiment of the present invention.

FIG. 52 is view illustrating still another example of a thin film transistor substrate according to an embodiment of the present invention. Referring to FIG. 52, in the description of the thin film transistor substrate according to the embodiment, description of contents overlapping with those described with reference to FIGS. 1 to 51 may be omitted. An embodiment shown in FIG. 52 differs from that of FIG. 50 in that a transfer process is not applied and a thin film transistor is provided on a growth substrate.

As shown in FIG. 52, the thin film transistor substrate according to the embodiment may comprise a growth substrate 310 as a substrate instead of a support substrate used in the transfer process. For example, the growth substrate 310 may comprise at least one of group consisting of sapphire, SiC, GaAs, GaN, ZnO, Si, GaP, InP and Ge.

A first black matrix 345 and a second black matrix 445 may be disposed on the growth substrate 310. The first black matrix 345 is disposed on the growth substrate 310 and may prevent light from being incident on the first channel layer 760. The first black matrix 345 may be provided with a material that absorbs or reflects visible rays as an example. Thus, according to the embodiment, light is incident on the first channel layer 760 and it is possible to prevent a switching thin film transistor 730 from being deteriorated due to a photo current or the like. The second black matrix 445 is disposed on the growth substrate 310 and may prevent light from being incident on the second channel layer 860. The second black matrix 445 may be provided with a material that absorbs or reflects visible rays as an example. Thus, according to the embodiment, light is incident on the second channel layer 860 and it is possible to prevent a driving thin film transistor 830 from being deteriorated due to a photo current or the like.

For example, the first black matrix 345 and the second black matrix 445 may be provided in a single layer or multiple layers including at least one material selected from among a Si-based material, a Ga-based material, an Al-based material, and an organic material. The first black matrix 345 and the second black matrix 445 may selectively comprise a material such as Si, GaAs, or the like.

According to an embodiment, a first buffer layer 347 may be provided on the first black matrix 345. The first buffer layer 347 may be provided between the first black matrix 345 and the first channel layer 760. The first buffer layer 347 may help a growth of a nitride semiconductor layer constituting the first channel layer 760. A second buffer layer 447 may be provided on the second black matrix 445. The second buffer layer 447 may be provided between the second black matrix 445 and the second channel layer 860. The second buffer layer 447 may help a growth of a nitride semiconductor layer constituting the second channel layer 860. For example, the first buffer layer 347 and the second buffer layer 447 may comprise a single layer or multiple layers including at least one material selected from the group consisting of AlN, AlInN, and AlGaN.

For example, a width of the first black matrix 345 may be provided to be equal to a width of the first buffer layer 347. For example, the width of the first black matrix 345 may be provided to be equal to a width of the first channel layer 760.

The width of the first buffer layer 347 may be provided to be equal to the width of the first channel layer 760. A width of the second black matrix 445 may be provided to be equal to a width of the second buffer layer 447. For example, the width of the second black matrix 445 may be provided to be equal to a width of the second channel layer 860. The width of the second buffer layer 447 may be provided to be equal to the width of the second channel layer 860.

According to an embodiment, the second passivation film 322 may be disposed on the growth substrate 310. A lower surface of the second passivation film 322 may be disposed in contact with an upper surface of the growth substrate 310. In a region where the first black matrix 345 and the second black matrix 445 is not provided, the second passivation film 322 may be disposed in direct contact with the growth substrate 310.

According to the thin film transistor substrate according to an embodiment, a high carrier mobility may be implemented by providing the thin film transistor comprising the nitride-based semiconductor layer. For example, an electron mobility (cm²/Vs) of the thin film transistor varies depending on a material used as a channel layer, it is reported that an amorphous silicon semiconductor has an electron mobility of 1, an oxide semiconductor has that of 10 to 80, and a polysilicon semiconductor has that of 100 or less. However, the thin film transistor comprising the nitride-based semiconductor layer according to an embodiment has been measured to have an electron mobility of 1500. Accordingly, the thin film transistor comprising the nitride-based semiconductor layer according to an embodiment may be implemented to have an electron mobility 15 times or higher than that of the thin film transistor to which the polysilicon semiconductor is applied.

Therefore, according to the thin film transistor substrate, the display panel and the display device comprising the same, a high resolution can be realized and a smooth moving picture can be reproduced by providing a high carrier mobility.

Figure 53:
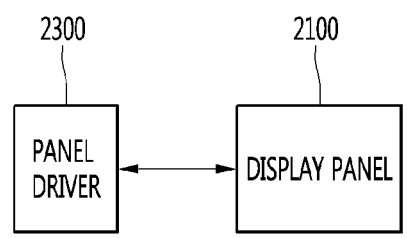
FIG. 53 is a block diagram illustrating an example of a display device comprising a thin film transistor substrate according to an embodiment of the present invention.

FIG. 53 is a block diagram illustrating an example of a display device comprising a thin film transistor substrate according to an embodiment of the present invention.

As shown in FIG. 53, the display device according to an embodiment may comprise a display panel 2100 and a panel driver 2300.

The display panel 2100 may comprise any one of the thin film transistor substrates described with reference to FIGS. 42 to 52. The panel driver 2300 may provide a driving signal to the display panel 2100. The panel driver 2300 may control light transmittance of a plurality of pixels provided in the display panel 2100, so that an image may be displayed on the display panel 2100.

The features, structures, effects and the like described in the embodiments are comprised in at least one embodiment of the present invention and are not necessarily limited to only one embodiment. Furthermore, the features, structures, effects and the like illustrated in the embodiments may be combined or modified with other embodiments by those skilled in the art to which the embodiments belong. Accordingly, it is to be understood that such combination and modification are comprised in the scope of the present invention.

The above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are comprised in the scope of the present invention defined in the appended claims.

INDUSTRIAL APPLICABILITY

According to an embodiment, a thin film transistor substrate, a display panel and a display device comprising the same, have an advantage of realizing a high resolution and reproducing a smooth moving picture by providing a high carrier mobility.

The invention claimed is:

1. A thin film transistor substrate comprising:
a substrate;
a switching thin film transistor disposed on the substrate, the switching thin film transistor comprising a first channel layer including a nitride-based semiconductor layer, a first source electrode electrically connected to a first region of the first channel layer, a first drain electrode electrically connected to a second region of the first channel layer, a first gate electrode disposed on the first channel layer, and a first depletion forming layer disposed between the first channel layer and the first gate electrode; and
a driving thin film transistor disposed on the substrate, the driving thin film transistor comprising a second channel layer including a nitride-based semiconductor layer, a second source electrode electrically connected to a first region of the second channel layer, a second drain electrode electrically connected to a second region of the second channel layer, a second gate electrode disposed on the second channel layer, and a second depletion forming layer disposed between the second channel layer and the second gate electrode.

2. The thin film transistor substrate of claim 1, wherein the first channel layer and the second channel layer comprise a semiconductor layer of $In_xAl_yGa_{1-x-y}N$ ($0 \geq x \geq 1$, $0 \geq y \geq 1$, $0 \geq x+y \geq 1$).

3. The thin film transistor substrate of claim 1, wherein the first channel layer comprises a first GaN semiconductor layer, and a first AlGaN semiconductor layer disposed between the first GaN semiconductor layer and the first depletion forming layer, and
wherein the second channel layer comprises a second GaN semiconductor layer, and a second AlGaN semiconductor layer disposed between the second GaN semiconductor layer and the second depletion forming layer.

4. The thin film transistor substrate of claim 1, further comprising:
a first black matrix disposed between the substrate and the first channel layer, and
a second black matrix disposed between the substrate and the second channel layer.

5. The thin film transistor substrate of claim 1, further comprising:
a first bonding layer disposed between the substrate and the first channel layer, and
a second bonding layer disposed between the substrate and the second channel layer.

6. The thin film transistor substrate of claim 1, further comprising a bonding layer disposed between the substrate and the first channel layer and between the substrate and the second channel layer,
wherein the bonding layer is disposed on an entire area of the substrate.

7. The thin film transistor substrate of claim 1, wherein the substrate is a growth substrate.

8. The thin film transistor substrate of claim 1, wherein the firsts drain electrode of the switching thin film transistor is electrically connected to the second gate electrode of the driving thin film transistor.

9. The thin film transistor substrate of claim 1, further comprising:
 a first passivation film disposed on the first channel layer;
 a second passivation film disposed on the substrate and the first passivation film;
 a first source contact portion passing through the first passivation film, disposed in contact with the first region of the first channel layer, and electrically connected to the first source electrode; and
 a first drain contact portion passing through the first passivation film, disposed in contact with the second region of the first channel layer, and electrically connected to the first drain electrode.

10. A display panel comprising a thin film transistor substrate according to claim 1.

11. A display device comprising:
 a display panel comprising a thin film transistor substrate according to claim 1; and
 a panel driver configured to drive the display panel.

12. The thin film transistor substrate of claim 3, wherein the first depletion forming layer and the second depletion forming layer comprise a GaN semiconductor layer doped with a p-type dopant or an AlGaN semiconductor layer doped with a p-type dopant.

13. The thin film transistor substrate of claim 4, wherein a width of the first channel layer is equal to a width of the first black matrix, and
 wherein a width of the second channel layer is equal to a width of the second black matrix.

14. The thin film transistor substrate of claim 4, wherein each of the first black matrix and the second black matrix is a single layer or multiple layers including at least one material selected from among an Si-based material, a Ga-based material, an Al-based material, and an organic material.

15. The thin film transistor substrate of claim 5, wherein each of the first bonding layer and the second bonding layer comprises a reflective layer disposed on the substrate, a metal bonding layer disposed on the reflective layer, and an insulating layer disposed on the metal bonding layer.

16. The thin film transistor substrate of claim 5, wherein a width of the first channel layer is equal to a width of the first bonding layer, and
 wherein a width of the second channel layer is equal to a width of the second bonding layer.

17. The thin film transistor substrate of claim 9, wherein the first gate electrode passes through the first passivation film and the second passivation film, and is disposed in contact with the first depletion forming layer.

18. The thin film transistor substrate of claim 9, further comprising a gate wiring disposed on the second passivation film and electrically connected to the first gate electrode.

19. The thin film transistor substrate of claim 9, wherein a side surface of the first source contact portion and a side surface of the firsts drain contact portion are disposed to face each other,
 wherein the first depletion forming layer is disposed to be extending in one direction between the side surface of the first source contact portion and the side surface of the first drain contact portion, and
 wherein a length of the first depletion forming layer disposed to be extending in the one direction is longer than a length of the side surface of the first source contact portion.

20. The thin film transistor substrate of claim 18, further comprising a third passivation film on the second passivation film and the gate wiring,
 wherein the first source electrode and the first drain electrode are disposed on the third passivation film.

\* \* \* \* \*